(12) United States Patent
Camarota

(10) Patent No.: US 11,201,623 B2
(45) Date of Patent: *Dec. 14, 2021

(54) UNIFIED PROGRAMMABLE COMPUTATIONAL MEMORY AND CONFIGURATION NETWORK

(71) Applicant: XILINX, INC., San Jose, CA (US)

(72) Inventor: Rafael C. Camarota, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/884,038

(22) Filed: May 26, 2020

(65) Prior Publication Data

US 2021/0050853 A1 Feb. 18, 2021

Related U.S. Application Data

(63) Continuation of application No. 16/539,220, filed on Aug. 13, 2019, now Pat. No. 10,673,440.

(51) Int. Cl.
| | |
|---|---|
| *H03K 19/177* | (2020.01) |
| *G06F 3/06* | (2006.01) |
| *G06F 7/48* | (2006.01) |
| *H03K 19/1776* | (2020.01) |
| *H03K 19/17736* | (2020.01) |
| *H03K 19/17724* | (2020.01) |
| *G06F 7/483* | (2006.01) |
| *G06F 7/502* | (2006.01) |
| *H03K 19/17756* | (2020.01) |

(52) U.S. Cl.
CPC ......... *H03K 19/1776* (2013.01); *G06F 3/067* (2013.01); *G06F 7/483* (2013.01); *H03K 19/1774* (2013.01); *H03K 19/17724* (2013.01); *H03K 19/17744* (2013.01); *G06F 7/502* (2013.01); *H03K 19/17756* (2013.01)

(58) Field of Classification Search
CPC ......... H03K 19/1776; H03K 19/17744; H03K 19/17724; H03K 19/1774; H03K 19/17756; G06F 7/483; G06F 3/067; G06F 7/502; G06F 30/343
See application file for complete search history.

(56) References Cited

U.S. PATENT DOCUMENTS

| | | |
|---|---|---|
| 5,128,871 A | 7/1992 | Schmitz |
| 5,784,313 A | 7/1998 | Trimberger et al. |

(Continued)

*Primary Examiner* — Vibol Tan
(74) *Attorney, Agent, or Firm* — Patterson + Sheridan, LLP

(57) ABSTRACT

Examples generally relate a programmable device having a unified programmable computational memory (PCM) and configuration network. In an example, a programmable device includes a die that includes a PCM integrated circuit having a PCM tile. The PCM tile includes a configuration memory (CM) and combinational logic (CL). The CM is capable of storing configuration data received via a node in the PCM tile. The CL is configured to receive internal control signal(s) and first and second input signals and to output a result signal. The CL is capable of outputting the result signal resulting from a logic function that is responsive to the internal control signal(s) and a signal of a group of signals including the first and second input signals. The CL is configured to receive the first input signal via the node in the PCM tile.

20 Claims, 13 Drawing Sheets

(56) References Cited

U.S. PATENT DOCUMENTS

| | | | |
|---|---|---|---|
| 7,177,385 B2 * | 2/2007 | Georgakos | G11C 8/04 |
| | | | 327/202 |
| 7,652,499 B2 | 1/2010 | Schmit et al. | |
| 7,864,620 B1 * | 1/2011 | Pedersen | G11C 7/1012 |
| | | | 365/230.06 |
| 8,117,567 B2 | 2/2012 | Arsovski | |
| 8,495,122 B2 | 7/2013 | Simkins et al. | |
| 9,779,785 B2 | 10/2017 | Li | |
| 9,804,996 B2 | 10/2017 | O'Connor et al. | |
| 10,114,613 B2 | 10/2018 | Bekas et al. | |

* cited by examiner

UNIFIED PROGRAMMABLE COMPUTATIONAL MEMORY AND CONFIGURATION NETWORK

CROSS-REFERENCE TO RELATED APPLICATIONS

This application is a continuation of U.S. patent application Ser. No. 16/539,220, entitled "Unified Programmable Computational Memory and Configuration Network," filed Aug. 13, 2019, which is incorporated herein by reference in its entirety.

TECHNICAL FIELD

Examples of the present disclosure generally relate to a programmable device and methods of operating such programmable device, and in particular, relate to programmable device having a unified programmable computational memory and configuration network and methods for operating such programmable device.

BACKGROUND

A programmable logic device (PLD), such as a field programmable gate array (FPGA), is generally an integrated circuit (IC) that includes programmable logic. The programmable logic can be in a region of the IC, such as a programmable logic region. A programmable logic region of an IC may also be referred to as a fabric within the IC. The programmable logic region can be programmable to be configured to implement various logic functions, applications, or kernels. The logic functions, etc., can be performed on signals received by the programmable logic region from some circuit outside of the programmable logic region, and can generate signals to be communicated from the programmable logic region to some circuit outside of the programmable logic region. In some instances, the architecture of the programmable logic region can create challenges for communicating signals to and from the programmable logic region.

SUMMARY

Examples described herein generally relate to a programmable device having a unified programmable computational memory (PCM) and configuration network. Configuration data to configure PCM tiles can be transmitted via the network, and transactional data, e.g., generated by the PCM tile during operation of functional modes based on the configuration data, can also be transmitted via the network.

An example of the present disclosure is a programmable device. The programmable device includes a die. The die includes a PCM integrated circuit. The PCM integrated circuit includes a PCM tile. The PCM tile includes a configuration memory and combinational logic. The configuration memory is capable of storing configuration data. The configuration memory is configured to receive the configuration data via a node in the PCM tile. The combinational logic is configured to receive one or more internal control signals, a first input signal, and a second input signal and to output on an output node a result signal. The one or more internal control signals are based on the configuration data and one or more external control signals received by the PCM tile. The combinational logic is capable of outputting the result signal resulting from at least one of a plurality of logic functions that is responsive to the one or more internal control signals and at least one signal of a group of signals including the first input signal and the second input signal. The combinational logic is configured to receive the first input signal via the node in the PCM tile.

Another example of the present disclosure is a method for operating a programmable device. Configuration data is written to configuration memory of a PCM tile on a die. Writing the configuration data includes transmitting the configuration data to the configuration memory via a selected input node of the PCM tile. A functional mode of the PCM tile is operated based on the configuration data written to the configuration memory of the PCM tile. The functional mode includes a logic operation performed on or a through-transmission of a data signal transmitted via the selected input node of the PCM tile.

Another example of the present disclosure is a programmable device. The programmable device includes a first die and a second die. The first die includes an interconnect circuit. The second die includes a PCM array. The second die is stacked on and communicatively coupled to the first die. The PCM array includes PCM tiles, and the PCM tiles are interconnected to form at least a portion of a signal transmission network. Each of the PCM tiles includes a configuration memory. Each of the PCM tiles is configurable to operate in one of a plurality of functional modes based on configuration data stored in the configuration memory of the respective PCM tile. The first die is operable to transmit configuration data to one or more of the PCM tiles via the signal transmission network. When one or more of the PCM tiles operate in respective functional modes, the one or more of the PCM tiles are configured to communicate via the signal transmission network.

Another example of the present disclosure is a programmable device. The programmable device includes a PCM integrated circuit including a PCM array of PCM tiles. Each of the PCM tiles includes a memory capable of storing data and combinational logic. The PCM integrated circuit is configurable to dynamically allocate any of the PCM tiles to a fabric region or to a memory region. When a respective PCM tile of the PCM tiles is allocated to a fabric region, the memory of the respective PCM tile is operable to store configuration data, and functionality of the combinational logic is determined based on, at least in part, the configuration data. When a respective PCM tile of the PCM tiles is allocated to a memory region, the memory of the respective PCM tile is operable to store transactional data communicated in the PCM array.

Another example of the present disclosure is a method for operating a programmable device. Configuration memory of routing tiles in a programmable computational memory (PCM) array of a PCM integrated circuit is written to allocate various ones of PCM tiles of the PCM array to a first fabric region and to a first memory region according to a first application set. Configuration memory of the various ones of the PCM tiles allocated to the first fabric region is written to responsively implement functional logic according to a first application. The PCM integrated circuit is operated according to the first application. In some further examples, after operating the PCM integrated circuit according to the first application, configuration memory of routing tiles in the PCM array is written to allocate various ones of the PCM tiles of the PCM array to a second fabric region and to a second memory region according to a second application set. The second application set is different from the first application set. Configuration memory of the various ones of the PCM tiles allocated to the second fabric region is written to responsively implement functional logic according to a second application, The PCM integrated circuit is operated according to the second application.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
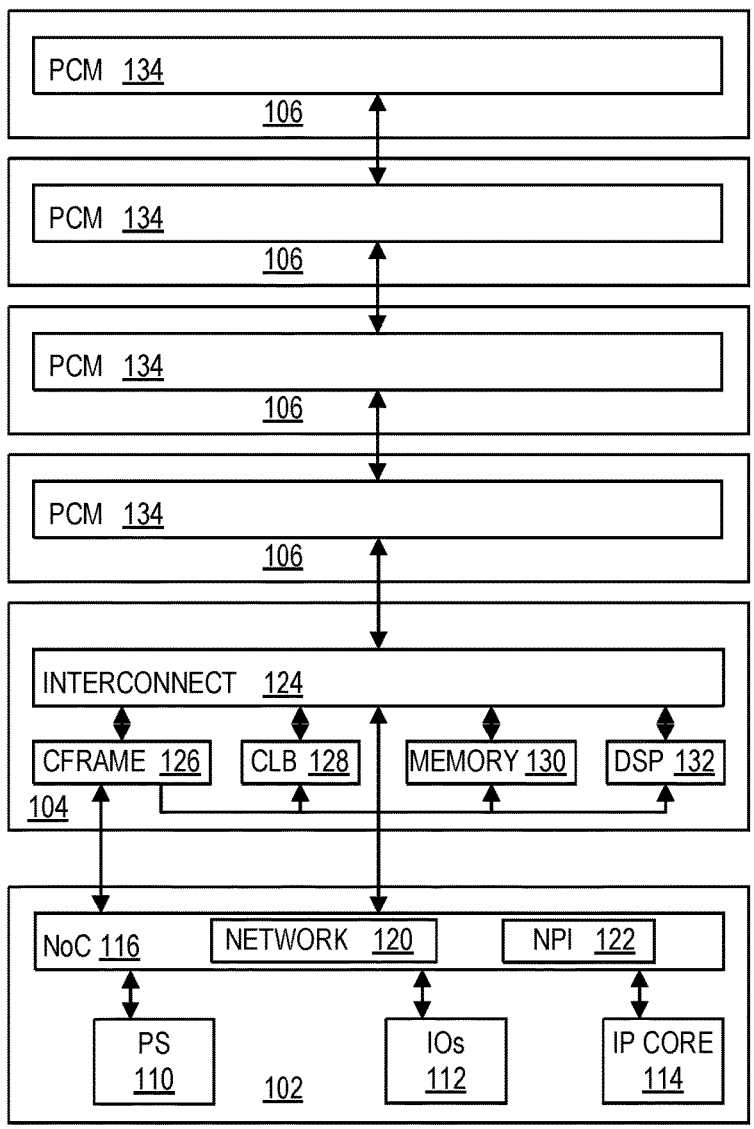
FIG. 1 is a block diagram depicting a multi-chip programmable device according to some examples.

Examples described herein generally relate to a programmable device having a unified programmable computational memory and configuration network. Configuration data to configure programmable computational memory (PCM) tiles can be transmitted via the network, and transactional data, e.g., generated by the PCM tile during operation of functional modes based on the configuration data, can also be transmitted via the network. Accordingly, the network can be operable to transmit configuration data and transactional data.

Some examples can include or be a programmable device that has one or more PCM dies that each have a region or array that includes PCM tiles that each can implement block memory and programmable logic. The programmable device can also include a programmable logic (PL) die. The PCM die(s) can be manufactured at a processing node that is smaller than the processing node of the PL die. Each PCM die can be considered as a PCM that includes resources that are capable of being dynamically allocated between computation and memory.

Aspects of these and other examples are described below. Some examples may be implemented using multiple stacked dies, such as in an Active die on Active die (AoA) structure. Other examples can be implemented in a single die. Various modes can be implemented using examples described herein, which can permit flexibility for use of programmable logic. Additional or other benefits may be achieved by various examples, as a person having ordinary skill in the art will readily understand upon reading this disclosure.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations. Additionally, various logic and/or logic states or signals are described below as examples. A person having ordinary skill in the art will readily understand modifications to such logic and logic states or signals to implement structure or functionality within the scope of various examples.

FIG. 1 is a block diagram depicting a multi-chip programmable device according to some examples. The multi-chip programmable device includes a base integrated circuit (IC) 102, a programmable logic (PL) IC 104, and one or more programmable computational memory (PCM) ICs 106.

Figure 2:
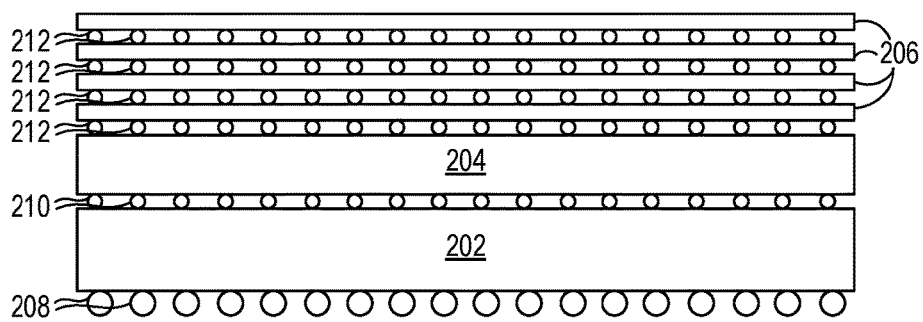
FIG. 2 is a structure of a multi-chip programmable device according to some examples.

FIG. 2 is a structure of a multi-chip programmable device according to some examples. The structure includes a base die 202, a PL die 204, and one or more PCM dies 206. The base die 202 includes the base IC 102. The PL die 204 includes the PL IC 104. Each PCM die 206 includes a PCM IC 106. The character, architecture, and/or arrangement of the dies 202-206 can vary according to different examples. As illustrated, external connectors 208, such as controlled collapse chip connections (C4) bumps, are attached to a front side of the base die 202, which external connectors 208 may also be attached to a package substrate. A package substrate may be attached to a printed circuit board (PCB) by external connectors, such as ball grid array (BGA) balls. Die-to-die connectors 210, such as microbumps, are attached to a front side of the PL die 204 and to a backside of the base die 202. Die-to-die connectors 212, such as microbumps, are attached to a front side of each PCM die 206 and to a backside of an underlying die, which may be the PL die 204 or another PCM die 206.

In other configurations, the dies 202-206 may be stacked by bonding (e.g., by wafer bonding before singulation). The dies 202-206 may be stacked by any combination of using die-to-die connectors and bonding. The dies 202-206 can be arranged in a different order in a stack. In further configurations, the dies 202-206 can be in any combination of a stack and/or attached to an interposer. For example, the base die 202 can be attached to an interposer, and the PL die 204 can be attached to the interposer, where the PCM dies 206 are stacked on the PL die 204. Additionally, any of the dies 202-206 can be oriented in a front side up or backside up orientation. Any other configuration of dies 202-206 may be implemented. Although four PCM ICs 106 and four PCM dies 206 are illustrated in FIGS. 1 and 2, any number of PCM ICs and dies may be implemented in other examples.

Referring back to FIG. 1, the base IC 102 includes a processing system 110, input/output circuits (IOs) 112, IP core circuits 114, and a Network-on-Chip (NoC) 116. The processing system 110 may be or include any of a variety of different processor types and number of processor cores. For example, the processing system 110 may be implemented as an individual processor, e.g., a single core capable of executing program instruction code. In another example, the processing system 110 may be implemented as a multi-core processor. The processing system 110 may be implemented using any of a variety of different types of architectures. Example architectures that may be used to implement the processing system 110 may include an ARM processor architecture, an x86 processor architecture, a graphics processing unit (GPU) architecture, a mobile processor architecture, a reduced instruction set computer (RISC) architecture (e.g., RISC-V), or other suitable architecture that is capable of executing computer-readable program instruction code.

The input/output circuits 112 can include eXtreme Performance Input/Output (XPIO), multi-gigabit transceivers (MGTs), high bandwidth memory (HBM) interfaces, Analog-to-Digital Converters (ADC), Digital-to-Analog Converters (DAC), or any other input/output blocks. The IP core circuits 114 can include memory controllers (such as double data rate (DDR) memory controllers, high bandwidth memory (HBM) memory controllers, or the like), peripheral component interconnect express (PCIe) interfaces, cache coherent interconnect for accelerators (CCIX) interfaces, Ethernet cores (such as a media address controller (MAC) or the like), forward error correction (FEC) blocks, and/or any other hardened circuit. Any of the input/output circuits 112 and/or IP core circuits 114 can be programmable.

The NoC 116 includes a programmable network 120 and a NoC peripheral interconnect (NPI) 122. The programmable network 120 communicatively couples subsystems and any other circuits of the base IC 102 together. The programmable network 120 includes NoC packet switches and interconnect lines connecting the NoC packet switches. Each NoC packet switch performs switching of NoC packets in the programmable network 120. The programmable network 120 has interface circuits at the edges of the programmable network 120. The interface circuits include NoC master units (NMUs) and NoC slave units (NSUs). Each NMU is an ingress circuit that connects a master circuit to the programmable network 120, and each NSU is an egress circuit that connects the programmable network 120 to a slave endpoint circuit. NMUs are communicatively coupled to NSUs via the NoC packet switches and interconnect lines of the programmable network 120. The NoC packet switches are connected to each other and to the NMUs and NSUs through the interconnect lines to implement a plurality of physical channels in the programmable network 120. The NoC packet switches, NMUs, and NSUs include register blocks that determine the operation of the respective NoC packet switch, NMU, or NSU.

A physical channel can also have one or more virtual channels. The virtual channels can implement weights to prioritize various communications along any physical channel. The NoC packet switches also support multiple virtual channels per physical channel. The programmable network 120 includes end-to-end Quality-of-Service (QoS) features for controlling data-flows therein. In examples, the programmable network 120 first separates data-flows into designated traffic classes. Data-flows in the same traffic class can either share or have independent virtual or physical transmission paths. The QoS scheme applies multiple levels of priority across traffic classes. Within and across traffic classes, the programmable network 120 applies a weighted arbitration scheme to shape the traffic flows and provide bandwidth and latency that meets the user requirements.

The NPI 122 includes circuitry to write to register blocks that determine the functionality of the NMUs, NSUs, and NoC packet switches. The NPI 122 includes a peripheral interconnect coupled to the register blocks for programming thereof to set functionality. The register blocks in the NMUs, NSUs, and NoC packet switches of the programmable network 120 support interrupts, QoS, error handling and reporting, transaction control, power management, and address mapping control. The NPI 122 includes an NPI root node residing on the processing system 110 (e.g., a platform management controller (PMC) of the processing system 110), interconnected NPI switches connected to the NPI root node, and protocol blocks connected to the interconnected NPI switches and a corresponding register block.

To write to register blocks, a master circuit, such as the PMC, sends configuration data to the NPI root node, and the NPI root node packetizes the configuration data into a memory-mapped write request in a format implemented by the NPI 122. The NPI transmits the memory-mapped write request to interconnected NPI switches, which route the request to a protocol block connected to the register block to which the request is directed. The protocol block can then translate the memory-mapped transaction write request into a format implemented by the register block and transmit the translated request to the register block for writing the configuration data to the register block.

The NPI 122 may be used to program any programmable circuit of the base IC 102. For example, the NPI 122 may be used to program any input/output circuit 112 and/or IP core circuit 114 that is programmable.

The various subsystems and circuits of the base IC 102 can be communicatively coupled by various communication mechanisms. As illustrated, the processing system 110, input/output circuits 112, and IP core circuits 114 are connected to the NoC 116 (e.g., to the programmable network 120), and hence, are communicatively coupled to each other. Other communication mechanisms, such as direct connections, between the various subsystems and circuits may be implemented.

The PL IC 104 includes an interconnect 124, a configuration Frame (CFRAME) driver 126, a programmable logic elements, such as one or more configurable logic blocks (CLBs) 128, one or more memory blocks 130, and one or more digital signal processor (DSP) blocks 132. The PL IC 104 can also include one or more programmable computational memory regions (which may be the same or different from the PCM regions 134 described below), and/or memory structures (e.g., dense memory structures). The CFRAME driver 126 may be or include control logic (e.g., a controller or processor) to configure the interconnect 124 (if the interconnect 124 is programmable), CLBs 128, memory blocks 130, and DSP blocks 132.

The CFRAME driver 126 is connected to the NoC 116 (e.g., the programmable network 120). The NoC 116 of the base IC 102 can include NMUs and/or NSUs to which the CFRAME driver 126 is connected (e.g., via die-to-die connectors 210 as shown in FIG. 2). The CFRAME driver 126 is further connected to the interconnect 124, the CLBs 128, the memory blocks 130, and the DSP blocks 132. Configuration data can be communicated via the NoC 116 to the CFRAME driver 126, and the CFRAME driver can then communicate respective configuration data to programmable elements, which may include the interconnect 124, CLBs 128, memory blocks 130, and DSP blocks 132. The configuration data can cause the programmable elements to be programmed according to, e.g., a user design.

The interconnect 124 of the PL IC 104 is connected to the NoC 116 (e.g., the programmable network 120) of the base IC 102 and to the CLBs 128, memory blocks 130, and DSP blocks 132. If the interconnect 124 is static, the NoC 116 of the base IC 102 can include NMUs and/or NSUs to which the interconnect 124 is connected (e.g., via die-to-die connectors 210 as shown in FIG. 2). In some examples, the interconnect 124 is programmable and includes interconnected programmable interconnect elements (e.g., in a columnar global network) that are further connected to respective ones of the CLBs 128, memory blocks 130, and DSP blocks 132. In some examples, the interconnect 124 is programmable and includes, e.g., a NoC that is programmed by a processor or controller of the PL IC 104 to a configuration that enables communication between the interconnect 124 and the NoC 116 of the base IC 102. The interconnect 124 can include, e.g., a NoC (like the NoC 116) and/or a programmable columnar global network (e.g., like implemented in fabric of an FPGA). The interconnect 124 can implement a large number of metal layers on the PL die 204 and can implement long interconnect lines. The interconnect 124 can be configured (e.g., by configuration data) to communicatively connect various ones of the CLBs 128, memory blocks 130, and DSP blocks 132 of the PL IC 104, and any PCM region 134 of an overlying PCM IC 106. The interconnect 124 can support a robust interconnect network.

Each PCM IC 106 includes one or more PCM regions 134. The interconnect 124 of the PL IC 104 is connected to the PCM regions 134 (e.g., via any intervening PCM region 134). The base IC 102 and PL IC 104 (e.g., via the interconnect 124) provide a programmable framework to connect the PCM regions 134 of the PCM ICs 106 to, e.g., input/output circuits 112 and other exterior dies, such as to one or more dies comprising memory. Further, configuration data of any and/or each of the PCM regions 134 can be communicated through the interconnect 124. Configuration data to configure any PCM region 134 can be communicated, for example, from the processing system 110 (e.g., a PMC) via the NoC 116 (e.g., via the programmable network 120) and the interconnect 124 to the corresponding PCM region 134. Examples described below illustrate how configuration data can be communicated to a PCM region 134.

The PCM ICs 106 can be an extremely fine grain architecture. The PCM ICs 106 can use the fewest metal layers possible, such as having the minimum pitch metal layers and a top metal layer suitable for wafer to wafer bonding bumps. In some examples, such a minimum pitch may be as few as 4 minimum pitch metal layers. The PCM ICs 106 can be constructed using CMOS standard cells without using a custom cell layout design. A small number of metal layers in the PCM ICs 106 and redundancy can allow a high number of PCM ICs 106 to be implemented to form an extremely dense 3D programmable structure. A number of PCM ICs 106 can be one or more, such as four, eight, sixteen or more. The PCM ICs 106 may be manufactured at an advanced processing node (e.g., a smaller processing node) compared to the PL IC 104.

In the configuration of FIG. 2, various dies of the structure of the multi-chip programmable device include through-substrate vias (TSVs) through the respective semiconductor substrate of the die to implement connections between different dies. For example, if the dies 202-206 are each front side down, each of the dies 202-206 will include TSVs to be communicatively connected with an overlying die. In such a scenario, the base die 202 includes TSVs, and the NoC 116 of the base IC 102 of the base die 202 is connected to the interconnect 124 of the PL IC 104 of the PL die 204 through those TSVs and the die-to-die connectors 210. Similarly, in such a scenario, the PL die 204 includes TSVs, and the interconnect 124 of the PL IC 104 of the PL die 204 is communicatively connected to the PCM regions 134 of the PCM ICs 106 of the PCM dies 206 through those TSVs and the die-to-die connectors 212. Further, in such a scenario, each PCM die 206 (except possibly the top PCM die 206) includes TSVs, and the PCM region 134 of the PCM IC 106 of the respective PCM die 206 is communicatively connected to the PCM region 134 of the PCM IC 106 of an overlying PCM die 206 through those TSVs and die-to-die connectors 212. Various dies can be connected through differing structures when the dies 202-206 are oriented or configured differently.

In a stack including multiple PCM dies 206 like shown in FIG. 2, the multi-chip programmable device can include a programmable lattice. The programmable lattice includes multiple levels of arrays of PCM regions 134. For example, each PCM die 206 can have a single array (e.g., a two-dimensional (2D) array) of one or more PCM regions 134, which, when stacked as in FIG. 2, form a programmable lattice (e.g., a three-dimensional (3D) lattice). For ease of reference, a Z-direction is orthogonal to each of the single arrays in the PCM dies 206. As illustrated, the programmable lattice is at least a physical lattice, and in other implementations, the programmable lattice can be a logical lattice (e.g., when multiples of PCM dies 206 are directly connected to an interposer and form at least part of the programmable lattice).

Before proceeding, it is noted that some terminology is used herein for convenience and ease of description. Terminology is used to orient various components with reference to directionality with respect to a corresponding tile. The term "north" refers to an orientation in-plane to the identified PCM region 134 and above a referenced component as illustrated in the figures. The term "east" refers to an orientation in-plane to the identified PCM region 134 and to the right of a referenced component as illustrated in the figures. The term "south" refers to an orientation in-plane to the identified PCM region 134 and below a referenced component as illustrated in the figures. The term "west" refers to an orientation in-plane to the identified PCM region 134 and to the left of a referenced component as illustrated in the figures. The term "up" refers to an orientation out-of-plane to the identified PCM region 134 in a direction away from the base die 202. The term "down" refers to an orientation out-of-plane to the identified PCM region 134 in a direction towards the base die 202. Various signals described herein can use a same designation or reference as the node on which the respective signal is transmitted. A designation or reference can interchangeably refer to the signal or the node, as is apparent from the context in which the designation or reference is used. Also, as used in the figures and herein, a lower case reference or designation indicates an input node or input signal, and an upper case reference or designation indicates an output node or output signal. These designations and descriptors are for ease of description, and may not indicate an orientation of other examples. A person having ordinary skill in the art will readily understand various modifications that may be made to the below described examples, e.g., different orientation or structure to described architectures, such that different descriptors may be applicable.

Figure 3:
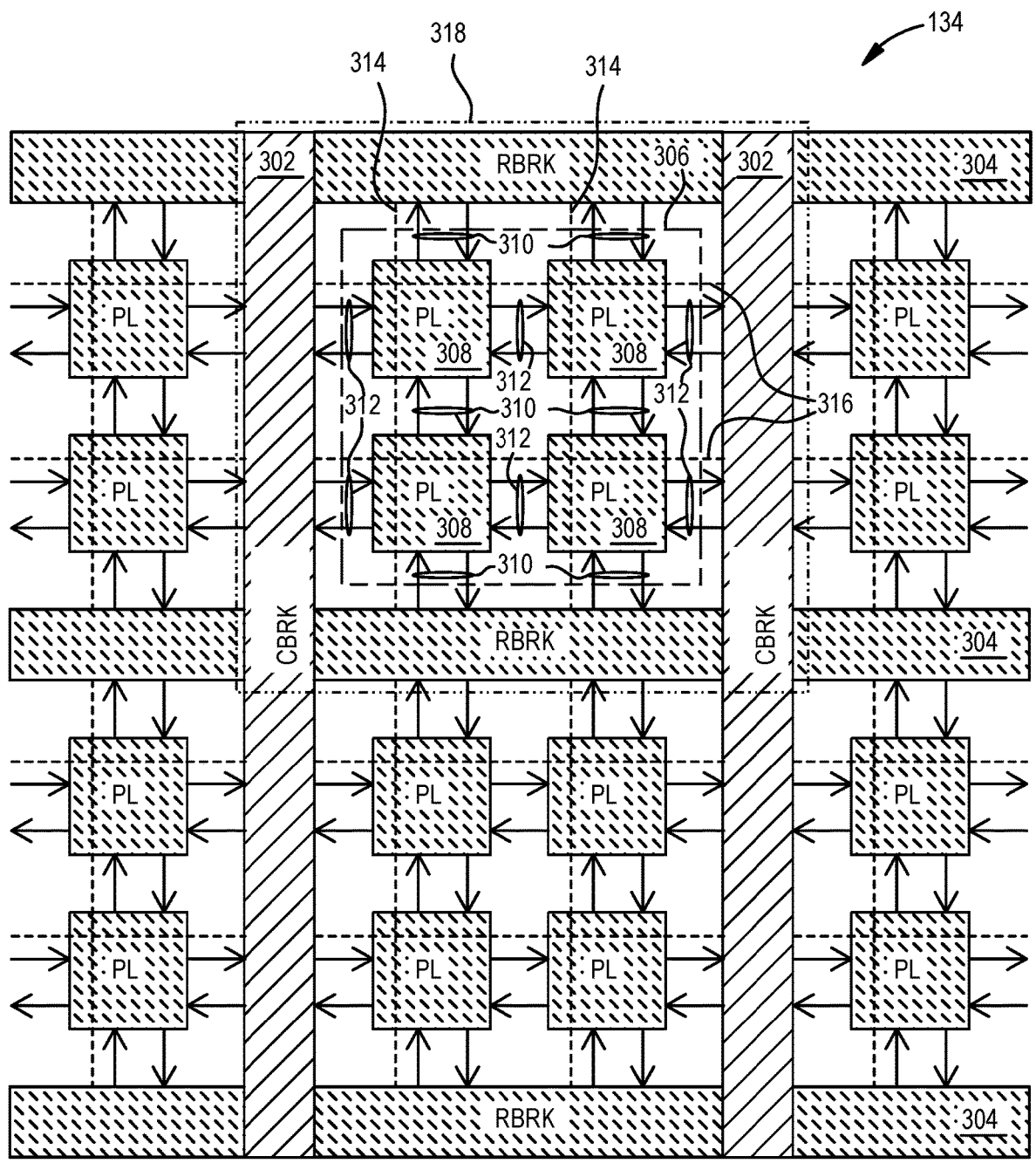
FIG. 3 is a block diagram depicting at least a portion of a programmable computational memory (PCM) region according to some examples.

FIG. 3 is a block diagram depicting at least a portion of a PCM region 134 according to some examples. The PCM region 134 includes column break (CBRK) columns 302, row break (RBRK) rows 304, and arrays 306 of PCM tiles 308. The CBRK columns 302 extend along a column direction in plane with the PCM region 134 (e.g., in north-south directions). The RBRK rows 304 extend along a row direction in plane with the PCM region 134 (e.g., in east-west directions). Each of the CBRK columns 302 and RBRK rows 304 includes an interconnect structure (e.g., including TSVs) to communicatively connect the PCM region 134 to the interconnect 124 of the PL die 204 and/or to another PCM region 134 of another PCM die 206. Various signals, such as described in detail below, can be transmitted through various CBRK columns 302 and RBRK rows 304 to or from different ones of the PCM regions 134 of the PCM dies 206, e.g., to or from the interconnect 124 of the PL die 204 and/or between PCM regions 134 of different PCM dies 206.

The CBRK columns 302 include lines and circuitry for routing configuration signals and read/write signals, such as described subsequently. In some modes, the configuration signals and read/write signals can be global control signals. In some modes, the CBRK columns 302 can route user signals, e.g., from the base IC 102, as the configuration and read/write signals for selected rows. Data and/or signals routed through the CBRK columns 302 can be supplied and driven by the interconnect 124. The CBRK columns 302 can have a pitch that matches the pitch of a columnar interconnect of the PL IC 104. The CBRK columns 302 also include connections to neighboring PCM tiles 308 for transmitting and/or receiving configuration and read/write signals to and/or from those PCM tiles 308. The configuration and read/write signals can be transmitted to and/or received from PCM tiles 308 via east-west global lines 316.

The RBRK rows 304 include lines and circuitry for routing clock signals and reset signals, such as described subsequently. In some modes, the clock signals and reset signals can be global control signals. In some modes, the RBRK rows 304 can route user signals, e.g., from the base IC 102, as the clock signals and reset signals for selected columns. Data and/or signals routed through the RBRK rows 304 can be supplied and driven by the interconnect 124. In some examples, the RBRK rows 304 are pitch matched to row clock regions in the interconnect 124, or aligned with the row clock regions in the interconnect 124 at some integer multiple of the RBRK rows 304. The RBRK rows 304 also include connections to neighboring PCM tiles 308 for transmitting and/or receiving clock signals and reset signals to and/or from those PCM tiles 308. The clock signals and reset signals can be transmitted to and/or received from PCM tiles 308 via north-south global lines 314. The RBRK row 304 can also include a redundancy line for transmitting a redundancy signal when column-based redundancy is implemented, as described in further detail below.

The global lines 314, 316 can carry various global signals to the PCM tiles 308. The global signals transmitted via the global lines 314, 316 can include user clock signals, reset signals, configuration control signals, redundancy control signals, debug signals, and/or block-memory-mode control signals. In some examples, user clock signals and reset signals are transmitted on the north-south global lines 314, and configuration signals and block-memory-mode signals are transmitted on the east-west global lines 316. In some examples, the north-south global lines 314 can include three or four lines for transmitting signals, and the east-west global lines 316 can include three or four lines for transmitting signals. Any signal of the global lines 314, 316 can be buffered at a PCM tile 308 on or through which the respective global line 314, 316 transmitting the signal is incident. The buffering can be periodic. For example, a global signal transmitted on a global line can be buffered at each Nth PCM tile 308 (e.g., having a period of N number).

As illustrated, the CBRK columns 302 have output and input connections to neighboring PCM tiles 308, and the RBRK rows 304 have output and input connections to neighboring PCM tiles 308. Each PCM tile 308 has four input connections and four output connections to respective neighboring PCM tiles 308, CBRK columns 302, or RBRK rows 304. Each PCM tile 308 has north-south input/output connections 310 each to a neighboring RBRK row 304 or PCM tile 308. The north-south input/output connections 310 to a PCM tile 308 and/or a tile of the RBRK rows 304 include respective connections to a north output node (designated "N" subsequently), a north input node (designated "n" subsequently), a south output node (designated "S" subsequently), and a south input node (designated "s" subsequently) of the PCM tile 308 and/or tile of the RBRK rows 304. Each PCM tile 308 has east-west input/output connections 312 each to a neighboring CBRK column 302 or PCM tile 308. The east-west input/output connections 312 to a PCM tile 308 and/or a tile of the CBRK columns 302 include respective connections to a west output node (designated "W" subsequently), a west input node (designated "w" subsequently), an east output node (designated "E" subsequently), and an east input node (designated "e" subsequently) of the PCM tile 308 and/or tile of the CBRK columns 302. Further, although not illustrated in FIG. 3, various tiles of the CBRK columns 302 and RBRK rows 304 have Z-direction input/output connections to a die overlying or underlying the die in which the CBRK columns 302 and RBRK rows 304 are disposed. The Z-direction input/output connections to a tile of the CBRK columns 302 or RBRK rows 304 include respective connections to an up output node (designated "U" subsequently), an up input node (designated "u" subsequently), a down output node (designated "D" subsequently), and a down input node (designated "d" subsequently) of the tile of the CBRK columns 302 or RBRK rows 304. The connections between these north, east, south, west, up, and down input and output nodes, including circuitry of the tiles connected between these nodes, forms a unified programmable computational memory and configuration network.

Configuration data, transactional data, and/or other storage data (e.g., bulk storage data) can be transmitted or communicated via this unified programmable computational memory and configuration network to and/or from the PCM tiles 308. Any of this data can be communicated in Z-directions via connections between up and down input and output nodes and can be communicated in-plane in any PCM region 134 via connections between north, east, south, and west input and output nodes.

Each array 306 is disposed between a corresponding pair of neighboring CBRK columns 302 and between a corresponding pair of neighboring RBRK rows 304. Each array 306 can include any number of rows and columns of PCM tiles 308. In some examples, each array 306 has a factor of 2 number of rows and columns of PCM tiles 308, and may further have an additional number of rows or columns of PCM tiles 308 for redundancy. For example, each array 306 can be a 33×32, 34×32, 32×33, or 32×34 sized array, which can include a size of 32×32 with an additional one or two rows or columns for redundancy.

The PCM tiles 308 can be programmed to have any functionality. In some examples, each PCM tile 308 can include a flip-flop functionality, combinational logic, routing functionality, and memory functionality. Each PCM tile 308 can include control logic that is capable of controlling configuration of the PCM tile 308 based on configuration data stored in the PCM tile 308 and/or global control signals, such as from a tile in a CBRK column 302, examples of which are described below. An example PCM tile 308 is described in more detail below. Each PCM tile 308 can have an area that is equal to or less than 20 pmt in some examples. FIG. 3 outlines a portion 318 of the PCM region 134 that is illustrated in more detail in subsequent figures.

Figure 4:
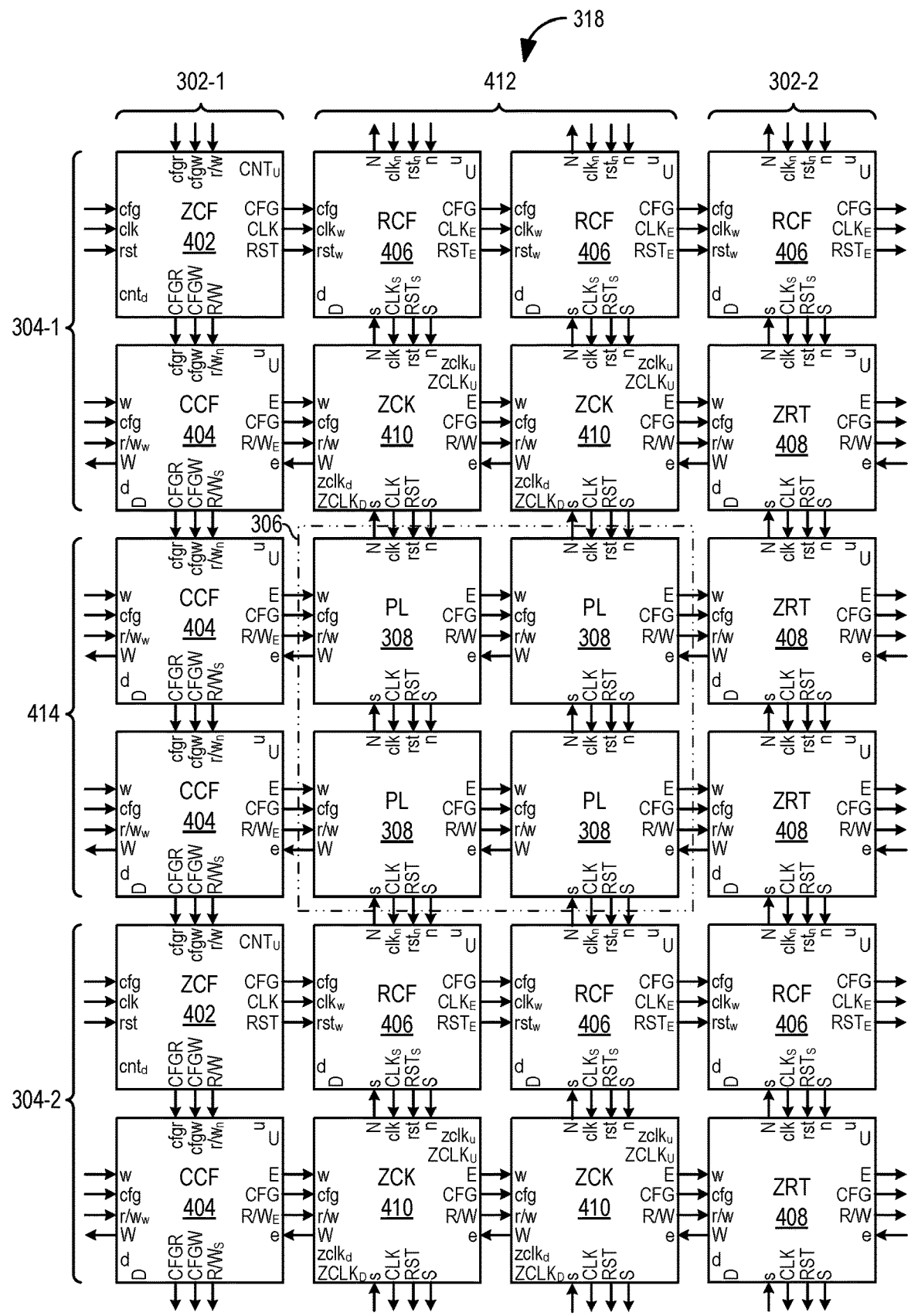
FIG. 4 is a block diagram depicting the portion of a PCM region according to some examples.

FIG. 4 illustrates the portion 318 of the PCM region 134 according to some examples. Some of the portion 318 may be repeated and/or expanded in the PCM region 134 to form the PCM region 134. The portion includes PCM tiles 308, z-direction configuration (ZCF) tiles 402, column configuration (CCF) tiles 404, row configuration (RCF) tiles 406, z-direction routing (ZRT) tiles 408, and z-direction clock (ZCK) tiles 410.

A first CBRK column 302-1 includes a pattern of ZCF tiles 402 and CCF tiles 404. A second CBRK column 302-2 includes a pattern of RCF tiles 406 and ZRT tiles 408. A group of columns 412 includes, in each column, a pattern of RCF tiles 406, ZCK tiles 410, and PCM tiles 308. The group of columns 412 can include any number of columns 412 to create an array 306 of PCM tiles 308 having any number of columns. In some examples, according to the illustrated architecture, a PCM region 134 (e.g., an array encompassing the PCM region 134) has respective columns, each including one or more ZCF tiles 402 and a plurality of CCF tiles 404, at least at a west boundary and at an east boundary of the PCM region 134. These columns can have a pattern as illustrated by the first CBRK column 302-1. Additional first CBRK columns 302-1 can be included in an array at any pitch. In some examples, according to the illustrated architecture, a PCM region 134 (e.g., any array) can have any number of columns, each including one or more RCF tiles 406 and a plurality of ZRT tiles 408. These columns can have a pattern as illustrated by the second CBRK column 302-2. Second CBRK columns 302-2 can be included in an array at any pitch. Second CBRK columns 302-2 can be included in an array at pitches independent of, and without relation to, the first CBRK columns 302-1.

The pattern shown in FIG. 4 can be extended, for example, by repeatedly reproducing in the pattern of first CBRK column 302-1, columns 412, second CBRK column 302-2, columns 412, first CBRK column 302-1, columns 412, second CBRK columns 302-2, etc. In other examples, the pattern can be modified to include a second CBRK column 302-2 in the place of and/or at a greater period than the first CBRK column 302-1. For example, the pattern can include first CBRK column 302-1, columns 412, second CBRK column 302-2, columns 412, second CBRK column 302-2, columns 412, second CBRK column 302-2, columns 412, second CBRK column 302-2, columns 412, first CBRK column 302-1, etc. to have a ratio of one first CBRK column 302-1 to four second CBRK columns 302-2. Other examples can have other ratios, such as between one to four and one to sixteen. In some examples, the first CBRK column 302-1 can be omitted from a pattern.

Groups of RBRK rows 304-1, 304-2 include a row having a pattern of ZCF tile 402 and RCF tiles 406, and a row having a pattern of CCF tile 404, ZCK tiles 410, and ZRT tiles 408. A group of rows 414 is between groups of RBRK rows 304-1, 304-2. The group of rows 414 includes, in each row, a pattern of CCF tile 404, PCM tiles 308, and ZRT tiles 408. The group of rows 414 can include any number of rows 414 to create an array 306 of PCM tiles 308 having any number of rows. In some examples, according to the illustrated architecture, a PCM region 134 (e.g., an array encompassing the PCM region 134) has at least two rows, one row including one or more ZCF tiles 402 and a plurality of RCF tiles 406 and another row including one or more CCF tiles 404 and a plurality of ZCK tiles 410, at a north boundary, and has at least one row, including one or more ZCF tiles 402 and a plurality of RCF tiles 406, at a south boundary, with rows including PCM tiles 308 therebetween. These rows at the north and south boundaries can have respective patterns as illustrated by the RBRK rows 304. Any of the rows illustrated as, e.g., the group of RBRK rows 304-1 can be included in an array together with or without any other of the rows. Any of the rows, e.g., the group of RBRK rows 304-1, 304-2 can be included in an array at pitches independent of, and without relation to, any other of the rows of the group and/or of any other row or group of rows.

The pattern shown in FIG. 4 can be extended by repeatedly reproducing in the pattern of RBRK rows 304, rows 414, RBRK rows 304, rows 414, etc. In some examples, the RCF tiles 406 and/or the ZCK tiles 410 can be omitted from the RBRK rows 304. As described, the array 306 can be extended to include any number of PCM tiles 308. For example, the array 306 can include over 1,000 of the PCM tiles 308, such as in a 32×32 array.

Figure 5:
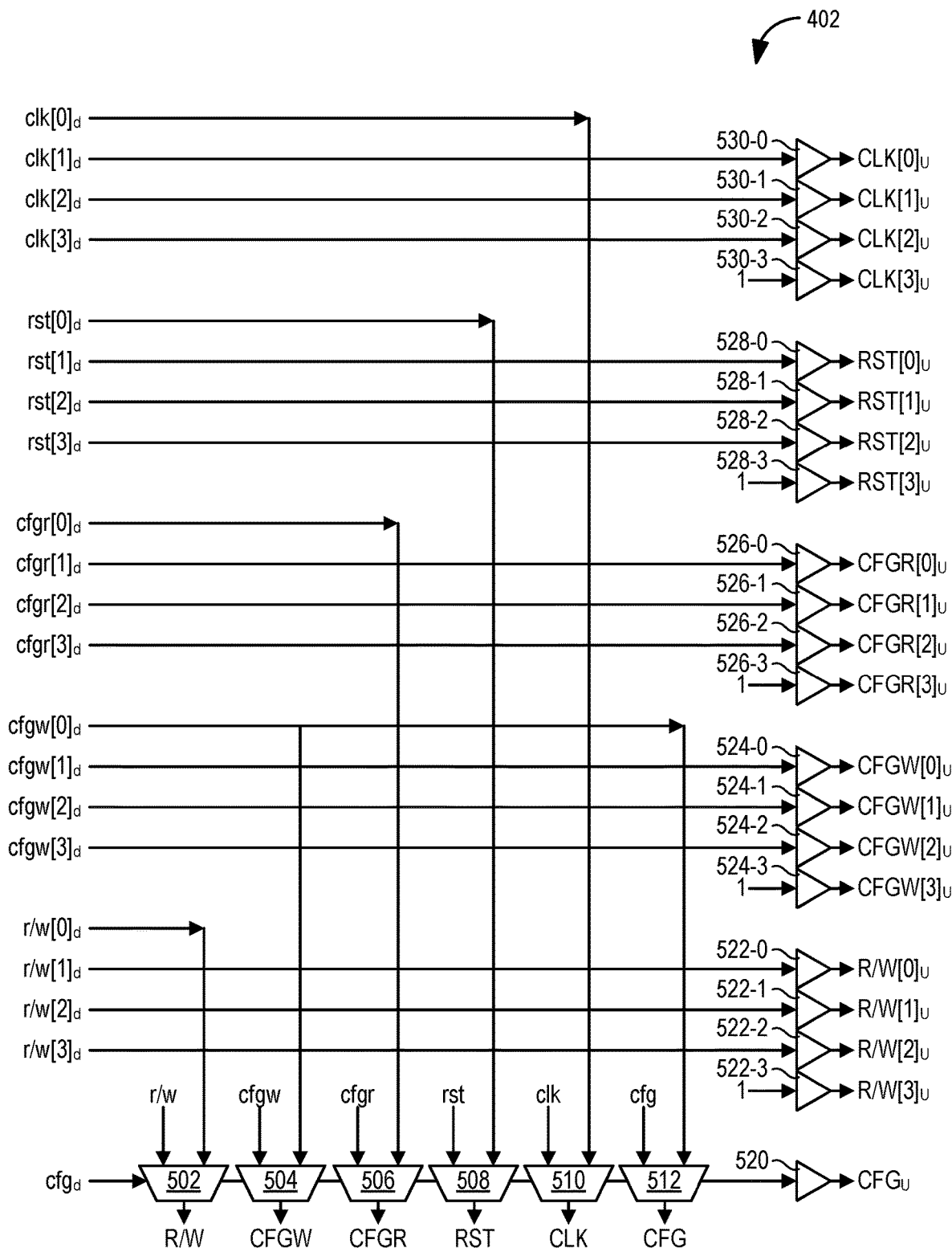
FIG. 5 is a circuit schematic of a z-direction configuration (ZCF) tile of a PCM region according to some examples.

FIG. 5 is a circuit schematic of a ZCF tile 402 according to some examples. Various signals are passed through the ZCF tile 402 from an underlying die to an overlying die. Generally, some signals are shown having a reference with bracketed number. A bracketed number of an input signal indicates a reference to a given overlying die with respect to the die on which the ZCF tile 402 is disposed. For example, a "[0]" on an input signal targets the die on which the ZCF tile 402 is disposed (e.g., targets the local die); a "[1]" on an input signal targets the die immediately above the die on which the ZCF tile 402 is disposed; a "[2]" on an input signal targets the die two dies above the die on which the ZCF tile 402 is disposed; etc. Similarly, a bracketed number of an output signal indicates a reference to a given overlying die with respect to the die immediately overlying the die on which the ZCF tile 402 is disposed (e.g., a "[0]" on an output signal targets the die immediately overlying the local die). The ZCF tile 402 is shown to accommodate a stack of four dies having the PCM region 134. Other examples can accommodate more or fewer dies.

The ZCF tile 402 has various input and output nodes that are also depicted in FIG. 4 and described below. The ZCF tile 402 includes multiplexers 502, 504, 506, 508, 510, 512 and buffers 520, 522-0, 522-1, 522-2, 522-3, 524-0, 524-1, 524-2, 524-3, 526-0, 526-1, 526-2, 526-3, 528-0, 528-1, 528-2, 528-3, 530-0, 530-1, 530-2, 530-3.

The ZCF tile 402 has (i) a configuration input node cfg on which the ZCF tile 402 receives a configuration input signal cfg, (ii) a clock input node clk on which the ZCF tile 402 receives a clock input signal clk, and (iii) a reset input node rst on which the ZCF tile 402 receives a reset input signal rst, where each of the input signals cfg, clk, rst are received from a neighboring tile (e.g., a RCF tile 406) west of the ZCF tile 402. In the illustrated architecture, when a ZCF tile 402 is at, e.g., a west boundary of the PCM region 134, the configuration input node cfg, clock input node clk, and reset input node rst are each connected to a logical "0" node (e.g., a ground node), and the corresponding configuration input signal cfg, clock input signal clk, and reset input signal rst are each a logical "0".

The ZCF tile 402 has (i) a read configuration input node cfgr on which the ZCF tile 402 receives a read configuration input signal cfgr, (ii) a write configuration input node cfgw on which the ZCF tile 402 receives a write configuration input signal cfgw, and (iii) a read/write input node r/w on which the ZCF tile 402 receives a read/write input signal r/w, where each of the input signals cfgr, cfgw, r/w are received from a neighboring tile (e.g., a CCF tile 404) north of the ZCF tile 402. In the illustrated architecture, when a ZCF tile 402 is at, e.g., a north boundary of the PCM region 134, the read configuration input node cfgr, write configuration input node cfgw, and read/write input node r/w are each connected to a logical "0" node (e.g., a ground node), and the corresponding read configuration input signal cfgr, write configuration input signal cfgw, and read/write input signal r/w are each a logical "0".

The ZCF tile 402 has (i) a configuration output node CFG on which the ZCF tile 402 transmits a configuration output signal CFG, (ii) a clock output node CLK on which the ZCF tile 402 transmits a clock output signal CLK, and (iii) a reset output node RST on which the ZCF tile 402 transmits a reset output signal RST, where each of the output signals CFG, CLK, RST are transmitted to a neighboring tile (e.g., a RCF tile 406) east of the ZCF tile 402.

The ZCF tile 402 has (i) a read configuration output node CFGR on which the ZCF tile 402 transmits a read configuration output signal CFGR, (ii) a write configuration output node CFGW on which the ZCF tile 402 transmits a write configuration output signal CFGW, and (iii) a read/write output node R/W on which the ZCF tile 402 transmits a read/write output signal R/W, where each of the output signals CFGR, CFGW, R/W are transmitted to a neighboring tile (e.g., a CCF tile 404) south of the ZCF tile 402.

The ZCF tile 402 has, as shown in FIG. 4, down control input nodes cntd. The down control input nodes cntd include (i) down clock input nodes $clk[0]_d$, $clk[1]_d$, $clk[2]_d$, $clk[3]_d$ on which the ZCF tile 402 receives respective down clock input signals $clk[0]_d$, $clk[1]_d$, $clk[2]_d$, $clk[3]_d$, (ii) down reset input nodes $rst[0]_d$, $rst[1]_d$, $rst[2]_d$, $rst[3]_d$ on which the ZCF tile 402 receives respective down reset input signals $rst[0]_d$, $rst[1]_d$, $rst[2]_d$, $rst[3]_d$, (iii) down read configuration input nodes $cfgr[0]_d$, $cfgr[1]_d$, $cfgr[2]_d$, $cfgr[3]_d$ on which the ZCF tile 402 receives respective down read configuration input signals $cfgr[0]_d$, $cfgr[1]_d$, $cfgr[2]_d$, $cfgr[3]_d$, (iv) down write configuration input nodes $cfgw[0]_d$, $cfgw[1]_d$, $cfgw[2]_d$, $cfgw[3]_d$ on which the ZCF tile 402 receives respective down write configuration input signals $cfgw[0]_d$, $cfgw[1]_d$, $cfgw[2]_d$, $cfgw[3]_d$, (v) down read/write input nodes $r/w[0]_d$, $r/w[1]_d$, $r/w[2]_d$, $r/w[3]_d$ on which the ZCF tile 402 receives respective down read/write input signals $r/w[0]_d$, $r/w[1]_d$, $r/w[2]_d$, $r/w[3]_d$, and (vi) a down configuration input node $cfg_d$ on which the ZCF tile 402 receives a down configuration input signal $cfg_d$, where each of the input signals $clk[3:0]_d$, $rst[3:0]_d$, $cfgr[3:0]_d$, $cfgw[3:0]_d$, $r/w[3:0]_d$, $cfg_d$ are received from a neighboring tile (e.g., another ZCF tile 402) down from the ZCF tile 402 in a neighboring die.

The ZCF tile 402 has, as shown in FIG. 4, up control output nodes $CNT_U$. The up control output nodes $CNT_U$ include (i) up clock output nodes $CLK[0]_U$, $CLK[1]_U$, $CLK[2]_U$, $CLK[3]_U$ on which the ZCF tile 402 transmits respective up clock output signals $CLK[0]_U$, $CLK[1]_U$, $CLK[2]_U$, $CLK[3]_U$, (ii) up reset output nodes $RST[0]_U$, $RST[1]_U$, $RST[2]_U$, $RST[3]_U$ on which the ZCF tile 402 transmits respective up reset output signals $RST[0]_U$, $RST[1]_U$, $RST[2]_U$, $RST[3]_U$, (iii) up read configuration output nodes $CFGR[0]_U$, $CFGR[1]_U$, $CFGR[2]_U$, $CFGR[3]_U$ on which the ZCF tile 402 transmits respective up read configuration output signals $CFGR[0]_U$, $CFGR[1]_U$, $CFGR[2]_U$, $CFGR[3]_U$, (iv) up write configuration output nodes $CFGW[0]_U$, $CFGW[1]_U$, $CFGW[2]_U$, $CFGW[3]_U$ on which the ZCF tile 402 transmits respective up write configuration output signals $CFGW[0]_U$, $CFGW[1]_U$, $CFGW[2]_U$, $CFGW[3]_U$, (v) up read/write output nodes $R/W[0]_U$, $R/W[1]_U$, $R/W[2]_U$, $R/W[3]_U$ on which the ZCF tile 402 transmits respective up read/write output signals $R/W[0]_U$, $R/W[1]_U$, $R/W[2]_U$, $R/W[3]_U$, and (vi) an up configuration output node $CFG_U$ on which the ZCF tile 402 transmits an up configuration output signal $CFG_U$, where each of the output signals $CLK[3:0]_U$, $RST[3:0]_U$, $CFGR[3:0]_U$, $CFGW[3:0]_U$, $R/W[3:0]_U$, $CFG_U$ are transmitted to a neighboring tile (e.g., another ZCF tile 402) up from the ZCF tile 402 in a neighboring die.

The down read/write input node $r/w[0]_d$ and the read/write input node r/w are connected to respective input nodes of the multiplexer 502. The multiplexer 502 selectively outputs a signal from one of the down read/write input node $r/w[0]_d$ and the read/write input node r/w to an output node of the multiplexer 502, which is connected to the read/write output node R/W, based on the down configuration input signal $cfg_d$ on the down configuration input node $cfg_d$. In some examples, the multiplexer 502 outputs the down read/write input signal $r/w[0]_d$ as the read/write output signal R/W when the down configuration input signal $cfg_d$ is asserted, and outputs the read/write input signal r/w as the read/write output signal R/W when the down configuration input signal $cfg_d$ is not asserted.

The down read/write input nodes $r/w[1]_d$, $r/w[2]_d$, $r/w[3]_d$ are connected to input nodes of respective buffers 522-0, 522-1, 522-2. Respective output nodes of the buffers 522-0, 522-1, 522-2 are connected to up read/write output nodes $R/W[0]_U$, $R/W[1]_U$, $R/W[2]_U$. An input node of a buffer 522-3 is connected to a logically high node (e.g., indicated as "1" and hereinafter a "logical '1'"), which may be a power supply node. In this configuration, the down read/write input signal $r/w[1]_d$ is output as the up read/write output signal $R/W[0]_U$; the down read/write input signal $r/w[2]_d$ is output as the up read/write output signal $R/W[1]_U$; and the down read/write input signal $r/w[3]_d$ is output as the up read/write output signal R/W[2]$_U$. The logical "1" is output as the up read/write output signal R/W[3]$_U$.

The down read/write input signal r/w[0]$_d$ is able to be used in the die on which the ZCF tile 402 is disposed because signals input to any underlying dies are shifted through each underlying die. For example, if the PL IC 104 transmits a read/write signal targeting the third PCM IC 106 from the PL IC 104, the read/write signal is received as a down read/write input signal r/w[2]$_d$ on the first PCM IC 106, which shifts the signal to an up read/write output signal R/W[1]$_U$ that is received as a down read/write input signal r/w[1]$_d$ on the second PCM IC 106. The second PCM IC 106 shifts the signal to an up read/write output signal R/W[0]$_U$ that is received as a down read/write input signal r/w[0]$_d$ on the third PCM IC 106, which is input to the multiplexer 502 on the third PCM IC 106.

A similar configuration and operation is implemented for the down write configuration input nodes cfgw[1]$_d$, cfgw[2]$_d$, cfgw[3]$_d$, the buffers 524-0, 524-1, 524-2, 524-3, and the up write configuration output nodes CFGW[0]$_U$, CFGW[1]$_U$, CFGW[2]$_U$, CFGW[3]$_U$. A similar configuration and operation is implemented for the down read configuration input nodes cfgr[1]$_d$, cfgr[2]$_d$, cfgr[3]$_d$, the buffers 526-0, 526-1, 526-2, 526-3, and the up read configuration output nodes CFGR[0]$_U$, CFGR[1]$_U$, CFGR[2]$_U$, CFGR[3]$_U$. A similar configuration and operation is implemented for the down reset input nodes rst[1]$_d$, rst[2]$_d$, rst[3]$_d$, the buffers 528-0, 528-1, 528-2, 528-3, and the up reset output nodes RST[0]$_U$, RST[1]$_U$, RST[2]$_U$, RST[3]$_U$. A similar configuration and operation is implemented for the down clock input nodes clk[1]$_d$, clk[2]$_d$, clk[3]$_d$, the buffers 530-0, 530-1, 530-2, 530-3, and the up clock output nodes CLK[0]$_U$, CLK[1]$_U$, CLK[2]$_U$, CLK[3]$_U$. Hence, description of these components is omitted for brevity, and a person having ordinary skill in the art will further understand such configuration and operation by reference to FIG. 5.

The down write configuration input node cfgw[0]$_d$ and the write configuration input node cfgw are connected to respective input nodes of the multiplexer 504. The multiplexer 504 selectively outputs a signal from one of the down write configuration input node cfgw[0]$_d$ and the write configuration input node cfgw to an output node of the multiplexer 504, which is connected to the write configuration output node CFGW, based on the down configuration input signal cfg$_d$ on the down configuration input node cfg$_d$. In some examples, the multiplexer 504 outputs the down write configuration input signal cfgw[0]$_d$ as the write configuration output signal CFGW when the down configuration input signal cfg$_d$ is asserted, and outputs the write configuration input signal cfgw as the write configuration output signal CFGW when the down configuration input signal cfg$_d$ is not asserted.

The down read configuration input node cfgr[0]$_d$ and the read configuration input node cfgr are connected to respective input nodes of the multiplexer 506. The multiplexer 506 selectively outputs a signal from one of the down read configuration input node cfgr[0]$_d$ and the read configuration input node cfgr to an output node of the multiplexer 506, which is connected to the read configuration output node CFGR, based on the down configuration input signal cfg$_d$ on the down configuration input node cfg$_d$. In some examples, the multiplexer 506 outputs the down read configuration input signal cfgr[0]$_d$ as the read configuration output signal CFGR when the down configuration input signal cfg$_d$ is asserted, and outputs the read configuration input signal cfgr as the read configuration output signal CFGR when the down configuration input signal cfg$_d$ is not asserted.

The down reset input node rst[0]$_d$ and the reset input node rst are connected to respective input nodes of the multiplexer 508. The multiplexer 508 selectively outputs a signal from one of the down reset input node rst[0]$_d$ and the reset input node rst to an output node of the multiplexer 508, which is connected to the reset output node RST, based on the down configuration input signal cfg$_d$ on the down configuration input node cfg$_d$. In some examples, the multiplexer 508 outputs the down reset input signal rst[0]$_d$ as the reset output signal RST when the down configuration input signal cfg$_d$ is asserted, and outputs the reset input signal rst as the reset output signal RST when the down configuration input signal cfg$_d$ is not asserted.

The down clock input node clk[0]$_d$ and the clock input node clk are connected to respective input nodes of the multiplexer 510. The multiplexer 510 selectively outputs a signal from one of the down clock input node clk[0]$_d$ and the clock input node clk to an output node of the multiplexer 510, which is connected to the clock output node CLK, based on the down configuration input signal cfg$_d$ on the down configuration input node cfg$_d$. In some examples, the multiplexer 510 outputs the down clock input signal clk[0]$_d$ as the clock output signal CLK when the down configuration input signal cfg$_d$ is asserted, and outputs the clock input signal clk as the clock output signal CLK when the down configuration input signal cfg$_d$ is not asserted.

The down write configuration input node cfgw[0]$_d$ and the configuration input node cfg are connected to respective input nodes of the multiplexer 512. The multiplexer 512 selectively outputs a signal from one of the down write configuration input node cfgw[0]$_d$ and the configuration input node cfg to an output node of the multiplexer 512, which is connected to the configuration output node CFG, based on the down configuration input signal cfg$_d$ on the down configuration input node cfg$_d$. In some examples, the multiplexer 512 outputs the down write configuration input signal cfgw[0]$_d$ as the configuration output signal CFG when the down configuration input signal cfg$_d$ is asserted, and outputs the configuration input signal cfg as the configuration output signal CFG when the down configuration input signal cfg$_d$ is not asserted.

The down configuration input node cfg$_d$ is connected to an input node of the buffer 520. An output node of the buffer 520 is connected to the up configuration output node CFG$_{zu}$. In this configuration, the down configuration input signal cfg$_d$ is output as an up configuration output signal CFG$_{zu}$.

Table 1 below shows an example truth table for the signals output by multiplexers 502-512 based on the down configuration input signal cfg$_d$.

TABLE 1

| cfg$_d$ | 502 (R/W) | 504 (CFGW) | 506 (CFGR) | 508 (RST) | 510 (CLK) | 512 (CFG) |
|---|---|---|---|---|---|---|
| 0 | r/w | cfgw | cfgr | rst | clk | cfg |
| 1 | r/w[0]$_d$ | cfgw[0]$_d$ | cfgr[0]$_d$ | rst[0]$_d$ | clk[0]$_d$ | cfgw[0]$_d$ |

Figure 6:
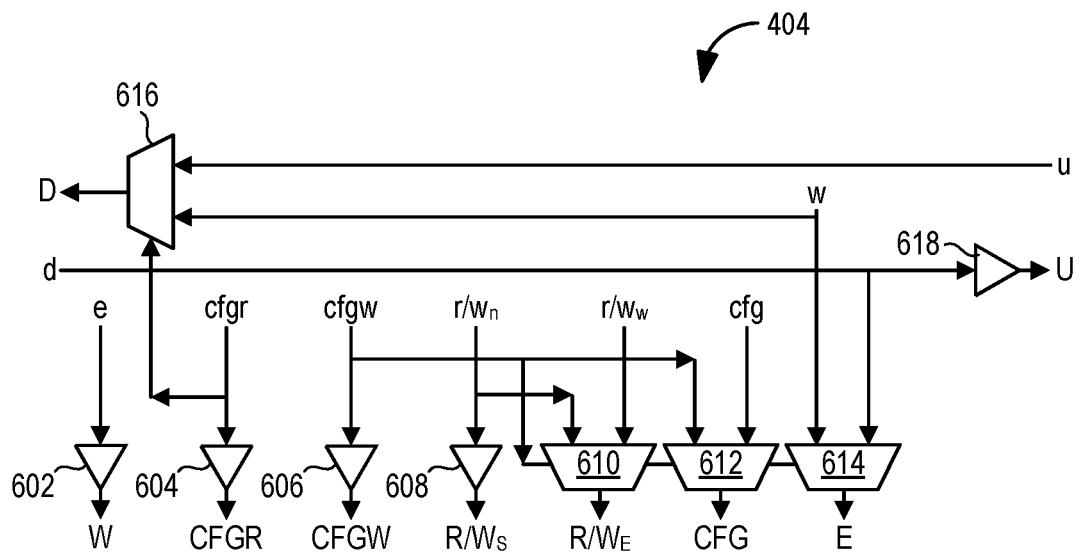
FIG. 6 is a circuit schematic of a column configuration (CCF) tile of a PCM region according to some examples.

FIG. 6 is a circuit schematic of a CCF tile 404 according to some examples. The ZCF tile 402 has various input and output nodes that are also depicted in FIG. 4 and described below. The CCF tile 404 includes buffers 602, 604, 606, 608, 618 and multiplexers 610, 612, 614, 616.

The CCF tile 404 has (i) a west input node w on which the CCF tile 404 receives a west input signal w, (ii) a configuration input node cfg on which the CCF tile 404 receives a configuration input signal cfg, (iii) a west read/write input node r/ww on which the CCF tile 404 receives a west read/write input signal r/w$_w$, and (iv) a west output node Won which the CCF tile 404 transmits a west output signal W, where each of the input and output signals w, cfg, r/w$_w$, W are received from or transmitted to a neighboring tile (e.g., a ZCK tile 410, a PCM tile 308, or a ZRT tile 408) west of the CCF tile 404.

The CCF tile 404 has (i) a read configuration input node cfgr on which the CCF tile 404 receives a read configuration input signal cfgr, (ii) a write configuration input node cfgw on which the CCF tile 404 receives a write configuration input signal cfgw, and (iii) a north read/write input node r/w$_n$ on which the CCF tile 404 receives a north read/write input signal r/w$_n$, where each of the input signals cfgr, cfgw, r/w$_n$ are received from a neighboring tile (e.g., a ZCF tile 402 or another CCF tile 404) north of the CCF tile 404.

The CCF tile 404 has (i) an east output node E on which the CCF tile 404 transmits an east output signal E, (ii) a configuration output node CFG on which the CCF tile 404 transmits a configuration output signal CFG, (iii) an east read/write output node R/W$_E$ on which the CCF tile 404 transmits an east read/write output signal R/W$_E$, and (iv) an east input node e on which the CCF tile 404 receives an east input signal E, where each of the output and input signals E, CFG, R/W$_E$, e are transmitted to or received from a neighboring tile (e.g., a ZCK tile 410 or a PCM tile 308) east of the CCF tile 404.

The CCF tile 404 has (i) a read configuration output node CFGR on which the CCF tile 404 transmits a read configuration output signal CFGR, (ii) a write configuration output node CFGW on which the CCF tile 404 transmits a write configuration output signal CFGW, and (iii) a south read/write output node R/Ws on which the CCF tile 404 transmits a south read/write output signal R/Ws, where each of the output signals CFGR, CFGW, R/Ws are transmitted to a neighboring tile (e.g., a ZCF tile 402 or another CCF tile 404) south of the CCF tile 404.

The CCF tile 404 has (i) a down input node d on which the CCF tile 404 receives a down input signal d and (ii) a down output node D on which the CCF tile 404 transmits a down output signal D, where each of the input and output signals d, D are received from or transmitted to a neighboring tile (e.g., another CCF tile 404) down from the CCF tile 404 in a neighboring die.

The CCF tile 404 has (i) an up input node u on which the CCF tile 404 receives an up input signal u and (ii) an up output node U on which the CCF tile 404 transmits an up output signal U, where each of the input and output signals u, U are received from or transmitted to a neighboring tile (e.g., another CCF tile 404) up from the CCF tile 404 in a neighboring die.

The east input node e is connected to an input node of the buffer 602, and an output node of the buffer 602 is connected to the west output node W. In this configuration, the east input signal e is output as the west output signal W. The read configuration input node cfgr is connected to an input node of the buffer 604, and an output node of the buffer 604 is connected to the read configuration output node CFGR. In this configuration, the read configuration input signal cfgr is output as the read configuration output signal CFGR. The write configuration input node cfgw is connected to an input node of the buffer 606, and an output node of the buffer 606 is connected to the write configuration output node CFGW. In this configuration, the write configuration input signal cfgw is output as the write configuration output signal CFGW. The north read/write input node r/w$_n$ is connected to an input node of the buffer 608, and an output node of the buffer 608 is connected to the south read/write output node R/Ws. In this configuration, the north read/write input signal r/w$_n$ is output as the south read/write output signal R/Ws.

The north read/write input node r/w$_n$ and the west read/write input node r/w$_w$ are connected to respective input nodes of the multiplexer 610. The multiplexer 610 selectively outputs a signal from one of the north read/write input node r/w$_n$ and the west read/write input node r/w$_w$ to an output node of the multiplexer 610, which is connected to the east read/write output node R/W$_E$, based on the write configuration input signal cfgw on the write configuration input node cfgw.

The write configuration input node cfgw and the configuration input node cfg are connected to respective input nodes of the multiplexer 612. The multiplexer 612 selectively outputs a signal from one of the write configuration input node cfgw and the configuration input node cfg to an output node of the multiplexer 612, which is connected to the configuration output node CFG, based on the write configuration input signal cfgw on the write configuration input node cfgw.

The west input node w and the down input node d are connected to respective input nodes of the multiplexer 614. The multiplexer 614 selectively outputs a signal from one of the west input node w and the down input node d to an output node of the multiplexer 614, which is connected to the east output node E, based on the write configuration input signal cfgw on the write configuration input node cfgw.

The up input node u and the west input node w are connected to respective input nodes of the multiplexer 616. The multiplexer 616 selectively outputs a signal from one of the up input node u and the west input node w to an output node of the multiplexer 616, which is connected to the down output node D, based on the read configuration input signal cfgr on the read configuration input node cfgr.

The down input node d is connected to an input node of the buffer 618, and an output node of the buffer 618 is connected to the up output node U. In this configuration, the down input signal d is output as the up output signal U.

Table 2 below shows an example truth table for the signals output by multiplexers 610-616 based on the write configuration input signal cfgw or the read configuration input signal cfgr.

TABLE 2

| cfgw | cfgr | 610 (R/W$_E$) | 612 (CFG) | 614 (E) | 616 (D) |
|---|---|---|---|---|---|
| 0 | X | r/w$_w$ | cfg | w | X |
| 1 | X | r/w$_n$ | cfgw | d | X |
| X | 0 | X | X | X | u |
| X | 1 | X | X | X | w |

Figure 7:
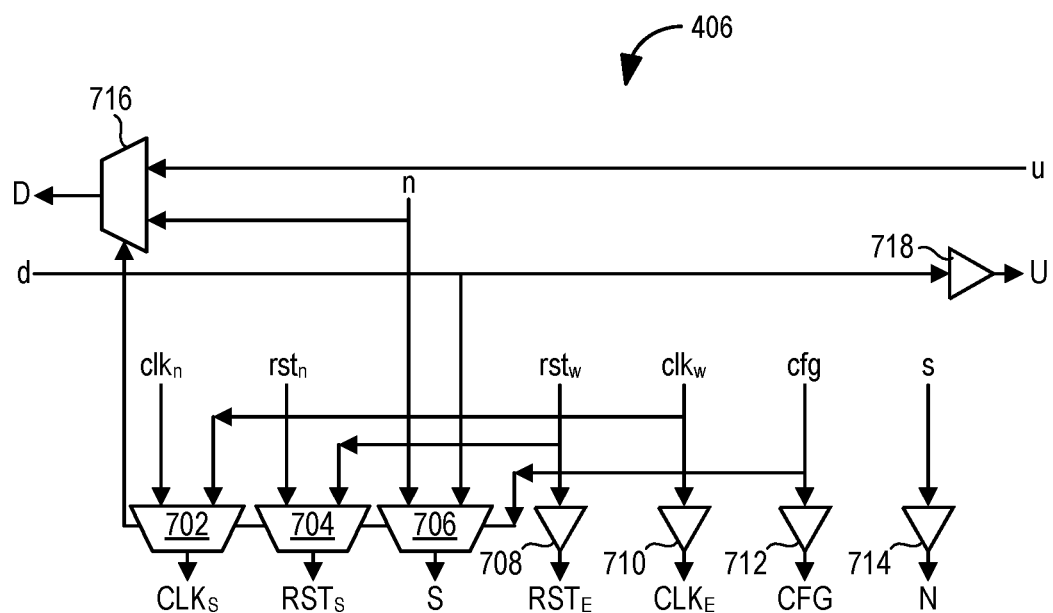
FIG. 7 is a circuit schematic of a row configuration (RCF) tile of a PCM region according to some examples.

FIG. 7 is a circuit schematic of a RCF tile 406 according to some examples. The RCF tile 406 has various input and output nodes that are also depicted in FIG. 4 and described below. The RCF tile 406 includes multiplexers 702, 704, 706, 716, and buffers 708, 710, 712, 714, 718.

The RCF tile 406 has (i) a configuration input node cfg on which the RCF tile 406 receives a configuration input signal cfg, (ii) a west clock input node clk$_w$ on which the RCF tile 406 receives a west clock input signal clk$_w$, and (iii) a west reset input node rst$_w$ on which the RCF tile 406 receives a west reset input signal rst$_w$, where each of the input signals cfg, $clk_w$, $rst_w$ are received from a neighboring tile (e.g., a ZCF tile 402 or another RCF tile 406) west of the RCF tile 406.

The RCF tile 406 has (i) a north output node N on which the RCF tile 406 transmits a north output signal N, (ii) a north clock input node $clk_n$ on which the RCF tile 406 receives a north clock input signal $clk_n$, (iii) a north reset input node $rst_n$ on which the RCF tile 406 receives a north reset input signal $rst_n$, and (iv) a north input node n on which the RCF tile 406 receives a north input signal n, where each of the input and output signals N, $clk_n$, $rst_n$, n are received from or transmitted to a neighboring tile (e.g., a ZRT tile 408 or a PCM tile 308) north of the RCF tile 406.

The RCF tile 406 has (i) a configuration output node CFG on which the RCF tile 406 transmits a configuration output signal CFG, (ii) an east clock output node $CLK_E$ on which the RCF tile 406 transmits an east clock output signal $CLK_E$, and (iii) an east reset output node $RST_E$ on which the RCF tile 406 transmits an east reset output signal $RST_E$, where each of the output signals CFG, $CLK_E$, $RST_E$ are transmitted to a neighboring tile (e.g., a ZCF tile 402 or another RCF tile 406) east of the RCF tile 406.

The RCF tile 406 has (i) a south input node s on which the RCF tile 406 receives a south input signal s, (ii) a south clock output node CLKs on which the RCF tile 406 transmits a south clock output signal CLKs, (iii) a south reset output node RSTs on which the RCF tile 406 transmits a south reset output signal RSTs, and (iv) a south output node S on which the RCF tile 406 transmits a south output signal S, where each of the input and output signals s, CLKs, RSTs, S are received from or transmitted to a neighboring tile (e.g., a ZCK tile 410, a ZRT tile 408, or a PCM tile 308) south of the RCF tile 406.

The RCF tile 406 has (i) a down input node d on which the RCF tile 406 receives a down input signal d and (ii) a down output node D on which the RCF tile 406 transmits a down output signal D, where each of the input and output signals d, D are received from or transmitted to a neighboring tile (e.g., another RCF tile 406) down from the RCF tile 406 in a neighboring die.

The RCF tile 406 has (i) an up input node u on which the RCF tile 406 receives an up input signal u and (ii) an up output node U on which the RCF tile 406 transmits an up output signal U, where each of the input and output signals u, U are received from or transmitted to a neighboring tile (e.g., another RCF tile 406) up from the RCF tile 406 in a neighboring die.

The north clock input node $clk_n$ and the west clock input node $clk_w$ are connected to respective input nodes of the multiplexer 702. The multiplexer 702 selectively outputs a signal from one of the north clock input node $clk_n$ and the west clock input node $clk_w$ to an output node of the multiplexer 702, which is connected to the south clock output node CLKs, based on the configuration input signal cfg on the configuration input node cfg.

The north reset input node $rst_n$ and the west reset input node $rst_w$ are connected to respective input nodes of the multiplexer 704. The multiplexer 704 selectively outputs a signal from one of the north reset input node $rst_n$ and the west reset input node $rst_w$ to an output node of the multiplexer 704, which is connected to the south reset output node RSTs, based on the configuration input signal cfg on the configuration input node cfg.

The north input node n and the down input node d are connected to respective input nodes of the multiplexer 706. The multiplexer 706 selectively outputs a signal from one of the north input node n and the down input node d to an output node of the multiplexer 706, which is connected to the south output node S, based on the configuration input signal cfg on the configuration input node cfg.

The west reset input node $rst_w$ is connected to an input node of the buffer 708, and an output node of the buffer 708 is connected to the east reset output node $RST_E$. In this configuration, the west reset input signal $rst_w$ is output as the east reset output signal $RST_E$. The west clock input node $clk_w$ is connected to an input node of the buffer 710, and an output node of the buffer 710 is connected to the east clock output node $CLK_E$. In this configuration, the west clock input signal $clk_w$ is output as the east clock output signal $CLK_E$. The configuration input node cfg is connected to an input node of the buffer 712, and an output node of the buffer 712 is connected to the configuration output node CFG. In this configuration, the configuration input signal cfg is output as the configuration output signal CFG. The south input node s is connected to an input node of the buffer 714, and an output node of the buffer 714 is connected to the north output node N. In this configuration, the south input signal s is output as the north output signal N.

The up input node u and the north input node n are connected to respective input nodes of the multiplexer 716. The multiplexer 716 selectively outputs a signal from one of the up input node u and the north input node n to an output node of the multiplexer 716, which is connected to the down output node D, based on the configuration input signal cfg on the configuration input node cfg.

The down input node d is connected to an input node of the buffer 718, and an output node of the buffer 718 is connected to the up output node U. In this configuration, the down input signal d is output as the up output signal U.

Table 3 below shows an example truth table for the signals output by multiplexers 702-706, 716 based on the configuration input signal cfg.

TABLE 3

| cfg | 702 (CLKs) | 704 (RSTs) | 706 (S) | 716 (D) |
| --- | --- | --- | --- | --- |
| 0 | $clk_n$ | $rst_n$ | n | u |
| 1 | $clk_w$ | $rst_w$ | d | n |

Figure 8:
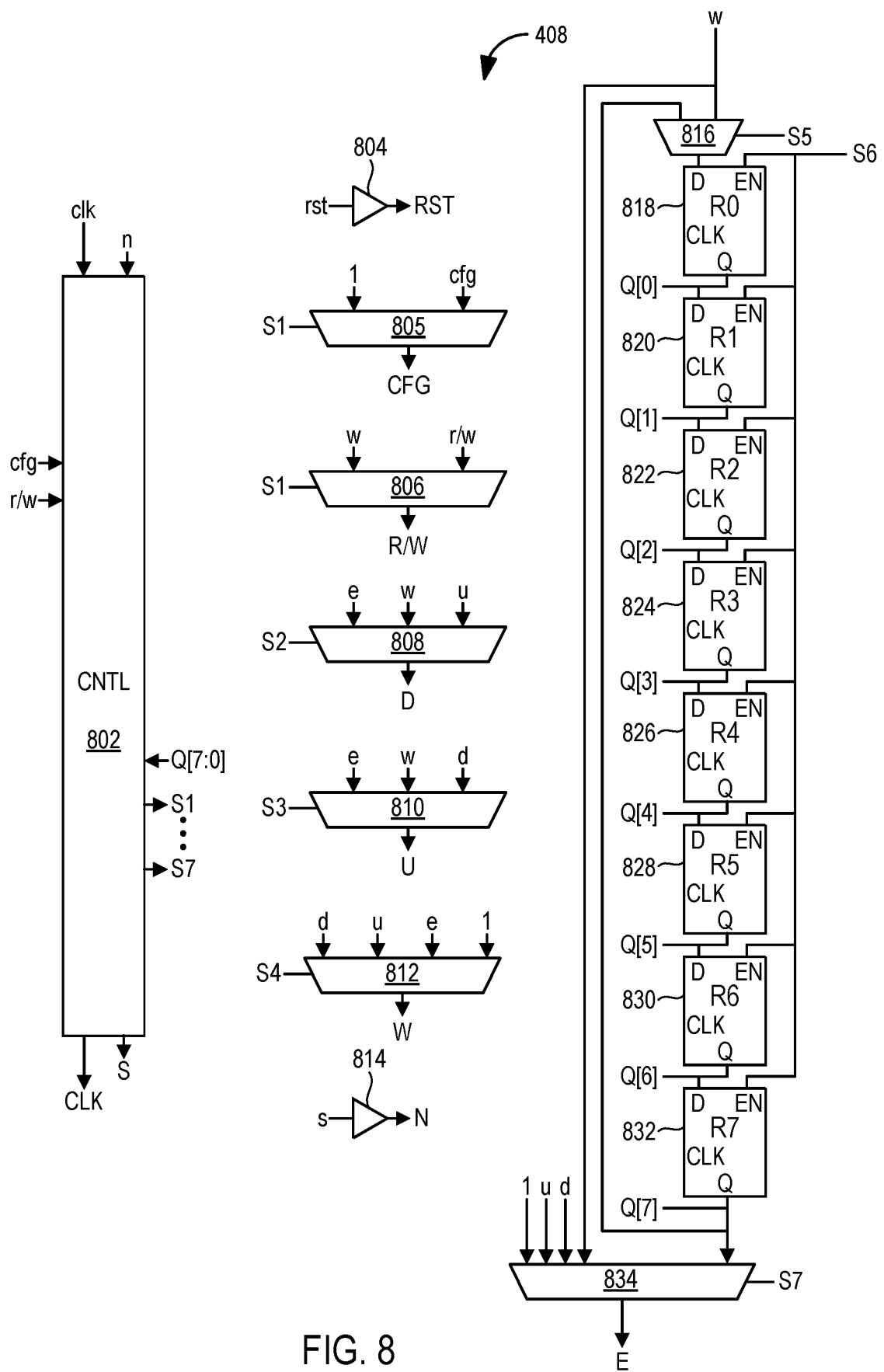
FIG. 8 is a circuit schematic of a z-direction routing (ZRT) tile of a PCM region according to some examples.

FIG. 8 is a circuit schematic of a ZRT tile 408 according to some examples. The ZRT tile 408 has various input and output nodes that are also depicted in FIG. 4 and described below. The ZRT tile 408 includes control logic 802, buffers 804, 814, multiplexers 805, 806, 808, 810, 812, 816, 834, and flip-flops R0-R7 818, 820, 822, 824, 826, 828, 830, 832.

The ZRT tile 408 has (i) a west input node w on which the ZRT tile 408 receives a west input signal w, (ii) a configuration input node cfg on which the ZRT tile 408 receives a configuration input signal cfg, (iii) a read/write input node r/w on which the ZRT tile 408 receives a read/write input signal r/w, and (iv) a west output node W on which the ZRT tile 408 transmits a west output signal W, where each of the input and output signals w, cfg, r/w, W are received from or transmitted to a neighboring tile (e.g., a ZCK tile 410 or a PCM tile 308) west of the ZRT tile 408.

The ZRT tile 408 has (i) a north output node N on which the ZRT tile 408 transmits a north output signal N, (ii) a clock input node clk on which the ZRT tile 408 receives a clock input signal clk, (iii) a reset input node rst on which the ZRT tile 408 receives a reset input signal rst, and (iv) a north input node n on which the ZRT tile 408 receives a north input signal n, where each of the input and output signals N, clk, rst, n are received from or transmitted to a neighboring tile (e.g., a RCF tile 406, another ZRT tile 408, or a PCM tile 308) north of the ZRT tile 408.

The ZRT tile 408 has (i) an east output node E on which the ZRT tile 408 transmits an east output signal E, (ii) a configuration output node CFG on which the ZRT tile 408 transmits a configuration output signal CFG, (iii) a read/write output node R/W on which the ZRT tile 408 transmits a read/write output signal R/W, and (iv) an east input node e on which the ZRT tile 408 receives an east input signal e, where each of the output and input signals E, CFG, R/W, e are transmitted to or received from a neighboring tile (e.g., a ZCK tile 410 or a PCM tile 308) east of the ZRT tile 408.

The ZRT tile 408 has (i) a south input node s on which the ZRT tile 408 receives a south input signal s, (ii) a clock output node CLK on which the ZRT tile 408 transmits a clock output signal CLK, (iii) a reset output node RST on which the ZRT tile 408 transmits a reset output signal RST, and (iv) a south output node S on which the ZRT tile 408 transmits a south output signal S, where each of the input and output signals s, CLK, RST, S are received from or transmitted to a neighboring tile (e.g., a RCF tile 406, another ZRT tile 408, or a PCM tile 308) south of the ZRT tile 408.

The ZRT tile 408 has (i) a down input node d on which the ZRT tile 408 receives a down input signal d and (ii) a down output node D on which the ZRT tile 408 transmits a down output signal D, where each of the input and output signals d, D are received from or transmitted to a neighboring tile (e.g., another ZRT tile 408) down from the ZRT tile 408 in a neighboring die, or down from a PL die 204.

The ZRT tile 408 has (i) an up input node u on which the ZRT tile 408 receives an up input signal u and (ii) an up output node U on which the ZRT tile 408 transmits an up output signal U, where each of the input and output signals u, U are received from or transmitted to a neighboring tile (e.g., another ZRT tile 408) up from the ZRT tile 408 in a neighboring die.

The control logic 802 has respective input nodes connected to the clock input node clk, north input node n, configuration input node cfg, and a read/write input node r/w. The control logic 802 receives the clock input signal clk, north input signal n, configuration input signal cfg, and read/write input signal r/w, via the clock input node clk, north input node n, configuration input node cfg, and read/write input node r/w, respectively. The control logic 802 further has respective output nodes connected to the clock output node CLK and the south output node S. The control logic 802 transmits the clock output signal CLK and the south output signal S, via the clock output node CLK and the south output node S, respectively. The signals input and output from the control logic 802 can be buffered in some examples.

The control logic 802 further has respective output nodes connected to internal control nodes S1-S7, and has respective input nodes connected to data bit nodes Q[7:0]. Respective signals output from the control logic 802 on the internal control nodes S1-S7 control respective multiplexers 805-812, 816, 834 and enable the flip-flops R0-R7 818-832, as described below. The clock input signal clk is further transmitted from the control logic 802 to clock input nodes CLK of the flip-flops R0-R7 818-832, although this is not specifically illustrated. The clock input signal clk is used to trigger the flip-flops R0-R7 818-832. Data on data bit nodes Q[7:0] is transmitted from respective data output nodes Q of the flip-flops R0-R7 818-832, as described below, and is configuration data.

The reset input node rst is connected to an input node of the buffer 804, and an output node of the buffer 804 is connected to the reset output node RST. In this configuration, the reset input signal rst is output as the reset output signal RST.

The configuration input node cfg is connected to an input node of the multiplexer 805. A logical "1" is input to another input node of the multiplexer 805. The multiplexer 805 selectively outputs the signal from the configuration input node cfg or the logical "1" to an output node of the multiplexer 805, which is connected to the configuration output node CFG, based on the internal control signal S1 from the control logic 802. In some examples, the multiplexer 805 outputs the configuration input signal cfg on the configuration input node cfg as the configuration output signal CFG on the configuration output node CFG when the configuration input signal cfg is asserted or when neither the configuration input signal cfg nor the data bit Q[7] is asserted, and outputs the logical "1" as the configuration output signal CFG on the configuration output node CFG when the data bit Q[7] is asserted but not the configuration input signal cfg.

The west input node w and the read/write input node r/w are connected to respective input nodes of the multiplexer 806. The multiplexer 806 selectively outputs a signal from one of the west input node w and the read/write input node r/w to an output node of the multiplexer 806, which is connected to the read/write output node R/W, based on the internal control signal S1 from the control logic 802. In some examples, the multiplexer 806 outputs a read/write input signal r/w on the read/write input node r/w as the read/write output signal R/W on the read/write output node R/W when the configuration input signal cfg is asserted or when neither the configuration input signal cfg nor the data bit Q[7] is asserted, and outputs the west input signal w on the west input node w as the read/write output signal R/W on the read/write output node R/W when the data bit Q[7] is asserted but not the configuration input signal cfg.

The east input node e, the west input node w, and the up input node u are connected to respective input nodes of the multiplexer 808. The multiplexer 808 selectively outputs a signal from one of the east input node e, the west input node w, and the up input node u to an output node of the multiplexer 808, which is connected to the down output node D, based on the internal control signal S2 from the control logic 802. In some examples, the multiplexer 808 outputs the up input signal u as the down output signal D when the configuration input signal cfg is asserted, and outputs any of the east input signal e, west input signal w, and up input signal u as the down output signal D based on any of the data bits Q[7:0] (e.g., data bits Q[6:4]) when the configuration input signal cfg is not asserted.

The east input node e, the west input node w, and the down input node d are connected to respective input nodes of the multiplexer 810. The multiplexer 810 selectively outputs a signal from one of the east input node e, the west input node w, and the down input node d to an output node of the multiplexer 810, which is connected to the up output node U, based on the internal control signal S3 from the control logic 802. In some examples, the multiplexer 810 outputs the down input signal d as the up output signal U when the configuration input signal cfg is asserted, and outputs any of the east input signal e, west input signal w, and down input signal d as the up output signal U based on any of the data bits Q[7:0] (e.g., data bits Q[6:4]) when the configuration input signal cfg is not asserted.

The down input node d, the up input node u, the east input node e, and a logical "1" are connected to respective input nodes of the multiplexer 812. The multiplexer 812 selectively outputs a signal from one of the down input node d, the up input node u, the east input node e, and the logical "1" to an output node of the multiplexer 812, which is connected to the west output node W, based on the internal control signal S4 from the control logic 802. In some examples, the multiplexer 812 outputs the east input signal e as the west output signal W when the configuration input signal cfg is asserted, and outputs any of the down input signal d, up input signal u, east input signal e, and logical "1" as the west output signal W based on any of the data bits Q[7:0] (e.g., data bits Q[3:2]) when the configuration input signal cfg is not asserted.

The south input node s is connected to an input node of the buffer 814, and an output node of the buffer 814 is connected to the north output node N. In this configuration, the south input signal s is output as the north output signal N.

Tables 4-6 below show example truth tables for the signals output by multiplexers 805-812 based on the configuration input signal cfg and data bits Q[7:0].

TABLE 4

| cfg | Q[7] | 805 (CFG) | 806 (R/W) |
|-----|------|-----------|-----------|
| 1   | X    | cfg (1)   | r/w       |
| 0   | 0    | cfg (0)   | r/w       |
| 0   | 1    | 1         | w         |

TABLE 5

| cfg | Q[6] | Q[5] | Q[4] | 808 (D) | 810 (U) |
|-----|------|------|------|---------|---------|
| 1   | X    | X    | X    | u       | d       |
| 0   | 0    | 0    | 0    | u       | d       |
| 0   | 0    | 0    | 1    | e       | d       |
| 0   | 0    | 1    | 0    | w       | d       |
| 0   | 0    | 1    | 1    | e       | e       |
| 0   | 1    | 0    | 0    | w/e/d   | e/w/u   |
| 0   | 1    | 0    | 1    | w       | w       |
| 0   | 1    | 1    | 0    | u       | e       |
| 0   | 1    | 1    | 1    | u       | w       |

TABLE 6

| cfg | Q[3] | Q[2] | 812(W) |
|-----|------|------|--------|
| 1   | X    | X    | e      |
| 0   | 0    | 0    | e      |
| 0   | 0    | 1    | u      |
| 0   | 1    | 0    | d      |
| 0   | 1    | 1    | 1      |

In the example truth table of Table 5 in the context of the illustrated example, a permutation for the down output signal D and up output signal U is omitted, e.g., due to the number of available unique combination of configuration bits (e.g., $2^3=8$) being one less than the combinations of the down output signal D and up output signal U (e.g., 3×3=9). An additional configuration bit can be implemented to capture possible permutations, or fewer configuration bits can be implemented for reduced possible permutations. Additionally, the down input signal d and the up input signal u can be output for the down output signal D and the up output signal U, respectively, as shown in Table 5. The down input node d and the up input node u would be connected to an input node of the multiplexers 808 and 810, respectively, to enable this optional output.

The flip-flops R0-R7 818-832 form a configuration shift register (CSR) between the multiplexers 816, 834. As illustrated, the flip-flops R0-R7 818-832 are enable D flip-flops. The west input node w is connected to an input node of the multiplexer 816 and an input node of the multiplexer 834. Another input node of the multiplexer 816 is connected to a data output node Q of the flip-flop R7 832 as feedback. An output node of the multiplexer 816 is connected to a data input node D of the flip-flop R0 818. A data output node Q of the flip-flop R0 818 is connected to a data input node D of the flip-flop R1 820 and is a data bit node Q[0]. A data output node Q of the flip-flop R1 820 is connected to a data input node D of the flip-flop R2 822 and is a data bit node Q[1]. A data output node Q of the flip-flop R2 822 is connected to a data input node D of the flip-flop R3 824 and is a data bit node Q[2]. A data output node Q of the flip-flop R3 824 is connected to a data input node D of the flip-flop R4 826 and is a data bit node Q[3]. A data output node Q of the flip-flop R4 826 is connected to a data input node D of the flip-flop R5 828 and is a data bit node Q[4]. A data output node Q of the flip-flop R5 828 is connected to a data input node D of the flip-flop R6 830 and is a data bit node Q[5]. A data output node Q of the flip-flop R6 830 is connected to a data input node D of the flip-flop R7 832 and is a data bit node Q[6]. The data output node Q of the flip-flop R7 832 is connected to another input node of the multiplexer 834 and to the input node of the multiplexer 816 (as feedback), and is a data bit node Q[7]. Internal control node S6 is connected to enable input nodes EN of the flip-flops R0-R7 818-832.

The multiplexer 816 selectively outputs a signal from one of the west input node w and data bit node Q[7] to an output node of the multiplexer 816 based on the internal control signal S5 from the control logic 802. In some examples, the multiplexer 816 outputs the west input signal w on the west input node w to the data input node D of the flip-flop R0 818 when the configuration input signal cfg is asserted and the read/write input signal r/w is not asserted, and otherwise, outputs the data bit Q[7] on the data bit node Q[7] to the data input node D of the flip-flop R0 818.

The internal control signal S6 is asserted, and hence, the flip-flops R0-R7 818-832 are enabled, when both the configuration input signal cfg and the north input signal n are asserted; otherwise, the internal control signal S6 is not asserted.

A logical "1", the up input node u, and down input node d are further connected to respective input nodes of the multiplexer 834. The multiplexer 834 selectively outputs a signal from one of the data bit node Q[7], the west input node w, the logical "1", up input node u, and the down input node d to an output node of the multiplexer 834, which is connected to the east output node E, based on the internal control signal S7 from the control logic 802. In some examples, the multiplexer 834 outputs the data bit Q[7] on the data bit node Q[7] as the east output signal E on the east output node E when the configuration input signal cfg, the read/write input signal r/w, and the north input signal n are asserted; outputs the west input signal w as the east output signal E on the east output node E when the configuration input signal cfg is asserted and at least one of the read/write input signal r/w and north input signal n are not asserted; and outputs one of the west input signal w, down input signal d, up input signal u, and logical "1" as the east output signal E on the east output node E when the configuration input signal cfg is not asserted and based on any of the data bits Q[7:0] (e.g., data bits Q[1:0]).

Table 7 below shows an example truth table for the signals output by multiplexers 816, 834 and the internal control signal S6 based on the input signals cfg, n, r/w and data bits Q[1:0].

TABLE 7

| cfg | n | r/w | Q[1] | Q[0] | 816 (D R0) | S6 (EN) | 834 (E) |
|-----|---|-----|------|------|------------|---------|---------|
| 0 | X | X | 0 | 0 | X | 0 | w |
| 0 | X | X | 0 | 1 | X | 0 | d |
| 0 | X | X | 1 | 0 | X | 0 | u |
| 0 | X | X | 1 | 1 | X | 0 | 1 |
| 1 | 0 | 0 | X | X | X | 0 | w |
| 1 | 0 | 1 | X | X | X | 0 | w |
| 1 | 1 | 0 | X | X | w | 1 | w |
| 1 | 1 | 1 | X | X | Q[7] | 1 | Q[7] |

It should be noted that when the internal control signal S6 is not asserted (e.g., logical "0"), the flip-flops R0-R7 818-832 are not enabled and retain their respective data states (e.g., the data state of the CSR does not change). As shown in Table 7, when the configuration input signal cfg is not asserted, the internal control signal S6 is not asserted, and the signal output by the multiplexer 834 (to the east output node E) is any of the west input signal w, down input signal d, up input signal u, or logical "1" based on the data bits Q[1:0]. Accordingly, the CSR retains its state, e.g., in which it retains configuration data, and any of the west input signal w, down input signal d, up input signal u, or logical "1" is selectively passed as the east output signal E based on the configuration data of data bits Q[1:0].

When the configuration input signal cfg is asserted (e.g., logical "1") and the north input signal n is not asserted, the internal control signal S6 is not asserted, and the signal output by the multiplexer 834 (to the east output node E) is the west input signal w. Accordingly, the CSR retains its state, and the west input signal w is passed as the east output signal E.

When the configuration input signal cfg and the north input signal n are asserted, the internal control signal S6 is asserted, and data propagates through the CSR based on the clock input signal clk triggering the flip-flops R0-R7 818-832. Hence, the north input signal n can act as an enable signal. In this circumstance, the signals output by the multiplexer 816 (as input to the CSR) and multiplexer 834 (to the east output node E) is the west input signal w when the read/write input signal r/w is not asserted and is the data bit Q[7] when the read/write input signal r/w is asserted. Accordingly, when the read/write input signal r/w is not asserted, data from the west input signal w is input into and propagates through the CSR, and is also passed as the east output signal E. This can write data from the west input signal w to the CSR. When the read/write input signal r/w is asserted, data from the CSR is fed back into and propagates through the CSR, and is also output as the east output signal E. This can permit reading data from the CSR. In the illustrated example with eight flip-flops, the CSR can be written or read using eight clock cycles. In a read operation in the illustrated example, the feedback of the data of the CSR can permit the CSR to return to its state preceding the reading after eight clock cycles.

Figure 9:
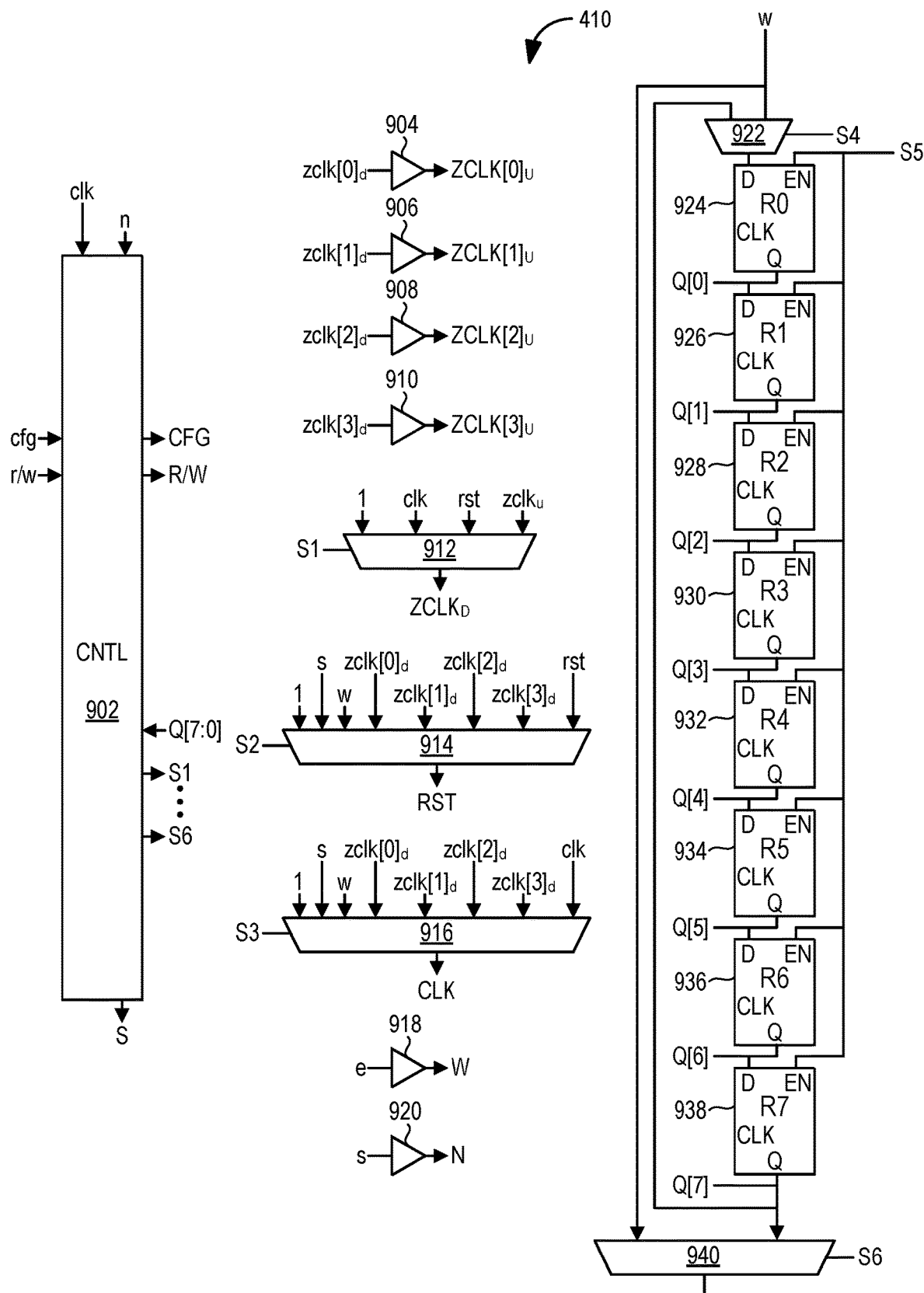
FIG. 9 is a circuit schematic of a z-direction clock (ZCK) tile of a PCM region according to some examples.

FIG. 9 is a circuit schematic of a ZCK tile 410 according to some examples. The ZCK tile 410 has various input and output nodes that are also depicted in FIG. 4 and described below. The ZCK tile 410 includes control logic 902, buffers 904, 906, 908, 910, 918, 920, multiplexers 912, 914, 916, 922, 940, and flip-flops R0-R7 924, 926, 928, 930, 932, 934, 936, 938.

The ZCK tile 410 has (i) a west input node w on which the ZCK tile 410 receives a west input signal w, (ii) a configuration input node cfg on which the ZCK tile 410 receives a configuration input signal cfg, (iii) a read/write input node r/w on which the ZCK tile 410 receives a read/write input signal r/w, and (iv) a west output node W on which the ZCK tile 410 transmits a west output signal W, where each of the input and output signals w, cfg, r/w, W are received from or transmitted to a neighboring tile (e.g., a CCF tile 404, another ZCK tile 410, or a ZRT tile 408) west of the ZCK tile 410.

The ZCK tile 410 has (i) a north output node N on which the ZCK tile 410 transmits a north output signal N, (ii) a clock input node clk on which the ZCK tile 410 receives a clock input signal clk, (iii) a reset input node rst on which the ZCK tile 410 receives a reset input signal rst, and (iv) a north input node n on which the ZCK tile 410 receives a north input signal n, where each of the input and output signals N, clk, rst, n are received from or transmitted to a neighboring tile (e.g., a RCF tile 406 or PCM tile 308) north of the ZCK tile 410.

The ZCK tile 410 has (i) an east output node E on which the ZCK tile 410 transmits an east output signal E, (ii) a configuration output node CFG on which the ZCK tile 410 transmits a configuration output signal CFG, (iii) a read/write output node R/W on which the ZCK tile 410 transmits a read/write output signal R/W, and (iv) an east input node e on which the ZCK tile 410 receives an east input signal e, where each of the output and input signals E, CFG, R/W, e are transmitted to or received from a neighboring tile (e.g., a ZRT tile 408, another ZCK tile 410, or a CCF tile 404) east of the ZCK tile 410.

The ZCK tile 410 has (i) a south input node s on which the ZCK tile 410 receives a south input signal s, (ii) a clock output node CLK on which the ZCK tile 410 transmits a clock output signal CLK, (iii) a reset output node RST on which the ZCK tile 410 transmits a reset output signal RST, and (iv) a south output node S on which the ZCK tile 410 transmits a south output signal S, where each of the input and output signals s, CLK, RST, S are received from or transmitted to a neighboring tile (e.g., a PCM tile 308) south of the ZCK tile 410.

The ZCK tile 410 has (i) down clock input nodes $zclk[0]_d$, $zclk[1]_d$, $zclk[2]_d$, $zclk[3]_d$ on which the ZCK tile 410 receives respective down clock input signals $zclk[0]_d$, $zclk[1]_d$, $zclk[2]_d$, $zclk[3]_d$ and (ii) a down clock output node $ZCLK_D$ on which the ZCK tile 410 transmits a down clock output signal $ZCLK_D$, where each of the input and output signals $zclk[3:0]_d$, $ZCLK_D$ are received from or transmitted to a neighboring tile (e.g., another ZCK tile 410) down from the ZCK tile 410 in a neighboring die.

The ZCK tile 410 has (i) an up clock input node $zclk_u$ on which the ZCK tile 410 receives an up clock input signal $zclk_u$ and (ii) up clock output nodes $ZCLK[0]_U$, $ZCLK[1]_U$, $ZCLK[2]_U$, $ZCLK[3]_U$ on which the ZCK tile 410 transmits respective up clock output signals $ZCLK[0]_U$, $ZCLK[1]_U$, $ZCLK[2]_U$, $ZCLK[3]_U$, where each of the input and output signals $zclk_u$, $ZCLK[3:0]_U$ are received from or transmitted to a neighboring tile (e.g., another ZCK tile 410) up from the ZCK tile 410 in a neighboring die.

The control logic 902 has respective input nodes connected to the clock input node clk, north input node n, configuration input node cfg, and read/write input node r/w. The control logic 902 receives the clock input signal clk, north input signal n, configuration input signal cfg, and read/write input signal r/w, via the clock input node clk, the north input node n, configuration input node cfg, and read/write input node r/w, respectively. The control logic 902 further has respective output nodes connected to the south output node S, configuration output node CFG, and read/write output node R/W. The control logic 902 transmits the south output signal S, configuration output signal CFG, and read/write output signal R/W, via the south output node S, configuration output node CFG, and read/write output node R/W, respectively. The signals input and output from the control logic 902 can be buffered in some examples.

The control logic 902 further has respective output nodes connected to internal control nodes S1-S6, and has respective input nodes connected to data bit nodes Q[7:0]. Respective signals output from the control logic 902 on the internal control nodes S1-S6 control respective multiplexers 912-916, 922, 940 and enable the flip-flops R0-R7 924-938, as described below. The clock input signal clk is further transmitted from the control logic 902 to clock input nodes CLK of the flip-flops R0-R7 924-938, although this is not specifically illustrated. The clock input signal clk is used to trigger the flip-flops R0-R7 924-938. Data on data bit nodes Q[7:0] is transmitted from respective data output nodes Q of the flip-flops R0-R7 924-938, as described below, and may be configuration data.

The down clock input nodes $zclk[0]_d$, $zclk[1]_d$, $zclk[2]_d$, $zclk[3]_d$ are connected to respective input nodes of the buffers 904-910, and respective output nodes of the buffers 904-910 are connected to the up clock output nodes $ZCLK[0]_U$, $ZCLK[1]_U$, $ZCLK[2]_U$, $ZCLK[3]_U$. In this configuration, down clock input signals $zclk[0]_d$, $zclk[1]_d$, $zclk[2]_d$, $zclk[3]_d$ are output as up clock output signals $ZCLK[0]_U$, $ZCLK[1]_U$, $ZCLK[2]_U$, $ZCLK[3]_U$.

A logical "1", the clock input node clk, the reset input node rst, and the up clock input node $zclk_u$ are connected to respective input nodes of the multiplexer 912. The multiplexer 912 selectively outputs a signal from one of the logical "1", clock input node clk, reset input node rst, and up clock input node $zclk_u$ to an output node of the multiplexer 912, which is connected to the down clock output node $ZCLK_D$, based on the internal control signal S1 from the control logic 902. In some examples, the multiplexer 912 outputs the up clock input signal $zclk_u$ on the up clock input node $zclk_u$ as the down clock output signal $ZCLK_D$ on the down clock output node $ZCLK_D$ when the configuration input signal cfg is asserted, and outputs any of the signals on the logical "1", clock input node clk, reset input node rst, and up clock input node $zclk_u$ as the down clock output signal $ZCLK_D$ on the down clock output node $ZCLK_D$ when the configuration input signal cfg is not asserted and based on any of the data bits Q[7:0] (e.g., data bits Q[7:6]).

A logical "1", the south input node s, west input node w, down clock input nodes $zclk[3:0]_d$, and reset input node rst are connected to respective input nodes of the multiplexer 914. The multiplexer 914 selectively outputs a signal from one of the logical "1", south input node s, west input node w, down clock input nodes $zclk[3:0]_d$, and reset input node rst to an output node of the multiplexer 914, which is connected to the reset output node RST, based on the internal control signal S2 from the control logic 902. In some examples, the multiplexer 914 outputs the reset input signal rst on the reset input node rst as the reset output signal RST on the reset output node RST when the configuration input signal cfg is asserted, and outputs any of the signals on the logical "1", south input node s, west input node w, down clock input nodes $zclk[3:0]_d$, and reset input node rst as the reset output signal RST on the reset output node RST when the configuration input signal cfg is not asserted and based on any of the data bits Q[7:0] (e.g., data bits Q[5:3]).

A logical "1", the south input node s, west input node w, down clock input nodes $zclk[3:0]_d$, and clock input node clk are connected to respective input nodes of the multiplexer 916. The multiplexer 916 selectively outputs a signal from one of the logical "1", south input node s, west input node w, down clock input nodes $zclk[3:0]_d$, and clock input node clk to an output node of the multiplexer 916, which is connected to the clock output node CLK, based on the internal control signal S3 from the control logic 902. In some examples, the multiplexer 916 outputs the clock input signal clk on the clock input node clk as the clock output signal CLK on the clock output node CLK when the configuration input signal cfg is asserted, and outputs any of the signals on the logical "1", south input node s, west input node w, down clock input nodes $zclk[3:0]_d$, and clock input node clk as the clock output signal CLK on the clock output node CLK when the configuration input signal cfg is not asserted and based on any of the data bits Q[7:0] (e.g., data bits Q[2:0]).

The east input node e is connected to an input node of the buffer 918, and an output node of the buffer 918 is connected to the west output node W. In this configuration, the east input signal e is output as the west output signal W. The south input node s is connected to an input node of the buffer 918, and an output node of the buffer 918 is connected to the north output node N. In this configuration, the south input signal s is output as the north output signal N.

Tables 8-10 below show example truth tables for the signals output by multiplexers 912-916 based on the configuration input signal cfg and data bits Q[7:0].

TABLE 8

| cfg | Q[7] | Q[6] | 912 ($ZCLK_D$) |
|---|---|---|---|
| 1 | X | X | $zclk_u$ |
| 0 | 0 | 0 | $zclk_u$ |
| 0 | 0 | 1 | clk |
| 0 | 1 | 0 | rst |
| 0 | 1 | 1 | 1 |

TABLE 9

| cfg | Q[5] | Q[4] | Q[3] | 914 (RST) |
|---|---|---|---|---|
| 1 | X | X | X | rst |
| 0 | 0 | 0 | 0 | rst |
| 0 | 0 | 0 | 1 | s |
| 0 | 0 | 1 | 0 | w |
| 0 | 0 | 1 | 1 | 1 |
| 0 | 1 | 0 | 0 | $zclk[0]_d$ |
| 0 | 1 | 0 | 1 | $zclk[1]_d$ |
| 0 | 1 | 1 | 0 | $zclk[2]_d$ |
| 0 | 1 | 1 | 1 | $zclk[3]_d$ |

TABLE 10

| cfg | Q[2] | Q[1] | Q[0] | 916 (CLK) |
|---|---|---|---|---|
| 1 | X | X | X | clk |
| 0 | 0 | 0 | 0 | clk |
| 0 | 0 | 0 | 1 | s |
| 0 | 0 | 1 | 0 | w |
| 0 | 0 | 1 | 1 | 1 |
| 0 | 1 | 0 | 0 | $zclk[0]_d$ |
| 0 | 1 | 0 | 1 | $zclk[1]_d$ |

TABLE 10-continued

| cfg | Q[2] | Q[1] | Q[0] | 916 (CLK) |
|---|---|---|---|---|
| 0 | 1 | 1 | 0 | zclk[2]$_d$ |
| 0 | 1 | 1 | 1 | zclk[3]$_d$ |

The flip-flops R0-R7 924-938 form a CSR between the multiplexers 922, 940. As illustrated, the flip-flops R0-R7 924-938 are enable D flip-flops. The west input node w is connected to an input node of the multiplexer 922 and an input node of the multiplexer 940. Another input node of the multiplexer 922 is connected to a data output node Q of the flip-flop R7 938 as feedback. An output node of the multiplexer 922 is connected to a data input node D of the flip-flop R0 924. A data output node Q of the flip-flop R0 924 is connected to a data input node D of the flip-flop R1 926 and is a data bit node Q[0]. A data output node Q of the flip-flop R1 926 is connected to a data input node D of the flip-flop R2 928 and is a data bit node Q[1]. A data output node Q of the flip-flop R2 928 is connected to a data input node D of the flip-flop R3 930 and is a data bit node Q[2]. A data output node Q of the flip-flop R3 930 is connected to a data input node D of the flip-flop R4 932 and is a data bit node Q[3]. A data output node Q of the flip-flop R4 932 is connected to a data input node D of the flip-flop R5 934 and is a data bit node Q[4]. A data output node Q of the flip-flop R5 934 is connected to a data input node D of the flip-flop R6 936 and is a data bit node Q[5]. A data output node Q of the flip-flop R6 936 is connected to a data input node D of the flip-flop R7 938 and is a data bit node Q[6]. The data output node Q of the flip-flop R7 938 is connected to another input node of the multiplexer 940 and to the input node of the multiplexer 922 (as feedback), and is a data bit node Q[7]. Internal control node S5 is connected to enable input nodes EN of the flip-flops R0-R7 924-938.

The multiplexer 922 selectively outputs a signal from one of the west input node w and data bit node Q[7] to an output node of the multiplexer 922 based on the internal control signal S4 from the control logic 902. In some examples, the multiplexer 922 outputs the west input signal w on the west input node w to the data input node D of the flip-flop R0 924 when the configuration input signal cfg is asserted and the read/write input signal r/w is not asserted, and otherwise, outputs the data bit Q[7] on the data bit node Q[7] to the data input node D of the flip-flop R0 924.

The internal control signal S5 is asserted, and hence, the flip-flops R0-R7 924-938 are enabled, when both the configuration input signal cfg and the north input signal n are asserted; otherwise, the internal control signal S5 is not asserted.

The multiplexer 940 selectively outputs a signal from one of the data bit node Q[7] and the west input node w to an output node of the multiplexer 940, which is connected to the east output node E, based on the internal control signal S6 from the control logic 902. In some examples, the multiplexer 940 outputs the data bit Q[7] on the data bit node Q[7] as the east output signal E on the east output node E when the configuration input signal cfg, the read/write input signal r/w, and north input signal n are asserted, and otherwise, outputs the west input signal w as the east output signal E on the east output node E.

Table 11 below shows an example truth table for the signals output by multiplexers 922, 940 and the internal control signal S5 based on the input signals cfg, n, r/w.

TABLE 11

| cfg | n | r/w | 922 (D R0) | S5 (EN) | 940 (E) |
|---|---|---|---|---|---|
| 0 | X | X | X | 0 | w |
| 1 | 0 | 0 | X | 0 | w |
| 1 | 0 | 1 | X | 0 | w |
| 1 | 1 | 0 | w | 1 | w |
| 1 | 1 | 1 | Q[7] | 1 | Q[7] |

It should be noted that when the internal control signal S5 is not asserted (e.g., logical "0"), the flip-flops R0-R7 924-938 are not enabled and retain their respective data states (e.g., the data state of the CSR does not change). As shown in Table 11, when the configuration input signal cfg is not asserted, the internal control signal S5 is not asserted, and the signal output by the multiplexer 940 (to the east output node E) is the west input signal w. Accordingly, the CSR retains its state, e.g., in which it retains configuration data, and the west input signal w is passed as the east output signal E.

When the configuration input signal cfg is asserted (e.g., logical "1") and the north input signal n is not asserted, the internal control signal S5 is not asserted, and the signal output by the multiplexer 940 (to the east output node E) is the west input signal w. Accordingly, the CSR retains its state, and the west input signal w is passed as the east output signal E.

When the configuration input signal cfg and the north input signal n are asserted, the internal control signal S5 is asserted, and data propagates through the CSR based on the clock input signal clk triggering the flip-flops R0-R7 924-938. Hence, the north input signal n can act as an enable signal. In this circumstance, the signals output by the multiplexer 922 (as input to the CSR) and multiplexer 940 (to the east output node E) is the west input signal w when the read/write input signal r/w is not asserted and is the data bit Q[7] when the read/write input signal r/w is asserted. Accordingly, when the read/write input signal r/w is not asserted, data from the west input signal w is input into and propagates through the CSR, and is also passed as the east output signal E. This can write data from the west input signal w to the CSR. When the read/write input signal r/w is asserted, data from the CSR is fed back into and propagates through the CSR, and is also output as the east output signal E. This can permit reading data from the CSR. In the illustrated example with eight flip-flops, the CSR can be written or read using eight clock cycles. In a read operation in the illustrated example, the feedback of the data of the CSR can permit the CSR to return to its state preceding the reading after eight clock cycles.

Figure 10:
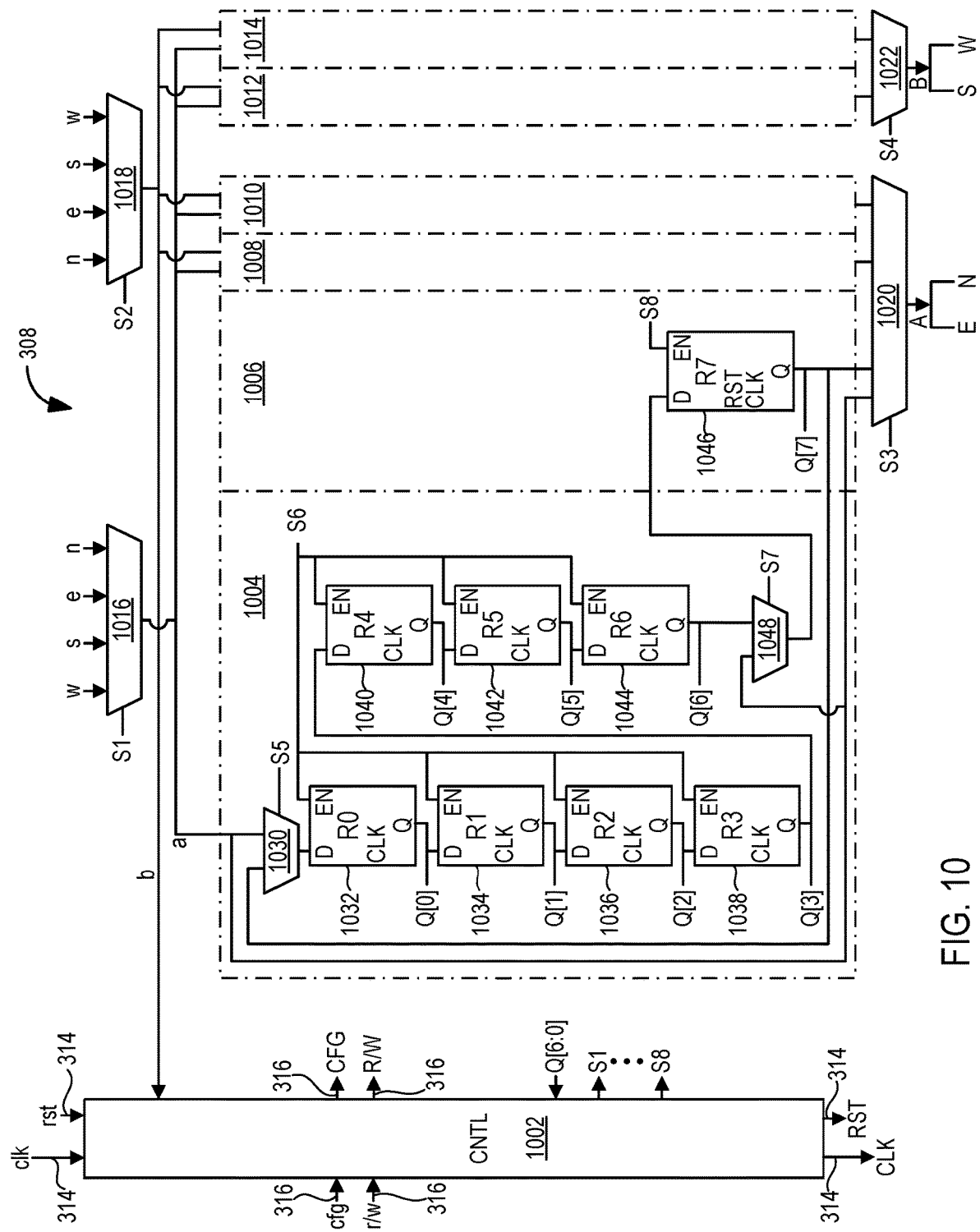
FIG. 10 is a circuit schematic of a PCM tile of a PCM region according to some examples.

FIG. 10 is a circuit schematic of a PCM tile 308 according to some examples. The PCM tile 308 has various input and output nodes that are also depicted in FIG. 4 and described below. The PCM tile 308 may have a more complex circuit than illustrated, e.g., to obtain increased efficiency of area usage on the die. The PCM tile 308 includes control logic 1002, register blocks 1004, 1006, combinational function blocks 1008, 1012, routing blocks 1010, 1014, and multiplexers 1016, 1018, 1020, 1022.

The PCM tile 308 has (i) a west input node w on which the PCM tile 308 receives a west input signal w, (ii) a configuration input node cfg on which the PCM tile 308 receives a configuration input signal cfg, (iii) a read/write input node r/w on which the PCM tile 308 receives a read/write input signal r/w, and (iv) a west output node W on which the PCM tile 308 transmits a west output signal W, where each of the input and output signals w, cfg, r/w, W are received from or transmitted to a neighboring tile (e.g., a CCF tile 404, a ZRT tile 408, or another PCM tile 308) west of the PCM tile 308.

The PCM tile 308 has (i) a north output node N on which the PCM tile 308 transmits a north output signal N, (ii) a clock input node clk on which the PCM tile 308 receives a clock input signal clk, (iii) a reset input node rst on which the PCM tile 308 receives a reset input signal rst, and (iv) a north input node n on which the PCM tile 308 receives a north input signal n, where each of the input and output signals N, clk, rst, n are received from or transmitted to a neighboring tile (e.g., a ZCK tile 410, another PCM tile 308, or a RCF tile 406) north of the PCM tile 308.

The PCM tile 308 has (i) an east output node E on which the PCM tile 308 transmits an east output signal E, (ii) a configuration output node CFG on which the PCM tile 308 transmits a configuration output signal CFG, (iii) a read/write output node R/W on which the PCM tile 308 transmits a read/write output signal R/W, and (iv) an east input node e on which the PCM tile 308 receives an east input signal e, where each of the output and input signals E, CFG, R/W, e are transmitted to or received from a neighboring tile (e.g., a CCF tile 404, a ZRT tile 408, or another PCM tile 308) east of the PCM tile 308.

The PCM tile 308 has (i) a south input node s on which the PCM tile 308 receives a south input signal s, (ii) a clock output node CLK on which the PCM tile 308 transmits a clock output signal CLK, (iii) a reset output node RST on which the PCM tile 308 transmits a reset output signal RST, and (iv) a south output node S on which the PCM tile 308 transmits a south output signal S, where each of the input and output signals s, CLK, RST, S are received from or transmitted to a neighboring tile (e.g., a RCF tile 406, another PCM tile 308, or a ZCK tile 410) south of the PCM tile 308.

The control logic 1002 has respective input nodes connected to the clock input node clk and the reset input node rst (e.g., to north-south global lines 314) and connected to the configuration input node cfg and the read/write input node r/w (e.g., to east-west global lines 316). For example, the control logic 1002 receives the clock input signal clk and the reset input signal rst via the north-south global lines 314, and receives the configuration input signal cfg and read/write input signal r/w via the east-west global lines 316. The control logic 1002 further has respective output nodes connected to the clock output node CLK and the reset output node RST (e.g., to north-south global lines 314) and connected to the configuration output node CFG and the read/write output node R/W (e.g., to east-west global lines 316). For example, the control logic 1002 transmits the clock output signal CLK and the reset output signal RST via the north-south global lines 314, and transmits the configuration output signal CFG and read/write output signal R/W via the east-west global lines 316. The control logic 1002 can include buffers or drivers that are capable of receiving the clock input signal clk, the reset input signal rst, the configuration input signal cfg, and the read/write input signal r/w and responsively driving the clock output signal CLK, the reset output signal RST, the configuration output signal CFG, and the read/write output signal R/W, respectively.

The control logic 1002 further has respective output nodes connected to internal control nodes S1-S8, and has respective input nodes connected to data bit nodes Q[6:0]. Respective signals output from the control logic 1002 on the internal control nodes S1-S8 control, among others, respective multiplexers 1016-1022, as is described below. The clock input signal clk is further transmitted from the control logic 1002 to clock input nodes CLK of the flip-flops R0-R7 1032-1046, although this is not specifically illustrated. The clock input signal clk is used to trigger the flip-flops R0-R7 1032-1046. The reset input signal rst is further transmitted from the control logic 1002 to a reset input node RST of the flip-flop R7 1046, although this is not specifically illustrated. The reset input signal rst is used to reset the data state of the flip-flop R7 1046. Data on data bit nodes Q[6:0] is transmitted from respective data output nodes Q of the flip-flops R0-R6 1032-1044, as described below, and may be configuration data.

Additionally, the control logic 1002 has control output nodes connected to control input nodes of the combinational function blocks 1008, 1012 and routing blocks 1010, 1014, although not specifically illustrated. Signals on the control output nodes of the control logic 1002 that are connected to input nodes of the blocks 1008-1014 can control a configuration of each of the blocks 1008-1014. For example, the combinational function blocks 1008, 1012 can be configured by signals on the control output nodes of the control logic 1002 to be any combinational logic function, and the routing blocks 1010, 1014 can be configured by signals on the control output nodes of the control logic 1002 to route any signal from an input node to an output node of the respective routing block 1010, 1014.

The west input node w, the south input node s, the east input node e, and the north input node n are connected to respective input nodes of the multiplexer 1016. An output node of the multiplexer 1016 is connected to a first selected input node a, which is further connected to respective input nodes of the register block 1004, combinational function blocks 1008, 1012, and routing blocks 1010, 1014. The output node of the multiplexer 1016 transmits a first selected input signal a on the first selected input node a.

The north input node n, the east input node e, the south input node s, and the west input node w are connected to respective input nodes of the multiplexer 1018. An output node of the multiplexer 1018 is connected to a second selected input node b, which is further connected to respective input nodes of the control logic 1002, the register block 1004, combinational function blocks 1008, 1012, and routing blocks 1010, 1014. The output node of the multiplexer 1018 transmits a second selected input signal b on the second selected input node b.

Respective output nodes of the register blocks 1004, 1006, combinational function block 1008, and routing block 1010 are connected to respective input nodes of the multiplexer 1020. An output node of the multiplexer 1020 is a first selected output node A, which is connected to the east output node E and the north output node N. The output node of the multiplexer 1020 transmits a first selected output signal A on the first selected output node A.

Respective output nodes of the combinational function block 1012 and routing block 1014 are connected to respective input nodes of the multiplexer 1022. An output node of the multiplexer 1022 is a second selected output node B, which is connected to the south output node S and the west output node W. The output node of the multiplexer 1020 transmits a second selected output signal B on the second selected output node B.

When the configuration input signal cfg is asserted (e.g., is a logical "1"), the multiplexers 1016, 1018 default to output the west input signal w and the north input signal n as the first selected input signal a and the second selected input signal b, respectively. When the configuration input signal cfg is not asserted (e.g., is a logical "0"), the multiplexers 1016, 1018 are capable of outputting any of the input signals based on the configuration data of data bits Q[7:0] (e.g., data bits Q[3:0]).

Tables 12 and 13 below show example truth tables for the signals output by multiplexers 1016, 1018 based on the configuration input signal cfg and data bits Q[7:0] (e.g., data bits Q[3:0]).

TABLE 12

| cfg | Q[1] | Q[0] | 1016 (a) |
|---|---|---|---|
| 1 | X | X | w |
| 0 | 0 | 0 | w |
| 0 | 0 | 1 | s |
| 0 | 1 | 0 | e |
| 0 | 1 | 1 | n |

TABLE 13

| cfg | Q[3] | Q[2] | 1018 (b) |
|---|---|---|---|
| 1 | X | X | n |
| 0 | 0 | 0 | n |
| 0 | 0 | 1 | e |
| 0 | 1 | 0 | s |
| 0 | 1 | 1 | w |

The register block 1004 includes multiplexers 1030, 1048 and flip-flops R0-R6 1032-1044. The register block 1006 includes flip-flop R7 1046. As illustrated, the flip-flops R0-R6 1032-1044 are enable D flip-flops, and the flip-flop R7 1046 is an enable D flip-flop with reset. The register blocks 1004, 1006 can be implemented using CMOS standard cells, for example. The flip-flops R0-R7 1032-1046 can form a CSR.

The input node of the register block 1004 (e.g., connected to the first selected input node a) is connected to respective input nodes of multiplexers 1030, 1048, 1020. Another input node of the multiplexer 1030 is connected to a data output node Q of the flip-flop R7 1046 as feedback. An output node of the multiplexer 1030 is connected to a data input node D of the flip-flop R0 1032. A data output node Q of the flip-flop R0 1032 is connected to a data input node D of the flip-flop R1 1034 and is a data bit node Q[0]. A data output node Q of the flip-flop R1 1034 is connected to a data input node D of the flip-flop R2 1036 and is a data bit node Q[1]. A data output node Q of the flip-flop R2 1036 is connected to a data input node D of the flip-flop R3 1038 and is a data bit node Q[2]. A data output node Q of the flip-flop R3 1038 is connected to a data input node D of the flip-flop R4 1040 and is a data bit node Q[3]. A data output node Q of the flip-flop R4 1040 is connected to a data input node D of the flip-flop R5 1042 and is a data bit node Q[4]. A data output node Q of the flip-flop R5 1042 is connected to a data input node D of the flip-flop R6 1044 and is a data bit node Q[5]. A data output node Q of the flip-flop R6 1044 is connected to another input node of the multiplexer 1048 and is a data bit node Q[6]. An output node of the multiplexer 1048 is connected to a data input node D of the flip-flop R7 1046. The data output node Q of the flip-flop R7 1046 is also connected to an input node of the multiplexer 1020 and is a data bit node Q[7].

The PCM tile 308 can be operated in a plurality of modes. Generally, the modes can be global modes or functional modes. Global modes, in the context of the illustrated example, are generally modes that are controlled by and/or entered into in response to, at least in part, one or more global signals. Any configuration data stored on data bit nodes Q[6:0] of the flip-flops R0-R6 1032-1044 can be overridden by the one or more global signals. Functional modes, in the context of the illustrated example, are generally modes that are controlled by and/or entered into in response to, at least in part, configuration data stored on data bit nodes Q[6:0] of the flip-flops R0-R6 1032-1044 and/or configuration data stored in another tile.

Global modes can include a configuration mode, a scan mode, and/or a redundancy mode. Functional modes can include various combinational logic modes, routing modes, a 1-bit memory mode, and/or an 8-bit memory mode. Some routing modes can include the routing blocks 1010, 1014 being configured in a through-wire mode, a cross-wire mode, a transmit-a-wire mode, and/or a transmit-b-wire mode. Some combinational logic modes can include the combinational function blocks 1008, 1012 being configured in a switched multiplexer mode, a decode function, a decode-invert function, an OR function, a half adder function, a functional D-flip flop ("FDFF") mode, a NOR function, and/or an invert function. Additional details and examples are described below.

Table 14 below shows an example truth table for the signals output by multiplexers 1020, 1022, 1030, 1048 and internal control signals S6, S8 based on the configuration input signal cfg, the read/write input signal r/w, and the second selected input signal b (e.g., the north input signal n in this instance) for a configuration mode and a scan mode.

TABLE 14

| | cfg | r/w | b(n) | 1030 (D R0) | S6 (EN) | 1048 (D R7) | S8 (EN) | 1020 (A) | 1022 (B) |
|---|---|---|---|---|---|---|---|---|---|
| Config./Scan (disabled) | 1 | X | 0 | X | 0 | X | 0 | a(w) | b(n) |
| Config. (enabled) | 1 | 0 | 1 | a(w) | 1 | Q[6] | 1 | a(w) | b(n) |
| Scan (enabled) | 1 | 1 | 1 | Q[7] | 1 | Q[6] | 1 | Q[7] | b(n) |

In a configuration or scan mode, the flip-flops R0-R7 1032-1046 can form an 8-bit CSR in the illustrated example. The CSR can have a different size with a different number of flip-flops. Configuration data can be written to or read from the CSR in a configuration or scan mode. In a configuration or scan mode for a PCM tile 308, the configuration input signal cfg is asserted (e.g., is a logical "1"). In the configuration mode, the assertion of the configuration input signal cfg overrides any configuration data stored on data bit nodes Q[6:0] of in the CSR. As described previously, when the configuration input signal cfg is asserted, the north input signal n is passed as the second selected input signal b, and hence, the second selected input signal b is indicated as "b(n)" in Table 14. The configuration input signal cfg and read/write input signal r/w, in a configuration or scan mode, can each be a global signal routed from, e.g., a base die 202 via a PL die 204 and a ZCF tile 402 and one or more CCF tiles 404 and/or ZRT tiles 408 on the die on which the PCM tile 308 to be configured is disposed. Further, the signal that is propagated through PCM tiles 308 as the second selected input signal b can originate from, e.g., the base die 202 and be routed via a PL die 204 and an RCF tile 406, and possibly, additionally via another PCM tile 308, on which the PCM tile 308 to be configured is disposed.

The control logic 1002 defaults the routing block 1014 to pass the second selected input signal b (e.g., the north input signal n) as the output signal of the routing block 1014, and the combinational function blocks 1008, 1012 and routing block 1010 are configured in a "do not care" or "X" state. Additionally, the control logic 1002 defaults the internal control signal S4 such that the multiplexer 1022 outputs the signal output from the routing block 1014 as the second selected output signal B.

When the configuration input signal cfg is asserted (e.g., logical "1") and the north input signal n, via the second selected input node b, is not asserted (e.g., logical "0"), the internal control signals S6, S8 are not asserted, and when the internal control signals S6, S8 are not asserted, the flip-flops R0-R7 1032-1046 are not enabled and retain their respective data states (e.g., the data state of the CSR does not change). The mode may therefore be a configuration or scan disabled mode. The signal output by the multiplexer 1020 (to the second selected output signal A) is the first selected input signal a, which is the west input signal w as shown by Table 12. Accordingly, the CSR retains its state, and the west input signal w can be passed as the first selected output signal A.

When the configuration input signal cfg and the north input signal n, via the second selected input node b, are asserted (e.g., logical "1"), the internal control signals S6, S8 are asserted, and the multiplexer 1048 outputs the data bit Q[6] to the data input D of the flip-flop R7 1046. Data propagates through the CSR based on the clock input signal clk triggering the flip-flops R0-R7 1032-1046 and the assertion of the internal control signals S6, S8. Hence, the second selected input signal b (defaulted to the north input signal n) can act as an enable signal. In this circumstance, the signals output by the multiplexer 1030 (as input to the CSR) and multiplexer 1020 (to the first selected output node A) is the west input signal w when the read/write input signal r/w is not asserted (in a configuration enabled mode) and is the data bit Q[7] when the read/write input signal r/w is asserted (in a scan enabled mode). Accordingly, when the read/write input signal r/w is not asserted, data from the west input signal w is input into and propagates through the CSR, and is also passed as the first selected output signal A. This can write data from the west input signal w to the CSR. When the read/write input signal r/w is asserted, data from the CSR is fed back into and propagates through the CSR, and is also output as the first selected output signal A. This can permit reading data from the CSR. In the illustrated example with eight flip-flops, the CSR can be written or read using eight clock cycles. In a scan enabled operation in the illustrated example, the feedback of the data of the CSR can permit the CSR to return to its state preceding the reading after eight clock cycles.

In an 8-bit memory mode, the register blocks 1004, 1006 can implement a memory block. As illustrated, the memory block can be an 8-bit memory, although in other configurations, more or fewer flip-flops can be implemented to create a memory block (and CSR) of a different size. The 8-bit memory mode can operate like the configuration mode described above. The 8-bit memory mode can implement the configuration input signal cfg, read/write input signal r/w, and second selected input signal b to control the read and write operations like described above. In such examples, the configuration input signal cfg can be asserted from a ZRT tile 408 based on configuration data stored in that ZRT tile 408 (e.g., causing multiplexer 805 to output the logical "1" as the configuration output signal CFG), and the read/write input signal r/w can be, e.g., user signals routed via that ZRT tile 408 based on configuration data stored in that ZRT tile 408 (e.g., causing multiplexer 806 to output the west input signal w as the read/write output signal R/W). The signal routed to the north input signal n of the PCM tile 308, which becomes the second selected input signal b, can be routed from any source. In other examples, an 8-bit memory mode can implement one or more global signals that permit the control logic 1002 to distinguish between the 8-bit memory mode and the configuration mode and that otherwise control the read and write operations like the configuration input signal cfg as described above. In some examples, some PCM tiles 308 can operate in an 8-bit memory mode while other PCM tiles 308 can operate as a decoder and/or route signals to or from the PCM tiles 308 operating in an 8-bit memory mode. Additional detail of PCM tiles 308 operating in an 8-bit memory mode with a decoder is described below.

As indicated above, an array 306 can include an additional row or column for redundancy. When such a redundant row or column is included, a redundancy mode can be implemented. In some examples, the redundancy mode can be controlled by an additional redundancy signal transmitted along a north-south global line 314 when the redundancy is along a column or along an east-west global line 316 when the redundancy is along a row. In such examples, assertion of a redundancy signal can override any configuration data in the CSR.

When the redundancy is implemented as an additional column, a faulty column or, if no faulty column exists, any column can be configured in a redundancy mode. In that scenario, each PCM tile 308 of the column that is configured in a redundancy mode has control logic 1002 that controls multiplexers 1016-1022 and routing blocks 1010, 1014 to pass the west input signal w to the east output signal E (e.g., through multiplexer 1016, routing block 1010, and multiplexer 1020) and to pass the east input signal e to the west output signal W (e.g., through multiplexer 1018, routing block 1014, and multiplexer 1022). When the redundancy is implemented as an additional row, a faulty row or, if no faulty row exists, any row can be configured in a redundancy mode. In that scenario, each PCM tile 308 of the row that is configured in a redundancy mode has control logic 1002 that controls multiplexers 1016-1022 and routing blocks 1010, 1014 to pass the south input signal s to the north output signal N (e.g., through multiplexer 1016, routing block 1010, and multiplexer 1020) and to pass the north input signal n to the south output signal S (e.g., through multiplexer 1018, routing block 1014, and multiplexer 1022). Hence, when a row or column is in a redundancy mode, the row or column is bypassed and disabled.

After a configuration mode writes configuration data to the flip-flops R0-R6 1032-1044, the control logic 1002 configures the blocks 1006-1014 in a functional mode and controls the internal control signals S1-S4 to select various signals as selected input signals a, b and selected output signals A, B according to the data bits Q[6:0] (or some subset thereof). Examples for controlling the multiplexers 1016, 1018 is described above. In any functional mode, the configuration input signal cfg is not asserted. With the configuration input signal cfg not being asserted, the control logic 1002 controls the internal control signal S6 to not be asserted, such that the flip-flops R0-R6 1032-1044 are not enabled, and the flip-flops R0-R6 1032-1044 do not change states. Hence, the flip-flops R0-R6 1032-1044 can maintain the data bits Q[6:0] for the given configuration.

Table 15 below shows an example truth table for the signals output by multiplexers 1020, 1022, 1030, 1048 and internal control signals S6, S8 based on the configuration input signal cfg, the read/write input signal r/w, the second selected input signal b, and configuration data of data bits Q[7:0] (e.g., data bits Q[6:4]) for a 1-bit memory mode.

TABLE 15

|  | cfg | r/w | b | Q[6] | Q[5] | Q[4] | 1030 (D R0) | S6 (EN) | 1048 (D R7) | S8 (EN) | 1020 (A) | 1022 (B) |
|---|---|---|---|---|---|---|---|---|---|---|---|---|
| 1B Mem Disable | 0 | X | 0 | 0 | 0 | 0 | X | 0 | X | 0 | a | b |
| 1B Mem Write | 0 | 0 | 1 | 0 | 0 | 0 | X | 0 | a | 1 | a | b |
| 1B Mem Read | 0 | 1 | 1 | 0 | 0 | 0 | X | 0 | X | 0 | Q[7] | b |

In a 1-bit memory mode, the flip-flop R7 1046 can form a 1-bit memory in the illustrated example. The 1-bit data can be written to or read from the flip-flop R7 1046 in a 1-bit memory write or read mode. The 1-bit data can be maintained by the flip-flop R7 1046 in a 1-bit memory disabled mode. In the 1-bit memory mode for a PCM tile 308, the configuration input signal cfg is not asserted (e.g., is a logical "0"), and the multiplexers 1016, 1018 are configured according to configuration data bits Q[6:0] (e.g., data bits Q[3:0]) as described above, such as in Tables 12 and 13. In this example, the 1-bit memory mode is indicated by the configuration data bits Q[6:4] being "000".

The control logic 1002 configures the routing block 1014 to pass the second selected input signal b as the output signal of the routing block 1014, and the combinational function blocks 1008, 1012 and routing block 1010 are configured in a "do not care" or "X" state. Additionally, the control logic 1002 configures the internal control signal S4 such that the multiplexer 1022 outputs the signal output from the routing block 1014 as the second selected output signal B.

When the configuration input signal cfg is not asserted (e.g., logical "0") and the configuration data bits Q[6:4] are "000" in this example, the internal control signal S6 is not asserted. Accordingly, the flip-flops R0-R6 1032-1044 retain their states, and the signal output by multiplexer 1030 is a "do not care" or "X" state since that signal does not change the state of the flip-flops R0-R6 1032-1044.

When the configuration input signal cfg is not asserted (e.g., logical "0") and the configuration data bits Q[6:4] are "000" in this example, the internal control signal S8 is asserted based on the read/write input signal r/w and the second selected input signal b. The internal control signal S8 is asserted, and hence, the flip-flop R7 1046 is enabled, when the read/write input signal r/w is not asserted and the second selected input signal b is asserted. When the read/write input signal r/w is not asserted and the second selected input signal b is asserted (and hence, the internal control signal S8 is asserted), the signal output by the multiplexer 1048 is the first selected input signal a, and the flip-flop R7 1046 can be written with data of the first selected input signal a at an appropriate clock pulse applied at the clock input node CLK of the flip-flop R7 1046. When the second selected input signal b is not asserted (e.g., the second selected input signal b is not asserted, or both of the read/write input signal r/w and the second selected input signal b are asserted), the signal output by the multiplexer 1048 is a "do not care" or "X" state since that signal does not change the state of the flip-flop R7 1046. In some examples, the signal output by the multiplexer 1048 is the first selected input signal a regardless of whether the second selected input signal b is asserted. Further, the signal output by the multiplexer 1020 is the first selected input signal a when at least one of the read/write input signal r/w and the second selected input signal b is not asserted, and is the data bit Q[7] when both of the read/write input signal r/w and the second selected input signal b are asserted.

Accordingly, as shown in Table 15, when the configuration input signal cfg and second selected input signal b are not asserted and the configuration data bits Q[6:4] are "000", the PCM tile 308 is in a disabled 1-bit memory mode. Generally, the state of the flip-flop R7 1046 does not change, and the first selected input signal a is output as the first selected output signal A. When (i) the configuration input signal cfg is not asserted, (ii) the configuration data bits Q[6:4] are "000", (iii) the read/write input signal r/w is not asserted, and (iv) the second selected input signal b is asserted, the PCM tile 308 is in a 1-bit memory write mode. Generally, the flip-flop R7 1046 is enabled to change state based on the first selected input signal a, and the first selected input signal a is output as the first selected output signal A. When (i) the configuration input signal cfg is not asserted, (ii) the configuration data bits Q[6:4] are "000", and (iii) the read/write input signal r/w and the second selected input signal b are asserted, the PCM tile 308 is in an 1-bit memory read mode. Generally, the flip-flop R7 1046 is disabled, and hence, retains its state, and the data bit Q[7] is output as the first selected output signal A.

Table 16 below shows an example truth table for the signals output by multiplexers 1020, 1022, 1030, 1048 and internal control signals S6, S8 based on the configuration input signal cfg, read/write input signal r/w, and configuration data of data bits Q[7:0] (e.g., data bits Q[6:4]) for various functional modes implemented, at least in part, by register blocks 1004, 1006.

TABLE 16

|  | cfg | r/w | Q[6] | Q[5] | Q[4] | 1030 (D R0) | S6 (EN) | 1048 (D R7) | S8 (EN) | 1020 (A) | 1022 (B) |
|---|---|---|---|---|---|---|---|---|---|---|---|
| MUX (a, "0") | 0 | 0 | 0 | 0 | 1 | X | 0 | X | 0 | a | b(0) |
| MUX (a, "0") | 0 | 0 | 0 | 0 | 1 | X | 0 | X | 0 | Q[7](0) | b(1) |
| ROM | 0 | 1 | 0 | 0 | 1 | X | 0 | X | 0 | a | b(0) |
| ROM | 0 | 1 | 0 | 0 | 1 | X | 0 | X | 0 | Q[7] | b(1) |
| FDFF | 0 | X | 1 | 1 | 0 | X | 0 | a | b | Q[7] | b |

In a multiplexer or read-only memory (ROM) mode, the PCM tile 308 can be configured to propagate the first selected input signal a or to output the data bit Q[7] of the flip-flop R7 1046. In the multiplexer or ROM mode for a PCM tile 308, the configuration input signal cfg is not asserted (e.g., is a logical "0"), and the multiplexers 1016, 1018 are configured according to configuration data bits Q[6:0] (e.g., data bits Q[3:0]) as described above, such as in Tables 12 and 13. In this example, the multiplexer or ROM mode is indicated by the configuration data bits Q[6:4] being "001". The PCM tile 308 is in the multiplexer mode when the read/write input signal r/w is not asserted, and is in the ROM mode when the read/write input signal r/w is asserted.

The internal control signals S6, S8 are not asserted, and hence, the flip-flops R0-R7 1032-1046 do not change state based on data input on respective data input nodes D of the flip-flops R0-R7 1032-1046. The multiplexers 1030, 1048 are configured in a "do not care" or "X" state since the respective outputs of the multiplexers 1030, 1048 do not cause the flip-flops R0-R7 1032-1046 to change state. In the multiplexer or ROM mode, the multiplexer 1020 outputs data bit Q[7] of the flip-flop R7 1046 or the first selected input signal a based on whether the second selected input signal b is asserted. If the second selected input signal b is not asserted, the multiplexer 1020 outputs the first selected input signal a, and if the second selected input signal b is asserted, the multiplexer 1020 outputs the data bit Q[7] of the flip-flop R7 1046.

In the ROM mode (e.g., when the read/write input signal r/w is asserted), when the second selected input signal b is asserted, the multiplexer 1020 outputs the data bit Q[7] of the flip-flop R7 1046, which can be any stated that was previously written to the flip-flop R7 1046. In the multiplexer mode (e.g., when the read/write input signal r/w is not asserted), the control logic 1002 causes the flip-flop R7 1046 to be reset, and hence, when the second selected input signal b is asserted, the multiplexer 1020 outputs the reset data bit Q[7] (e.g., logical "0") of the flip-flop R7 1046. A control signal output by the control logic 1002 is input to the reset input node RST of the flip-flop R7 1046 and causes the flip-flop R7 1046 to reset to logical "0". Accordingly, in the multiplexer mode (e.g., when both of the configuration input signal cfg and read/write input signal r/w are not asserted and data bits Q[6:4] are "001"), the first selected input signal a is output by the multiplexer 1020 when the second selected input signal b is not asserted, and a logical "0" (to which data bit Q[7] of the flip-flop R7 1046 is reset) is output by the multiplexer 1020 when the second selected input signal b is asserted. Further, in the ROM mode (e.g., when the configuration input signal cfg is not asserted, the read/write input signal r/w is asserted, and data bits Q[6:4] are "001"), the first selected input signal a is output by the multiplexer 1020 when the second selected input signal b is not asserted, and data bit Q[7] of the flip-flop R7 1046 (e.g., whatever state that was previously written to the flip-flop R7 1047) is output by the multiplexer 1020 when the second selected input signal b is asserted.

The control logic 1002 configures the routing block 1014 to pass the second selected input signal b as the output signal of the routing block 1014, and the combinational function blocks 1008, 1012 and routing block 1010 are configured in a "do not care" or "X" state. Additionally, the control logic 1002 configures the internal control signal S4 such that the multiplexer 1022 outputs the signal output from the routing block 1014 as the second selected output signal B.

In a FDFF mode, the flip-flop R7 1046 can be implemented as a functional D-flip-flop, such as for pipelining or synchronous data processing. In the FDFF mode for a PCM tile 308, the configuration signal cfg is not asserted (e.g., is a logical "0"), and the multiplexers 1016, 1018 are configured according to configuration data bits Q[6:0] (e.g., data bits Q[3:0]) as described above, such as in Tables 12 and 13. In this example, the FDFF mode is indicated by the configuration data bits Q[6:4] being "110". The multiplexer 1048 outputs the first selected input signal a to the data input node D of the flip-flop R7 1046, and the internal control signal S8 is asserted or not asserted to enable or disable the flip-flop R7 1046 based on the second selected input signal b. The multiplexer 1020 outputs data bit Q[7] of the flip-flop R7 1046. The control logic 1002 causes the internal control signal S8 to be asserted, and hence, the flip-flop R7 1046 to be enabled, when the second selected input signal b is asserted. In the FDFF mode, the second selected input signal b can enable or disable the flip-flop R7 1046 to change state based on the first selected input signal a, and the data bit Q[7] from the flip-flop R7 1046 is output by the multiplexer 1020.

The control logic 1002 configures the routing block 1014 to pass the second selected input signal b as the output signal of the routing block 1014, and the combinational function blocks 1008, 1012 and routing block 1010 are configured in a "do not care" or "X" state. Additionally, the control logic 1002 configures the internal control signal S4 such that the multiplexer 1022 outputs the signal output from the routing block 1014 as the second selected output signal B. When the configuration input signal cfg is not asserted (e.g., logical "0") and the configuration data bits Q[6:4] are "110" in this example, the internal control signal S6 is not asserted. Accordingly, the flip-flops R0-R6 1032-1044 retain their states, and the signal output by multiplexer 1030 is a "do not care" or "X" state since that signal does not change the state of the flip-flops R0-R6 1032-1044.

Table 17 below shows an example truth table for the signals output by multiplexers 1020, 1022 based on the configuration input signal cfg and configuration data of data bits Q[7:0] (e.g., data bits Q[6:4]) for a various functional modes implemented by any of blocks 1008-1014. Various other functional modes can be implemented by a PCM tile 308. Examples are provided below, and additional and/or different functional modes can be implemented.

TABLE 17

|  | cfg | Q[6] | Q[5] | Q[4] | 1020 (A) | 1022 (B) |
|---|---|---|---|---|---|---|
| Decode | 0 | 0 | 1 | 0 | a | AND($\bar{a}$, b) |
| Decode-Invert | 0 | 0 | 1 | 1 | $\bar{a}$ | AND($\bar{a}$, b) |
| OR | 0 | 1 | 0 | 0 | a | OR(a, b) |
| Half-Adder | 0 | 1 | 0 | 1 | NAND(a, b) | XOR(a, b) |
| Through-Wire | 0 | 1 | 1 | 1 | a | b |

In any of the functional mode in Table 17, the flip-flops R0-R6 1032-1044 maintain their respective states to store configuration data, and the flip-flop R7 1046 is unused. Accordingly, the internal control signals S6, S8 are not asserted such that the flip-flops R0-R7 1032-1046 do not change their states, and the signals output by the multiplexers 1030, 1048 are a "do not care" or "X" state. Hence, the outputs of multiplexers 1030, 1048 and states of internal control signals S6, S8 are not shown in Table 17. In these functional mode for a PCM tile 308, the configuration input signal cfg is not asserted (e.g., is a logical "0"), and the multiplexers 1016, 1018 are configured according to configuration data bits Q[6:0] (e.g., data bits Q[3:0]) as described above, such as in Tables 12 and 13.

As shown in Table 17, a functional mode is a decode mode. In a decode mode, the first selected input signal a is output by the multiplexer 1020 as the first selected output signal A, and an AND operation is performed on an inverted first selected input signal a' and the second selected input signal b with the result being output by the multiplexer 1022 as the second selected output signal B. The control logic 1002 controls the routing block 1010 to pass the first selected input signal a to the output node of the routing block 1010 and further controls the internal control signal S3 to control the multiplexer 1020 to output the first selected input signal a from the output node of the routing block 1010 as the first selected output signal A. The control logic 1002 controls the combinational function block 1012 to implement the AND operation and NOT operation (e.g., for inverting the first selected input signal a) and controls the internal control signal S4 to control the multiplexer 1022 to output the result of the AND operation from the combinational function block 1012 as the second selected output signal B.

Another functional mode in Table 17 is a decode-invert mode. In a decode-invert mode, an inverted first selected input signal a' is output by the multiplexer 1020 as the first selected output signal A, and an AND operation is performed on an inverted first selected input signal a' and the second selected input signal b with the result being output as the second selected output signal B. The control logic 1002 controls the combinational function block 1008 to implement the NOT operation (e.g., for inverting the first selected input signal a) and further controls the internal control signal S3 to control the multiplexer 1020 to output the result of the NOT operation (e.g., an inverted first selected input signal a') from the output node of the combinational function block 1008 as the first selected output signal A. The control logic 1002 controls the combinational function block 1012 to implement the AND operation and NOT operation (e.g., for inverting the first selected input signal a) and controls the internal control signal S4 to control the multiplexer 1022 to output the result of the AND operation from the combinational function block 1012 as the second selected output signal B.

Another functional mode in Table 17 is an OR mode. In an OR mode, the first selected input signal a is output by the multiplexer 1020 as the first selected output signal A, and an OR operation is performed on the first selected input signal a and the second selected input signal b with the result being output by the multiplexer 1022 as the second selected output signal B. The control logic 1002 controls the routing block 1010 to pass the first selected input signal a to the output node of the routing block 1010 and further controls the internal control signal S3 to control the multiplexer 1020 to output the first selected input signal a from the output node of the routing block 1010 as the first selected output signal A. The control logic 1002 controls the combinational function block 1012 to implement the OR operation and controls the internal control signal S4 to control the multiplexer 1022 to output the result of the OR operation from the combinational function block 1012 as the second selected output signal B.

Another functional mode in Table 17 is a half adder mode. In a half adder mode, a NAND operation is performed on the first selected input signal a and the second selected input signal b, and the result is output by the multiplexer 1020 as the first selected output signal A. Additionally, an XOR operation is performed on the first selected input signal a and the second selected input signal b, and the result is output by the multiplexer 1022 as the second selected output signal B. The control logic 1002 controls the combinational function block 1008 to implement the NAND operation and controls the internal control signal S3 to control the multiplexer 1020 to output the result of the NAND operation from the combinational function block 1008 as the first selected output signal A. The control logic 1002 controls the combinational function block 1012 to implement the XOR operation and controls the internal control signal S4 to control the multiplexer 1022 to output the result of the XOR operation from the combinational function block 1012 as the second selected output signal B.

Another functional mode in Table 17 is a through-wire mode. In a through-wire mode, the first selected input signal a is output by the multiplexer 1020 as the first selected output signal A, and the second selected input signal b is output by the multiplexer 1022 as the second selected output signal B. The control logic 1002 controls the routing blocks 1010, 1014 to pass the first selected input signal a and the second selected input signal b, respectively, to respective output nodes of the routing blocks 1010, 1014. The control logic 1002 further controls the internal control signals S3, S4 to control the multiplexers 1020, 1022 to output the first selected input signal a and the second selected input signal b from the output nodes of the routing blocks 1010, 1014 as the first selected output signal A and the second selected output signal B, respectively.

In the foregoing example global modes and functional modes, the signal output by the multiplexer 1020 can be the first selected input signal a, the data bit Q[7] (output from the register block 1006), or a signal resulting from some combinational logic (output from routing block 1010). If a connection between the first selected input node a and an input node of the multiplexer 1020 is implemented via the register block 1004 as illustrated in FIG. 10, the routing block 1010 may be omitted for implementing the example modes described above. In some examples, If the connection between the first selected input node a and the input node of the multiplexer 1020 is not implemented via the register block 1004, the routing block 1010 may implement a connection between the first selected input node a and an input node of the multiplexer 1020 in the example modes described above. In further examples, such connections via the register block 1004 and combinational function block 1008 may be present or configurable, such as when the combinational function block 1008 is further configurable to implement other modes.

Table 18 below shows an example truth table for the signals output by multiplexers 1020, 1022 for additional and/or alternative global or functional modes that may be implemented by any of blocks 1008-1014.

TABLE 18

| Redundancy | 1020 (A) a(w) | 1022 (B) b(e) |
|---|---|---|
| Cross-wire | b | a |
| Transmit-a-wire | a | a |
| Transmit-b-wire | b | b |
| NOR | $\overline{b}$ | $NOR(\overline{a}, b)$ |
| Invert | $\overline{a}$ | $\overline{b}$ |

A global mode can include a redundancy mode, as described above. When redundancy is implemented as an additional column as shown in Table 18, in a redundancy mode, multiplexers 1016-1022 and routing blocks 1010, 1014 are configured to pass the west input signal w to the first selected output signal A (e.g., through multiplexer 1016, routing block 1010, and multiplexer 1020) and to pass the east input signal e to the second selected output signal B (e.g., through multiplexer 1018, routing block 1014, and multiplexer 1022). In other examples, the redundancy can be implemented as an additional row as previously described. In some examples, a redundancy signal can be implemented such that, when the redundancy signal is asserted at a tile, any configuration data stored in that tile is overridden, and that tile defaults to a configuration that propagates signals, such as shown in Table 18. The propagation of signals can be implemented by a minimal amount of hardware resources in the tile.

Another functional mode can be a cross-wire mode. In a cross-wire mode, the second selected input signal b is output as the first selected output signal A, and the first selected input signal a is output as the second selected output signal B. The control logic 1002 controls the routing blocks 1010, 1014 to pass the second selected input signal b and the first selected input signal a, respectively, to respective output nodes of the routing blocks 1010, 1014. The control logic 1002 further controls the internal control signals S3, S4 to control the multiplexers 1020, 1022 to output the second selected input signal b and the first selected input signal a from the output nodes of the routing blocks 1010, 1014 as the first selected output signal A and the second selected output signal B, respectively.

Another functional mode can be a transmit-a-wire mode. In a transmit-a-wire mode, the first selected input signal a is output as the first selected output signal A and as the second selected output signal B. The control logic 1002 controls the routing blocks 1010, 1014 to pass the first selected input signal a to respective output nodes of the routing blocks 1010, 1014. The control logic 1002 further controls the internal control signals S3, S4 to control the multiplexers 1020, 1022 to output the first selected input signal a from the output nodes of the routing blocks 1010, 1014 as the first selected output signal A and the second selected output signal B, respectively.

Another functional mode can be a transmit-b-wire mode. In a transmit-b-wire mode, the second selected input signal b is output as the first selected output signal A and as the second selected output signal B. The control logic 1002 controls the routing blocks 1010, 1014 to pass the second selected input signal b to respective output nodes of the routing blocks 1010, 1014. The control logic 1002 further controls the internal control signals S3, S4 to control the multiplexers 1020, 1022 to output the second selected input signal b from the output nodes of the routing blocks 1010, 1014 as the first selected output signal A and the second selected output signal B, respectively.

The various wires mode permits flexibility. Further, this architecture recognizes that at small processing nodes, routing may require periodic rebuffing, and various connections may require periodic buffering. The wire modes can implement any routing requirements within a PCM tile 308.

The ability of multiplexers 1016, 1018 to selectively output any of the north input signal n, east input signal e, south input signal s, and west input signal w as any of the first selected input signal a and second selected input signal b can render any transmit-wire or cross-wire mode unnecessary when a through-wire mode is available for implementing. A proper selection of signals as the first selected input signal a and second selected input signal b and using the through-wire mode can effectuate a same result as any transmit-wire or cross-wire mode.

Another functional mode can be a NOR mode. In a NOR mode, the second selected input signal b is output as the first selected output signal A, and a NOR operation is performed on an inverted first selected input signal a' and the second selected input signal b with the result being output as the second selected output signal B. The control logic 1002 controls the routing block 1010 to pass the second selected input signal b to the output node of the routing block 1010 and further controls the internal control signal S3 to control the multiplexer 1020 to output the second selected input signal b from the output node of the routing block 1010 as the first selected output signal A. The control logic 1002 controls the combinational function block 1012 to implement the NOR operation (including inverting the first selected input signal a) and controls the internal control signal S4 to control the multiplexer 1022 to output the result of the NOR operation from the combinational function block 1012 as the second selected output signal B. A person having ordinary skill in the art will readily understand that the NOR operation may be expressed or represented as an OR operation performed on the first selected input signal a and an inverted second selected input signal b'.

Another functional mode can be an invert mode. In an invert mode, an inverted first selected input signal a' is output as the first selected output signal A, and the second selected input signal b is output as the second selected output signal B. The control logic 1002 controls the combinational function block 1008 to implement a NOT operation on the first selected input signal a and controls the internal control signal S3 to control the multiplexer 1020 to output the result of the NOT operation (e.g., an inverted first selected input signal a') from the combinational function block 1008 as the first selected output signal A. The control logic 1002 controls the routing block 1014 to pass the second selected input signal b to the output node of the routing block 1014 and further controls the internal control signal S4 to control the multiplexer 1022 to output the second selected input signal b from the output node of the routing block 1014 as the second selected output signal B.

Reference is made to FIGS. 4-10 for configuring a PCM region 134 and reading the configuration data in a PCM region 134. A configuration region is described herein for ease of reference. A configuration region, in the context of the architecture of FIGS. 4-10, includes a rectangular area including a northwest ZCF tile 402 in a northwest corner of the configuration region, and extending from the northwest ZCF tile 402 east to include a northeast ZCF tile 402, and extending from the northwest ZCF tile 402 south until another ZCF tile 402 is encountered. For example, with reference to FIG. 4, a configuration region includes the northwest ZCF tile 402 in the northwest corner and includes a rectangular area of an intersection of columns 302-1, 412, 302-2, 412, 302-1 (e.g., according to the pattern previously described) and rows 304-1, 414. A ZCF tile 402 and any other tiles in the column in which the ZCF tile is disposed may be shared between different configuration regions. For example, a ZCF tile 402 that is a northeast ZCF tile 402 in one configuration region may also be a northwest ZCF tile 402 in a neighboring configuration region.

To configure the configuration region, the down write configuration input signal cfgw[0]$_d$ and down configuration input signal cfg$_d$ are asserted in the northwest ZCF tile 402 of the configuration region. The down write configuration input signal cfgw[0]$_d$ is propagated from the northwest ZCF tile 402 (via multiplexer 512) as the configuration output signal CFG and through the RCF tiles 406 (e.g., via respective buffers 712) in the same row in which the northwest ZCF tile 402 is disposed. Further, the down write configuration input signal cfgw[0]$_d$ is propagated from the northwest ZCF tile 402 (via multiplexer 504) as the write configuration output signal CFGW and through the CCF tiles 404 (e.g., via respective buffers 606) in the same column in which the northwest ZCF tile 402 is disposed. At each CCF tile 404, the write configuration input signal cfgw is propagated from the CCF tile 404 (via multiplexer 612) as the configuration output signal CFG and through the ZCK tiles 410, PCM tiles 308, and/or ZRT tiles 408 (e.g., via respective buffers in control logic 802, 902, 1002) in the same row in which the CCF tile 404 is disposed. Hence, the down write configuration input signal cfgw[0]$_d$ received at the northwest ZCF tile 402 is propagated to the ZCK tiles 410, PCM tiles 308, and/or ZRT tiles 408 as configuration input signals cfg.

With the configuration input signals cfg of the ZRT tiles 408, ZCK tiles 410, and PCM tiles 308 in the configuration region being asserted, and assuming that no read/write input signal r/w is asserted, west input signals w are passed as east output signals E (e.g., via respective multiplexers 834, 940, 1016, 1020). At each CCF tile 404, the assertion of the write configuration input signal cfgw causes the down input signal d to be passed as the east output signal E (via multiplexer 614). Accordingly, data received from the down input signal d at the CCF tile 404 can be propagated along the row in which the CCF tile 404 is disposed by the ZRT tiles 408, ZCK tiles 410, and PCM tiles 308 passing west input signals w as east output signals E.

The CCF tiles 404, ZRT tiles 408, and ZCK tiles 410 may pass east input signals e as west output signals W (e.g., via respective buffers 602, 918 and multiplexers 812); however, in the illustrated and described architecture, any east input signal e received at a PCM tile 308 is not further propagated while the respective configuration input signal cfg is asserted.

With the configuration input signals cfg of the ZRT tiles 408, ZCK tiles 410, and PCM tiles 308 in the configuration region being asserted, and assuming that no read/write input signal r/w is asserted, north input signals n are passed as south output signals S (e.g., via respective buffers in control logic 802, 902 and multiplexers 1018, 1022). At each RCF tile 406, the assertion of the configuration input signal cfg causes the down input signal d to be passed as the south output signal S (via multiplexer 706). Accordingly, data received from the down input signal d at the RCF tile 406 can be propagated along the column in which the RCF tile 406 is disposed by the ZRT tiles 408, ZCK tiles 410, and PCM tiles 308 passing north input signals n as south output signals S.

The RCF tiles 406, ZRT tiles 408, and ZCK tiles 410 may pass south input signals s as north output signals N (e.g., via respective buffers 714, 814, 920); however, in the illustrated and described architecture, any south input signal s received at a PCM tile 308 is not further propagated while the respective configuration input signal cfg is asserted.

To write configuration data to any of the ZRT tiles 408, ZCK tiles 410, and PCM tiles 308, the down input signal d in the RCF tile 406 in the column in which the target tile is disposed is asserted, which is propagated down the column from north input signals n to south output signals S of tiles in the column, as described. Hence, the flip-flops of the CSR of the target tile are enabled, as are any CSR of other tiles in the column. Hence, the respective paths of the north input signals n and south output signals S along a column may form wordlines. Configuration data is transmitted as the down input signal d in the CCF tile 404 in the row in which the target tile is disposed, which is propagated across the row from west input signals w to east output signals E, as described. Hence, the respective paths of the west input signals w and east output signals E along a row may form data lines. At the target tile, with the configuration data received as the west input signal w and the CSR being enabled by the assertion of the north input signal n, the CSR of the target tile is written with the configuration data, e.g., in eight clock cycles in the illustrated architecture. Each tile in a column can be written in parallel simultaneously. Additionally, with the propagation of configuration data from west input signal w to east output signal E, multiple tiles in a same row that are to have a same configuration may be written in parallel simultaneously.

To read configuration data from the configuration region, the read/write input signal r/w is also asserted. The down configuration input signal cfg$_d$ is asserted in the northwest ZCF tile 402 of the configuration region, which causes the read/write input signal r/w[0]$_d$ to be propagated from the northwest ZCF tile 402 (via multiplexer 502) as the read/write output signal R/W and through the CCF tiles 404 (e.g., received as north read/write input signals r/w$_n$ and output via respective buffers 608 as south read/write output signals R/Ws) in the same column in which the northwest ZCF tile 402 is disposed. At each CCF tile 404, with the write configuration input signal cfgw being asserted as previously described, the north read/write input signal r/w$_n$ is output (via multiplexer 610) as the east read/write output signal R/WE, which is propagated through the ZRT tiles 408, ZCK tiles 410, and/or PCM tiles 308 (e.g., via multiplexer 806 and respective buffers in control logic 902, 1002) in the row in which the respective CCF tile 404 is disposed. Further, the down read configuration input signal cfgr[0]$_d$ and down configuration input signal cfg$_d$ are asserted in the northeast ZCF tile 402 of the configuration region. The down read configuration input signal cfgr[0]$_d$ is propagated from the northeast ZCF tile 402 (via multiplexer 506) as the read configuration output signal CFGR and through the CCF tiles 404 (e.g., via respective buffers 604) in the same column in which the northeast ZCF tile 402 is disposed. At each CCF tile 404, the read configuration input signal cfgr being asserted causes the CCF tile 404 to pass the west input signal w as the down output signal D. Hence, data transmitted from west input signals w to east output signals E in the tiles in a row can be received as a west input signal w at the respective CCF tile 404 and output as the down output signal D at the CCF tile 404.

To read configuration data from any of the ZRT tiles 408, ZCK tiles 410, and PCM tiles 308, the down input signal d in the RCF tile 406 in the column in which the target tile is disposed is asserted, which is propagated down the column from north input signals n to south output signals S of tiles in the column, as described. Hence, the flip-flops of the CSR of the target tile are enabled, as are any CSR of other tiles in the column. Hence, the respective paths of the north input signals n and south output signals S along a column may form wordlines. With the read/write input signal r/w of the tiles of the configuration region asserted, configuration data of the target tile is output from the target tile and propagated along through tiles (as a west input signal w to an east output signal E) in the row in which the target tile is disposed until the data is received at a corresponding CCF tile 404 (in the column of the northeast ZCF tile 402) as a west input signal w, which is then transmitted as a down output signal D. Hence, the respective paths of the west input signals w and east output signals E along a row may form data lines. At the target tile, with the CSR being enabled by the assertion of the north input signal n, the CSR of the target tile can output the configuration data, e.g., in eight clock cycles in the illustrated architecture. Each tile in a column can be read in parallel simultaneously. The foregoing description for writing and reading configuration data in a configuration or scan mode is also generally applicable to writing or reading data in a bulk memory mode (e.g., an 8-bit memory mode) such as described below with respect to FIG. 13.

A person having ordinary skill in the art will readily understand the distribution of various other signals, such as clock signals and reset signals, based on the foregoing description of and illustrations in FIGS. 4-10. Hence, detailed description of such distribution is omitted here for brevity.

Further, a ZCF tile 402 can control a configuration or scan mode in other configuration regions. In the illustrated architecture, a read configuration output signal CFGR, a write configuration output signal CFGW, and a read/write output signal R/W output by a ZCF tile 402 can continue to propagate through another ZCF tile 402 south of the ZCF tile 402 from which those signals originated. For example, if the down configuration input signal $cfg_d$ is not asserted at a ZCF tile 402, the read configuration input signal cfgr, write configuration input signal cfgw, and read/write input signal r/w received at that ZCF tile 402 originate from another ZCF tile 402 north of that ZCF tile 402, and those signals can control a configuration or scan mode of another configuration region. Similarly, a configuration output signal CFG output by a ZCF tile 402 can continue to propagate through another ZCF tile 402 east of the ZCF tile 402 from which that signal originated. For example, if the down configuration input signal cfgd is not asserted at a ZCF tile 402, the configuration input signal cfg received at that ZCF tile 402 originates from another ZCF tile 402 west of that ZCF tile 402, and that signal can control a configuration or scan mode of another configuration region.

As illustrated by the foregoing description, a configuration mode and a scan mode can use a same data path (e.g., a unified programmable computational memory and configuration network) and clock signals as logic functions implemented in a PCM tile 308. The flip-flops R0-R6 1032-1044 store configuration data that is written during a configuration mode, and that configuration data is transmitted to the PCM tile 308 using routing that is capable of routing, e.g., transactional data consumed by logic functions in other functional modes of the PCM tile 308. The PCM region 134 can omit a dedicated configuration data path. For example, the PCM region 134 can omit dedicated bitlines and wordlines.

Functional modes can implement any routing in a tile that is enabled by that tile and based on configuration data stored in a respective CSR. Various examples of routing are described above and described below in the context of specific example configurations. A person having ordinary skill in the art will readily understand possible routing between north, east, south, and west input signals n, e, s, w and north, east, south, and west output signals N, E, S, W based on the foregoing description of and illustrations in FIGS. 4-10.

Figure 11:
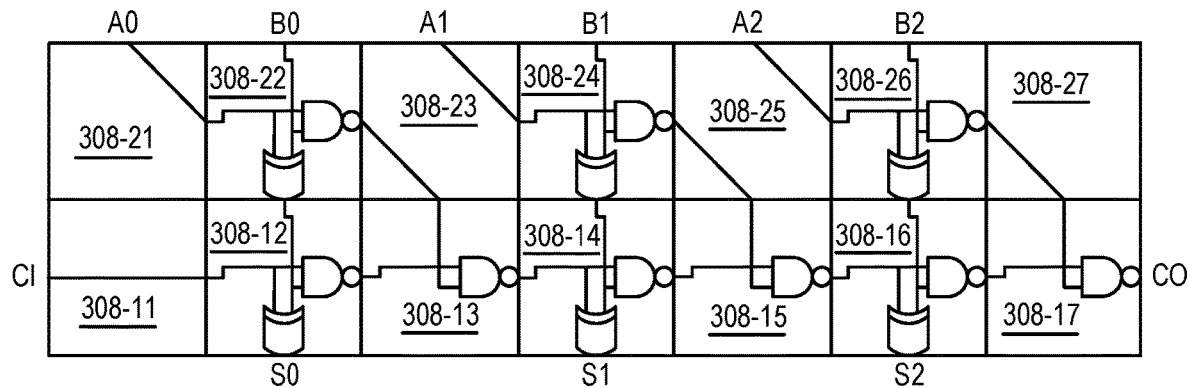
FIG. 11 illustrates a 3-bit adder implemented in a PCM region according to some examples.

FIGS. 11 through 14 illustrate various configurations and logic functions that can be implemented in one or more PCM regions 134 according to some examples. FIG. 11 illustrates a 3-bit adder. The 3-bit adder of FIG. 11 implements four PCM tiles 308 to implement a one-bit adder. The four PCM tiles 308 include three PCM tiles 308 configured in a half adder mode and one PCM tile 308 configured in a through-wire mode. PCM tiles 308-12, 308-13, 308-14, 308-15, 308-16, 308-17, 308-22, 308-24, 308-26 implement a half adder mode described above. PCM tiles 308-11, 308-21, 308-23, 308-25, and 308-27 implement a through-wire mode. In the following description, it is assumed that the binary digits of addends A, B are routed to the north input signals n of the respective PCM tiles 308. As illustrated, the 3-bit adder of FIG. 11 has addends input at the north boundary of the 3-bit adder, a sum output at the south boundary, a carry input input at the west boundary, and a carry output output at the east boundary. In other examples, data can flow in different directions. For example, addends can be input at the east boundary, a sum can be output at the west boundary, a carry input can be input at the south boundary, and a carry output can be output at the north boundary.

The binary digit A0 of addend A is routed as the north input signal n of the PCM tile 308-21. The binary digit A0 is routed through the PCM tile 308-21 to the east output signal E of the PCM tile 308-21. This routing may be through the multiplexer 1016, routing block 1010, and multiplexer 1020 in a through-wire mode of the PCM tile 308-21.

The binary digit A0 of addend A is routed as the west input signal w of the PCM tile 308-22 from the routing through the PCM tile 308-21. The binary digit B0 of addend B is routed as the north input signal n of the PCM tile 308-22. The binary digit A0 (as the west input signal w) is selected by multiplexer 1016 as the first selected input signal a, and the binary digit B0 (as the north input signal n) is selected by multiplexer 1018 as the second selected input signal b. The combinational function block 1008 is configured to implement a NAND(a, b) operation, and the result of the NAND (a, b) operation is output to the multiplexer 1020, which is selectively output as the first selected output signal A as the east output signal E. The combinational function block 1012 is configured to implement a XOR(a, b) operation, and the result of the XOR(a, b) operation is output to the multiplexer 1022, which is selectively output as the second selected output signal B as the south output signal S.

The result of the NAND(a, b) operation is routed as the west input signal w of PCM tile 308-23 from the east output signal E of PCM tile 308-22. The result of the NAND(a, b) operation is routed through the PCM tile 308-23 to the south output signal S of the PCM tile 308-23. This routing may be through the multiplexer 1018, routing block 1014, and multiplexer 1022 in a through-wire mode of the PCM tile 308-23. Additionally, the binary digit A1 of addend A is routed as the north input signal n of the PCM tile 308-23. The binary digit A1 is routed through the PCM tile 308-23 to the east output signal E of the PCM tile 308-23. This routing may be through the multiplexer 1016, routing block 1010, and multiplexer 1020 in the through-wire mode of the PCM tile 308-23.

The carry input CI is routed as the west input signal w of the PCM tile 308-11. The carry input CI is routed through the PCM tile 308-11 to the east output signal E of the PCM tile 308-11. This routing may be through the multiplexer 1016, routing block 1010, and multiplexer 1020 in a through-wire mode of the PCM tile 308-11.

The result of the XOR(a, b) operation from PCM tile 308-22 is routed as the north input signal n of the PCM tile 308-12. The carry input CI is routed as the west input signal w of the PCM tile 308-12 from the east output signal E of the PCM tile 308-11. The result of the XOR(a, b) operation (as the north input signal n) is selected by multiplexer 1018 as the second selected input signal b, and the carry input CI (as the west input signal w) is selected by multiplexer 1016 as the first selected input signal a. The combinational function block 1008 is configured to implement a NAND(a, b) operation, and the result of the NAND(a, b) operation is output to the multiplexer 1020, which is selectively output as the first selected output signal A as the east output signal E. The combinational function block 1012 is configured to implement a XOR(a, b) operation, and the result of the XOR(a, b) operation is output to the multiplexer 1022, which is selectively output as the second selected output signal B as the south output signal S. The south output signal S is the sum bit S0.

The result of the NAND(a, b) operation of the PCM tile 308-12 is routed as the west input signal w of PCM tile 308-13 from the east output signal E of PCM tile 308-12. The result of the NAND(a, b) operation of PCM tile 308-22 is routed as the north input signal n of PCM tile 308-13 from the south output signal S of PCM tile 308-23. The result of the NAND(a, b) operation of the PCM tile 308-12 (as the west input signal w) is selected by multiplexer 1016 as the first selected input signal a, and the result of the NAND(a, b) operation of PCM tile 308-22 (as the north input signal n) is selected by multiplexer 1018 as the second selected input signal b. The combinational function block 1008 is configured to implement a NAND(a, b) operation, and the result of the NAND(a, b) operation is output to the multiplexer 1020, which is selectively output as the first selected output signal A as the east output signal E. The combinational function block 1012 may be configured according to the half adder mode, and the second selected output signal B of the PCM tile 308-13 is not implemented for additional logic.

The foregoing describes a configuration to implement a half adder to obtain a one-bit sum and one-bit carry. The configuration of PCM tiles 308-12, 308-13, 308-22, 308-23 can be replicated to implement additional bits for addends A, B and a sum, like shown in FIG. 11, with a carry out CO also being implemented.

A half adder mode implemented in one or more PCM tiles 308 can be used for other functions or purposes. Arrays of adders (e.g., arrays of the adder illustrated in FIG. 11) can be implemented to implement a multiplier. An XOR operation of a half adder mode can be used to implement counters. When the second selected input signal b is a logical "1", a PCM tile 308 configured in a half adder mode can be used as an invert operation on the first selected input signal a, which is output as the first selected output signal A.

Figure 12:
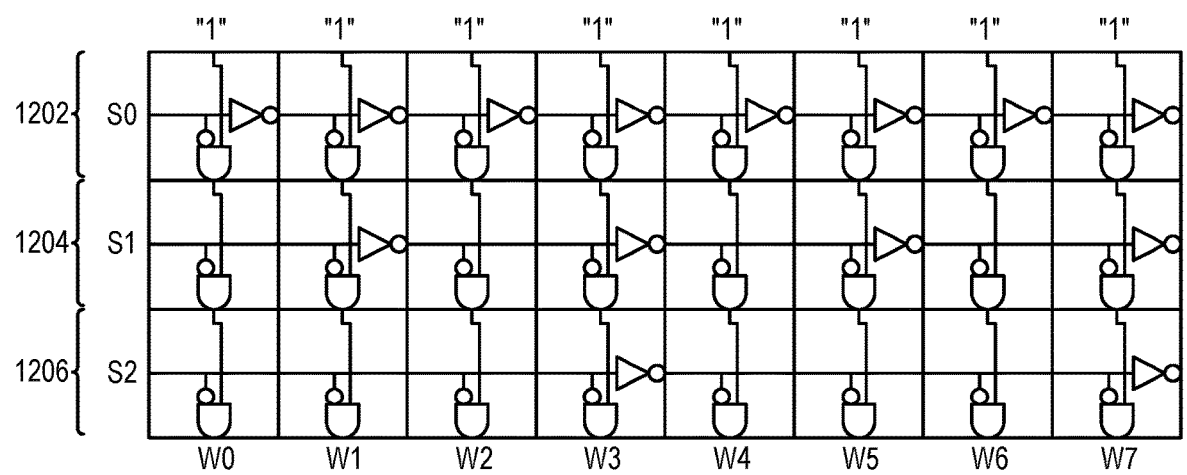
FIG. 12 illustrates a memory wordline decoder implemented in a PCM region according to some examples.

FIG. 12 illustrates a memory wordline decoder. The memory wordline decoder includes PCM tiles 308 that are configured in a decode-invert mode and that are configured in a decode mode. The memory wordline decoder in this example is illustrated as a 3×8 decoder, and in other examples, the memory wordline decoder can be a different size, such as a larger array. The memory wordline decoder has address bits S0, S1, S2 and logical "1" as inputs as illustrated. The memory wordline decoder is arranged in rows 1202, 1204, 1206 of PCM tiles 308. The PCM tiles 308 in the row 1202 are each configured in a decode-invert mode. The PCM tiles 308 in the row 1204 are alternately configured in a decode mode and a decode-invert mode. The PCM tiles 308 in the row 1206 are configured in a repeating pattern of three PCM tiles 308 being in a decode mode followed by one PCM tile 308 being in a decode-invert mode. The memory wordline decoder outputs wordlines W0, W1, W2, W3, W4, W5, W6, W7. A person having ordinary skill in the art will readily understand various routings and configurations among the PCM tiles 308 based on the foregoing description.

A memory wordline decoder can be implemented with any appropriate size. In some examples, a size of a memory wordline decoder can be based on the number of wordlines. In some examples, the size of a memory wordline decoder can be $N_T = \log_2(N_{WL}) * N_{WL}$, where $N_T$ is the number of PCM tiles 308 to implement the memory wordline decoder, and $N_{WL}$ is the number of wordlines implemented by the memory wordline decoder. The pattern of the memory wordline decoder of FIG. 12 can be expanded for additional wordlines, for example. In some examples, the logical "1" input shown in FIG. 12 can be replaced by a global enable signal.

Figure 13:
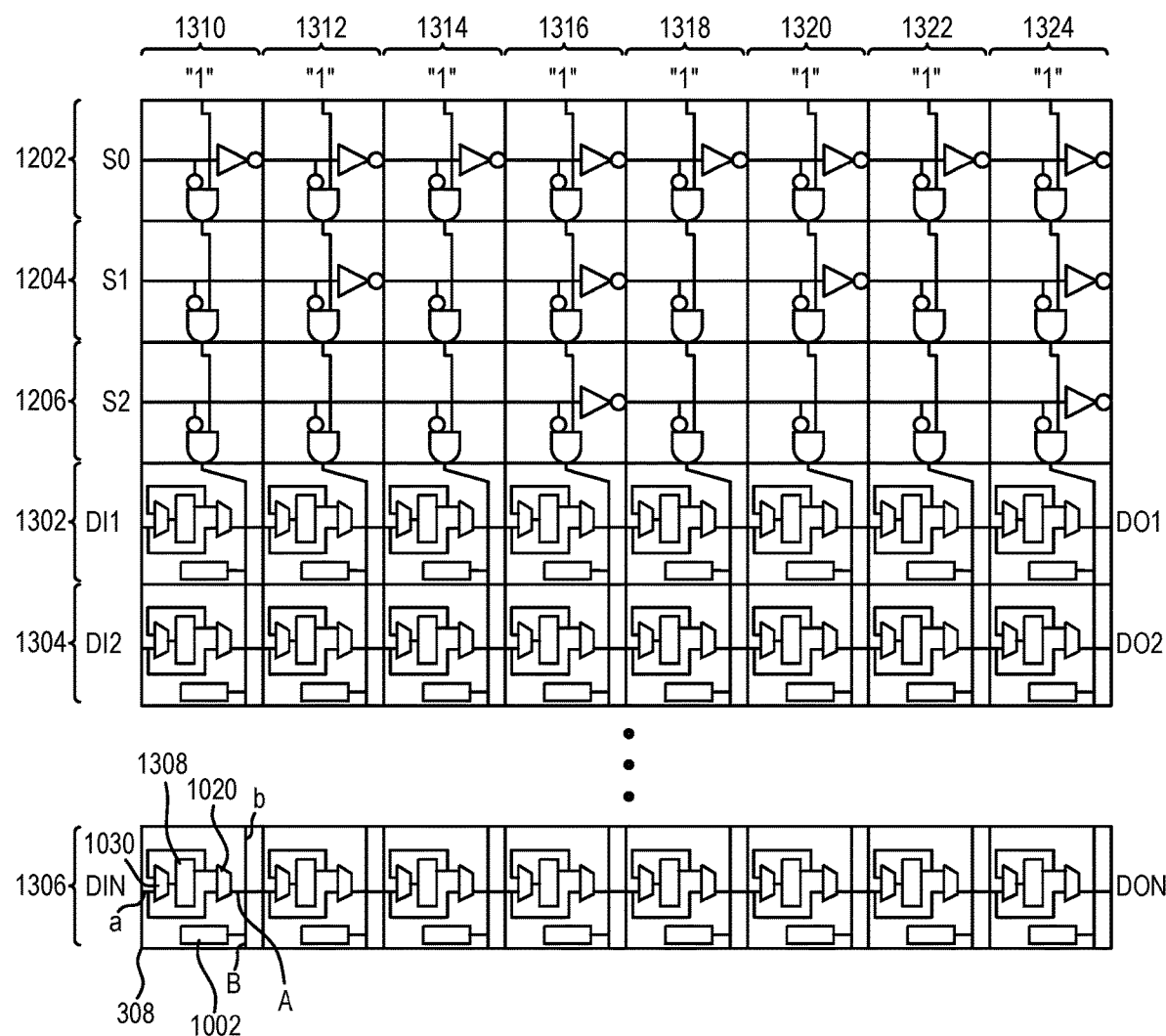
FIG. 13 illustrates a memory array implemented in a PCM region according to some examples and using the memory wordline decoder of FIG. 12 according to some examples.

FIG. 13 illustrates a memory array using the memory wordline decoder of FIG. 12 according to some examples. The memory array includes rows 1302, 1304, 1306 and columns 1310, 1312, 1314, 1316, 1318, 1320, 1322, 1324 of PCM tiles 308. The memory wordline decoder of FIG. 12 is implemented in rows 1202, 1204, 1206. The memory structures are implemented by PCM tiles 308 in an 8-bit memory mode configuration in rows 1302, 1304, 1306. Each row has a data input (e.g., data input DI0, DI1, . . . DIN for row 1302, 1304, 1306, respectively) and a data output e.g., data output DO0, DO1, . . . DON for row 1302, 1304, 1306, respectively). Any number of rows of PCM tiles 308 can implement the memory structures in an 8-bit memory mode.

The PCM tiles 308 in an 8-bit memory mode are illustrated in a simplified schematic. Each PCM tile 308 operating in an 8-bit memory mode operates like described above with respect to the configuration and scan modes. A ZRT tile 408 can be programmed by configuration data (e.g., by data bit Q[7]) to be a logical "1" as described with respect to Table 4) such that the configuration output signal CFG from that ZRT tile 408 is asserted (e.g., logical "1"). The configuration output signal CFG from a ZRT tile 408 is propagated as the configuration input signal cfg in PCM tiles 308 in the same row as the ZRT tile 408 and east of the ZRT tile 408 at least until another ZRT tile 408 is reached in that row. Hence, the configuration input signal cfg at these PCM tiles 308 is asserted, and these PCM tiles 308 are in the configuration mode as described previously. In this 8-bit memory mode, the configuration input signal cfg received at these PCM tiles 308 is generated as a result of configuration data (e.g., data bit Q[7] in the ZRT tile 408) rather than a global configuration signal.

With the PCM tiles 308 receiving a configuration input signal cfg that is asserted, the multiplexer 1048 passes the data bit Q[6] from the output node Q of the flip-flop R6 1044 to the input node D of the flip-flop R7 1046, or is in a "do not care" state, as shown in Table 14. Hence, the multiplexer 1048 is not specifically illustrated in FIG. 13. FIG. 13 illustrates the flip-flops R0-R7 1032-1046 as an 8-bit CSR 1308. Further, with the PCM tiles 308 receiving a configuration input signal cfg that is asserted, the multiplexer 1016 outputs the west input signal w as the first selected input signal a, and the multiplexer 1018 outputs the north input signal n as the second selected input signal b. Further, routing the second selected input signal b through, e.g., the routing block 1014 and multiplexer 1022 is static. Hence, the routing of the west input signal w to the multiplexers 1030, 1020 is schematically shown by through connections in FIG. 13, and the routing of the north input signal n to the south output signal S is schematically shown by through connections in FIG. 13.

Additionally, with a ZRT tile 408 programmed by configuration data (e.g., by data bit Q[7] to be a logical "1" as described with respect to Table 4), the west input signal w received by that ZRT tile 408 is output as the read/write output signal R/W from that ZRT tile 408. The read/write output signal R/W from a ZRT tile 408 is propagated as the read/write input signal r/w in PCM tiles 308 in the same row as the ZRT tile 408 and east of the ZRT tile 408 at least until another ZRT tile 408 is reached in that row. Hence, the read/write input signal r/w at these PCM tiles 308 can be a signal routed to the west input node w of the ZRT tile 408, e.g., by other tiles configured to route that signal to the ZRT tile 408, and these PCM tiles 308 can operate as described with respect to the configuration or scan mode as described previously. In this 8-bit memory mode, the read/write input signal r/w received at these PCM tiles 308 is routed as a result of configuration data (e.g., data bit Q[7] in the ZRT tile 408), rather than being a global read/write signal.

The memory wordline decoder outputs wordlines W0, W1, W2, W3, W4, W5, W6, W7, as shown in FIG. 12, in columns 1310-1324, respectively. Each wordline W0-W7 propagates down a respective column 1310-1324 of PCM tiles 308 that are in an 8-bit memory mode by each of those PCM tiles 308 being configured to pass a north input signal n as the second selected input signal b, which is passed as the second selected output signal B and as a south output signal S. As described previously, the second selected input signal b is input to the control logic 1002 for enabling the CSR 1308. The second selected input signal b, and hence the respective wordline W0-W7, acts as an enable signal for the PCM tiles 308 configured in an 8-bit memory mode.

When a wordline W0-W7 is asserted along a column, the CSR 1308 of the PCM tiles 308 in that column are enabled, and the read/write input signal r/w propagated along a row, e.g., rows 1302-1306, can determine whether any tile(s) intersecting that column and row(s) are read or written, as described above in the context of Table 14. Data written to or read from any PCM tile 308 can be propagated from a west input signal w to an east output signal E. Data to be written to a PCM tile 308 can be transmitted from an up input signal u, down input signal d, or west input signal w of a CCF tile 404 or ZRT tile 408 west of the respective PCM tile 308. Data read from a PCM tile 308 can be transmitted to an up output signal U, down output signal D, or east output signal E of a ZRT tile 408 east of the respective PCM tile 308.

A memory array as illustrated in FIG. 13 can implement a large, dense buffer memory. The memory array can be read or written in, e.g., eight word bursts, which can be similar to flash and dynamic random access memory (DRAM) with which the PCM region 134 can be communicating. A number of bits in a word can be flexible.

Figure 14:
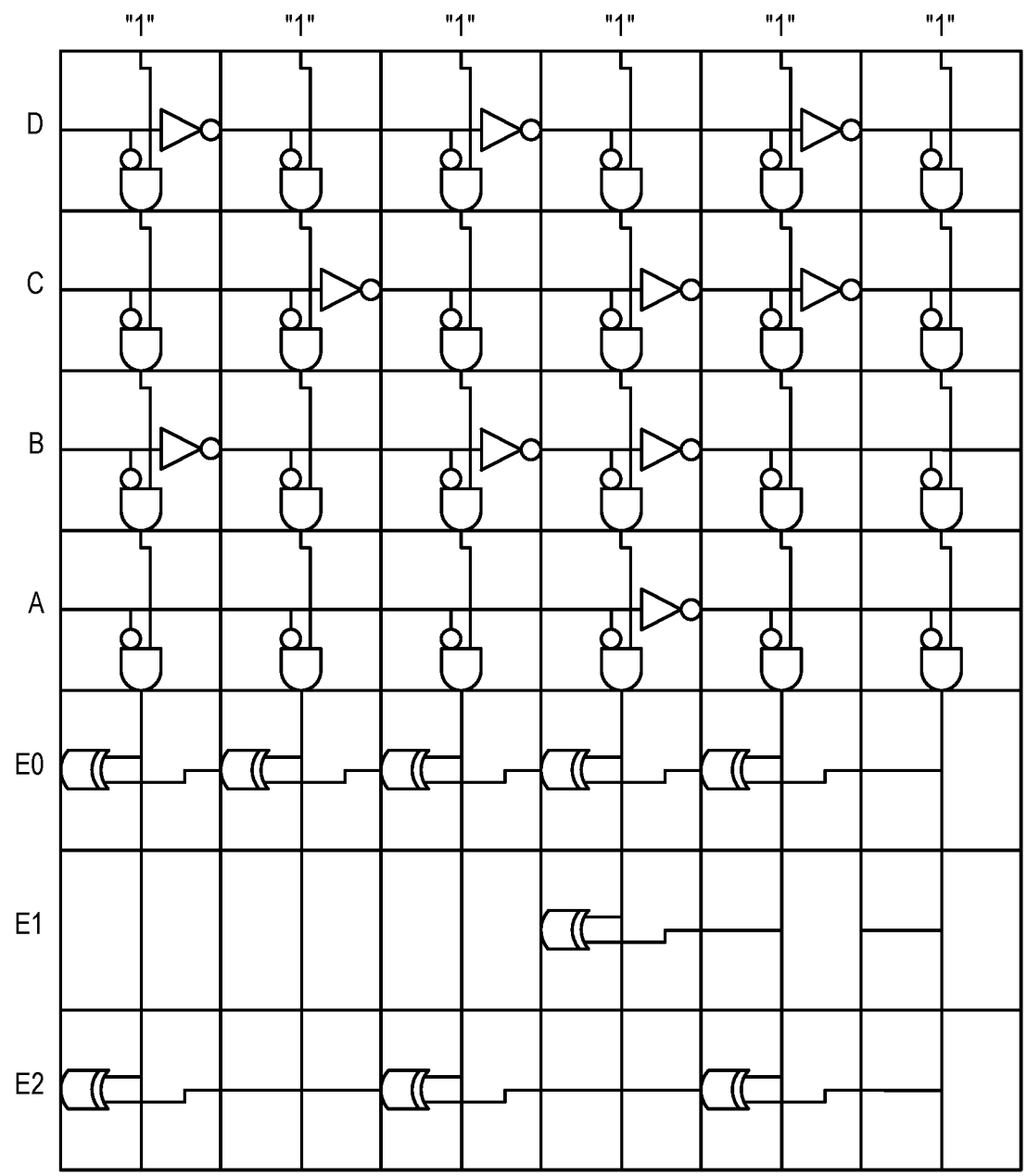
FIG. 14 illustrates an AND-OR plane implemented in a PCM region according to some examples.

FIG. 14 illustrates an AND-OR plane according to some examples. The AND-OR plane includes PCM tiles 308 that are configured in a decode-invert mode, a decode mode, an OR mode, and through-wire modes. The AND-OR plane implements logic to output signals E0, E1, E2 based on input signals A, B, C, D. Functions of this logic are as follows:

$E0 = \overline{ABCD} + \overline{ACD} + \overline{ABCD} + \overline{ABCD} + \overline{ABCD} + ABCD$ $E1 = \overline{ABCD} + AB\overline{CD}$ $E2 = \overline{ABCD} + \overline{ABCD} + AB\overline{CD} + ABCD$ A person having ordinary skill in the art will readily understand various routings and configurations among the PCM tiles 308 based on the foregoing description. In the illustrated example, the data flow of the AND-OR plane is from west to east, then north to south, and then east to west. In other examples, the data flow can be or include any directionality. For example, the above AND-OR plane can have a data flow that is from south to north, then east to west, and then north to south.

In some examples, various logic functions can create a large chain of, e.g., combinational logic. A large chain of logic may result in large delays for some signals. In some examples, any delays can be accommodated by inserting one or more PCM tiles 308 configured in a FDFF mode to insert pipelining and/or for a synchronous data flow. Inserting PCM tiles 308 configured in a FDFF mode can increase bandwidth.

According to some examples, the architecture of the PCM IC 106 does not include look-up tables (LUTs). The decode and OR modes can create a flexible and efficient replacement for LUTs that can be augmented by a half adder mode. Complex logic equations can be implemented using a simple AND-OR plane. The AND-OR plane can have any number of inputs and outputs.

The 3D programmable lattice described above can be simple such that the resources to create a better area and timing model are reasonable. Routing of the PCM ICs 106 in the programmable lattice can be different than that of any existing array. The programmable lattice described herein can implement data center transaction engines efficiently.

Figure 15:
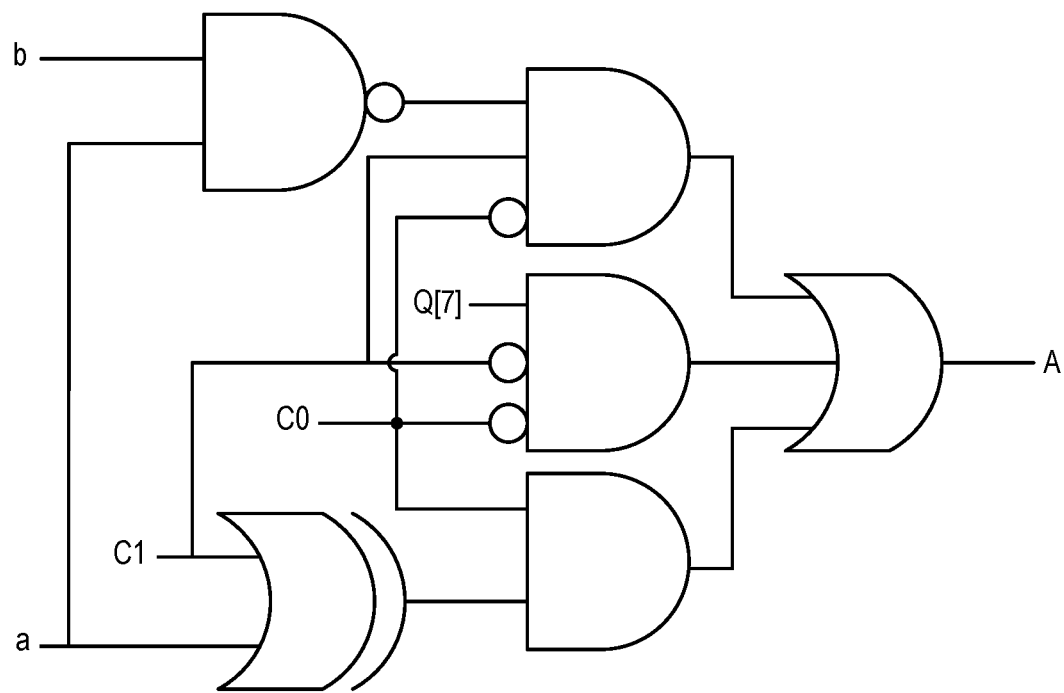
FIG. 15 is example combinational logic that may be implemented as a combinational function block, routing block, and multiplexer of the PCM tile of FIG. 10 according to some examples.

FIG. 15 is example combinational logic that may be implemented as, e.g., the combinational function block 1008, routing block 1010, and multiplexer 1020 of FIG. 10 according to some examples. Control signals C0, C1, C2 are signals that may be output by the control logic 1002 based on data bits Q[7:0] (e.g., configuration data). Signals a, b are the first and second selected input signals a, b, and signal A is the first selected output signal A, as described above.

The combinational logic includes a two input NAND gate, an XOR gate, two three input AND gates, a two input AND gate, three inverters, and an OR gate. The combinational logic implements the following logic statement:

$A = C_0(C_1 \oplus a) + \overline{C_0} C_1 \overline{(ab)} + \overline{C_0 C_1} Q$ Table 19 illustrates a truth table of the signals output at output node B as a function of the control signals and corresponding modes to which the signals can apply.

TABLE 19

| C0 | C1 | A | Mode(s) |
|---|---|---|---|
| 0 | 0 | Q[7] | Scan (enabled), 1B Mem Read, MUX, ROM FDFF |
| 0 | 1 | NAND(a, b) | Half-Adder |
| 1 | 0 | a | Config. (enabled), Config./Scan (disabled), 1B Mem Disable, 1B Mem Write, Decode, OR, Through-Wire, Transmit-a-wire, Redundancy |
| 1 | 1 | $\overline{a}$ | Decode-Invert, Invert |

Accordingly, the combinational logic of FIG. 15 illustrates efficiencies that can be gained in, e.g., area on the die by combining functionality of different components.

Figure 16:
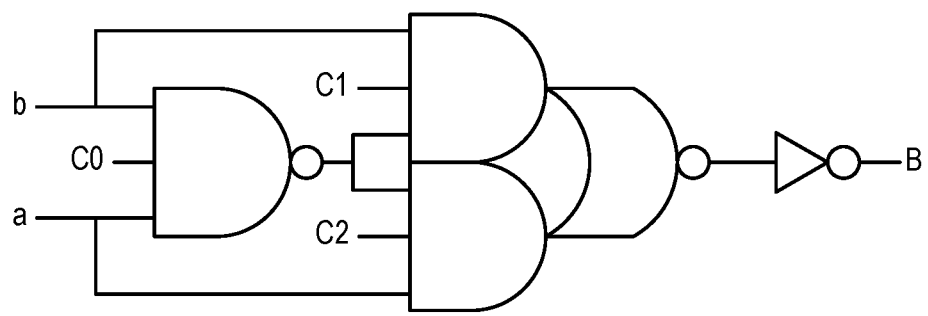
FIG. 16 is example combinational logic that may be implemented as a combinational function block, routing block, and multiplexer of the PCM tile of FIG. 10 according to some examples.

FIG. 16 is example combinational logic that may be implemented as, e.g., the combinational function block 1012, routing block 1014, and multiplexer 1022 of FIG. 10 according to some examples. Control signals C0, C1, C2 are signals that may be output by the control logic 1002 based on data bits Q[7:0] (e.g., configuration data) (and are not necessarily the same as control signals C0, C1, C2 in FIG. 15). Signals a, b are the first and second selected input signals a, b, and signal B is the second selected output signal B, as described above.

The combinational logic includes a three input NAND gate, two three input AND gates, a two input NOR gate, and an inverter. The combinational logic implements the following logic statement:

$B = bC_1\overline{(abC_0)} + aC_2\overline{(abC_0)}$

Table 20 illustrates a truth table of the signals output at output node B as a function of the control signals and corresponding modes to which the signals can apply.

TABLE 20

| C0 | C1 | C2 | B | Mode(s) |
|---|---|---|---|---|
| 0 | 0 | 0 | 0 | Undefined |
| 0 | 0 | 1 | a | Cross-wire, Transmit-a-wire |
| 0 | 1 | 0 | b | Config., Scan, 1B Mem, MUX, ROM, FDFF, Through-Wire, Redundancy, Transmit-b-wire, Invert |
| 0 | 1 | 1 | OR(a, b) | OR |
| 1 | 0 | 0 | 0 | Undefined |
| 1 | 0 | 1 | AND(a, $\bar{b}$) | NOR |
| 1 | 1 | 0 | AND($\bar{a}$, b) | Decode, Decode-Invert |
| 1 | 1 | 1 | XOR(a, b) | Half-Adder |

Accordingly, the combinational logic of FIG. 16 illustrates efficiencies that can be gained in, e.g., area on the die by combining functionality of different components.

Figure 17:
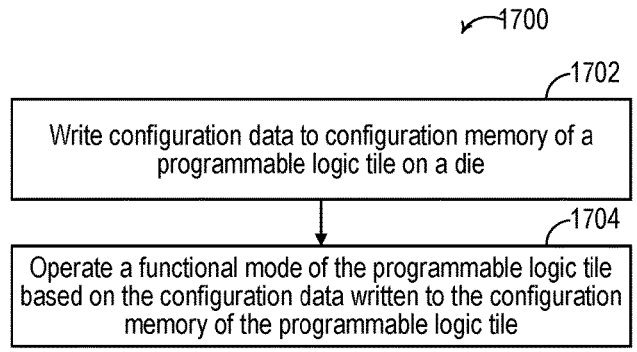
FIG. 17 is a flow chart of a method for operating a programmable device according to some examples.

FIG. 17 is a flow chart of a method 1700 for operating a programmable device according to some examples. The programmable device can be the device shown in FIGS. 1 and 2 comprising the architecture illustrated in and described with respect to FIGS. 3 through 10.

At block 1702, configuration data is written to configuration memory of a PCM tile on a die. Writing the configuration data can comprise transmitting the configuration data to the configuration memory via a selected input node (e.g., first selected input node a) of the PCM tile.

At block 1704, a functional mode of the PCM tile is operated based on the configuration data written to the configuration memory of the PCM tile. The functional mode can include a logic operation performed on or a through-transmission of a data signal transmitted via the selected input node of the PCM tile. Other details and operations can be discerned from the foregoing description of other figures.

Figure 18:
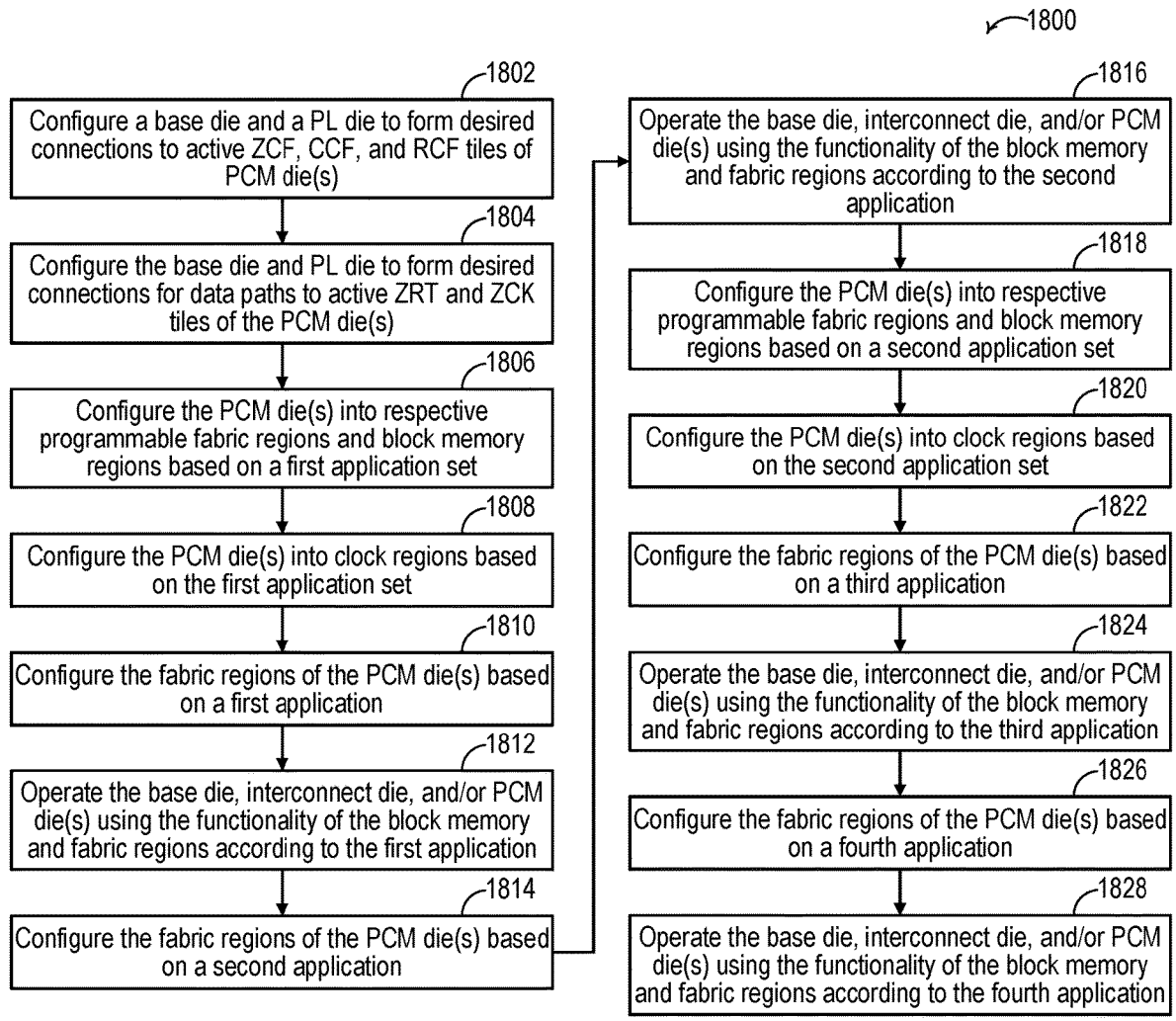
FIG. 18 is a flow chart of a method for operating a programmable device according to some examples.

FIG. 18 is a flow chart of a method 1800 for operating a programmable device according to some examples. The method 1800 is described below in the context of the programmable device shown in FIGS. 1 and 2 comprising the architecture illustrated in and described with respect to FIGS. 3 through 10. Other examples can be implemented using other programmable devices.

At block 1802, a base die and a PL die are configured to form desired connections to active ZCF tiles, CCF tiles, and RCF tiles of PCM die(s). For example, a PMC of the processing system 110 of the base IC 102 on the base die 202 can execute a boot image file that causes the programmable network 120 of the NoC 116 to be configured (e.g., by transmitting configuration data to configure the programmable network 120 via the NPI 122). The PMC can then transmit configuration data via the programmable network 120 to the CFRAME driver 126 of the PL IC 104 on the PL die 204, which in turn, configures the interconnect 124 of the PL IC 104 based on the configuration data. The configured interconnect 124 can have connections to active ZCF tiles 402, CCF tiles 404, and RCF tiles 406 of the PCM ICs 106.

At block 1804, the base die and PL die are configured to form desired connections for data paths to active ZRT tiles and ZCK tiles of the PCM die(s). Similar to block 1802, the PMC can transmit configuration data via the programmable network 120 to the CFRAME driver 126, which in turn, configures the interconnect 124 based on the configuration data, and the configured interconnect 124 can have connections to active ZRT tiles 408 and ZCK tiles 410 of the PCM ICs 106.

At block 1806, the PCM die(s) are configured into respective programmable fabric regions and block memory regions based on a first application set, and at block 1808, the PCM die(s) are configured into clock regions based on the first application set. An application set can determine a character or environment in which one or more applications (e.g., user designs) can operate. The application set determines which PCM tiles of the PCM dies are allocated to fabric (e.g., such that a user design can implement any functional logic mode on those PCM tiles) and which PCM tiles are allocated to memory (e.g., such that a user design can implement a memory mode in those PCM tiles). The application set also determines clock distribution throughout the PCM dies. As illustrated below, different applications can be implemented using the same application set, and those applications can be implemented by a reconfiguration (e.g., a partial reconfiguration).

Referring to block 1806, the PCM dies 206 can be configured into fabric regions and block memory regions by writing configuration data to ZRT tiles 408 (e.g., to flip-flops R0-R7 818-832) as described above. The configuration data of the different ZRT tiles 408 can set a configuration output signal CFG to be asserted (e.g., a logical "1"), which can permit a corresponding array of PCM tiles 308 to be in, e.g., an 8-bit memory mode as described above. The configuration data of the different ZRT tiles 408 can set a configuration output signal CFG to be dynamically asserted based on a configuration input signal cfg, which can permit a corresponding array of PCM tiles 308 to be in any logic mode.

Referring to block 1808, the PCM dies 206 can be configured into clock regions by writing configuration data to ZCK tiles 410 (e.g., to flip-flops R0-R7 924-938) as described above. The configuration data of the different ZCK tiles 410 can set a clock output signal CLK to be any of multiple clock input signals. By being able to selectively set the clock output signal CLK to any of these signals, different clock regions can be set in corresponding PCM tiles 308.

At block 1810, the fabric regions of the PCM die(s) are configured based on a first application. The first application can be implemented in the character or environment of the first application set. The PCM tiles 308 in the fabric regions can be configured by writing configuration data to the PCM tiles 308 (e.g., to flip-flops R0-R6 1032-1044), as previously described, to configure the PCM tiles 308 to implement various functional modes.

At block 1812, the base die, interconnect die, and/or PCM die(s) are operated using the functionality of the block memory and fabric regions according to the first application. Data can flow between any of the base die 202, PL die 204, and/or PCM dies 206 during operation of the dies (e.g., via configured connections). The dies can be operated until the first application is completed.

At block 1814, the fabric regions of the PCM die(s) are configured based on a second application, like block 1810. The second application can be different from the first application and can be implemented in the character or environment of the first application set.

At block 1816, the base die, interconnect die, and/or PCM die(s) are operated using the functionality of the block memory and fabric regions according to the second application, like block 1812. The dies can be operated until the second application is completed.

At block 1818, the PCM die(s) are configured into respective programmable fabric regions and block memory regions based on a second application set, like block 1806, and at block 1820, the PCM die(s) are configured into clock regions based on the second application set, like block 1808. The second application set differs from the first application set. The second application set can allocate PCM tiles to different fabric regions or memory regions compared to the first application set. Hence, resources of the PCM tiles can be dynamically reallocated to memory or fabric. In the context of the described examples, the ZRT tiles 408 and ZCK tiles 410 that are written to at blocks 1806 and 1808, respectively, can differ from the ZRT tiles 408 and ZCK tiles 410 that are written to at blocks 1818 and 1820, respectively, e.g., due to the differing physical regions that can be implemented between the first application set and the second application set.

At block 1822, the fabric regions of the PCM die(s) are configured based on a third application, like block 1810. The third application can be implemented in the character or environment of the second application set.

At block 1824, the base die, interconnect die, and/or PCM die(s) are operated using the functionality of the block memory and fabric regions according to the third application, like block 1812. The dies can be operated until the third application is completed.

At block 1826, the fabric regions of the PCM die(s) are configured based on a fourth application, like block 1810. The fourth application can be different from the third application and can be implemented in the character or environment of the second application set.

At block 1828, the base die, interconnect die, and/or PCM die(s) are operated using the functionality of the block memory and fabric regions according to the fourth application, like block 1816. The dies can be operated until the fourth application is completed.

The method 1800 of FIG. 18 illustrates the ability of a programmable device to dynamically reallocate resources between memory and fabric (e.g., logic). The programmable device can be configured based on different application sets that allocate PCM tiles differently between memory and fabric. Further, different applications can be implemented using each application set. The method 1800 can implement any number of application sets (e.g., one or more), and can implement any number of applications (e.g., one or more) with each application set.

While the foregoing is directed to specific examples, other and further examples may be devised without departing from the basic scope thereof, and the scope thereof is determined by the claims that follow.

What is claimed is:

1. A programmable device comprising:
a die comprising a programmable integrated circuit, the programmable integrated circuit comprising a tile, the tile comprising:
a shift register, wherein a first subset of the shift register is configured to store configuration data, and a second subset of the shift register is configurable to implement functionality based on the configuration data stored in the first subset of the shift register.

2. The programmable device of claim 1, wherein the shift register is configured to be readable by propagating data from the first subset of the shift register to the second subset of the shift register.

3. The programmable device of claim 1, wherein the functionality includes memory, the memory being operable to be read, written, and disabled from being read or written responsive to a signal received from a transmission network and an external read/write signal, the transmission network being configured to communicate transactional data.

4. The programmable device of claim 1, wherein the functionality includes multiplexing responsive to a first signal received from a transmission network, the transmission network being configured to communicate transactional data.

5. The programmable device of claim 4, wherein the multiplexing selectively outputs a second signal received from the transmission network or a reset value of the second subset of the shift register.

6. The programmable device of claim 1, wherein the functionality includes read-only memory, the read-only memory being operable to be read and disabled responsive to a signal received from a transmission network and an external read/write signal, the transmission network being configured to communicate transactional data.

7. The programmable device of claim 1, wherein the functionality includes a functional flip-flop configured to be enabled responsive to a signal received from a transmission network, the transmission network being configured to communicate transactional data.

8. The programmable device of claim 1, wherein:
the shift register includes a first multiplexer;
the first subset of the shift register includes serially connected flip-flops; and
the first multiplexer has a first input node connected to an output node of the serially connected flip-flops, has a second input node connected to a node of a transmission network configured to communicate transactional data, and has an output node connected to an input node of the second subset of the shift register.

9. The programmable device of claim 8, wherein:
the shift register includes a second multiplexer; and
the second multiplexer has a first input node connected to the node of the transmission network, has a second input node connected to an output node of the second subset of the shift register, and has an output node connected to an input node of the serially connected flip-flops.

10. The programmable device of claim 1, wherein the tile further includes combinational logic configured to receive one or more internal control signals, the one or more internal control signals being based on the configuration data and one or more external control signals received by the tile, the combinational logic being capable of outputting a result signal resulting from at least one of a plurality of logic functions that is responsive to the one or more internal control signals and at least one other signal.

11. A programmable device comprising:
a die comprising a programmable integrated circuit, the programmable integrated circuit comprising a tile, the tile comprising a shift register having a first subset and a second subset, each of the first subset and the second subset including one or more storage elements, the shift register further including a first multiplexer, wherein:
a first input node of the first multiplexer is connected to an output node of the first subset;
a second input node of the first multiplexer is connected to a first node of a transmission network;
an output node of the first multiplexer is connected to an input node of the second subset; and
the first subset is configured to store configuration data, functionality of the first multiplexer and the second subset being based on the configuration data stored in the first subset.

12. The programmable device of claim 11, wherein the transmission network is configured to communicate transactional data.

13. The programmable device of claim 11, wherein the shift register further includes a second multiplexer, wherein:
- a first input node of the second multiplexer is connected to an output node of the second subset;
- a second input node of the second multiplexer is connected to the first node of the transmission network; and
- an output node of the second multiplexer is connected to an input node of the first subset.

14. The programmable device of claim 11, wherein the first multiplexer and the second subset are capable of implementing, based on the configuration data, functionality including memory, the memory being operable to be read, written, and disabled from being read or written responsive to a signal on a second node of the transmission network and an external read/write signal.

15. The programmable device of claim 11, wherein the first multiplexer and the second subset are capable of implementing, based on the configuration data, functionality including multiplexing responsive to a first signal on a second node of the transmission network, the multiplexing selectively outputting a second signal from the first node of the transmission network or a reset value of the second subset.

16. The programmable device of claim 11, wherein the first multiplexer and the second subset are capable of implementing, based on the configuration data, functionality including read-only memory, the read-only memory being operable to be read and disabled responsive to a signal on a second node of the transmission network and an external read/write signal.

17. The programmable device of claim 11, wherein the first multiplexer and the second subset are capable of implementing, based on the configuration data, functionality including a functional flip-flop configured to be enabled responsive to a signal on a second node of the transmission network.

18. A method for operating a programmable device, the method comprising:
- writing configuration data to a first subset of a shift register of a tile on a die; and
- operating a second subset of the shift register based on the configuration data written to the first subset.

19. The method of claim 18, wherein:
- writing the configuration data includes communicating the configuration data via a transmission network; and
- operating the second subset of the shift register includes communicating a signal from the second subset via the transmission network.

20. The method of claim 18, wherein:
- the shift register includes a first multiplexer and a second multiplexer;
- a first input node of the first multiplexer is connected to an output node of the second subset;
- a second input node of the first multiplexer is connected to a node of a transmission network configured to communicate transactional data;
- an output node of the first multiplexer is connected to an input node of the first subset;
- a first input node of the second multiplexer is connected to an output node of the first subset;
- a second input node of the second multiplexer is connected to the node of the transmission network; and
- an output node of the second multiplexer is connected to an input node of the second subset.

* * * * *